United States Patent
Suguro et al.

(10) Patent No.: US 8,456,307 B2
(45) Date of Patent: Jun. 4, 2013

(54) METHOD FOR PRODUCING SHEET WITH IC TAGS, APPARATUS FOR PRODUCING SHEET WITH IC TAGS, SHEET WITH IC TAGS, METHOD FOR FIXING IC CHIPS, APPARATUS FOR FIXING IC CHIPS, AND IC TAG

(75) Inventors: Hiroshi Suguro, Tsukuba (JP); Hideto Sakata, Akishima (JP); Terunao Tsuchiya, Matsudo (JP); Takaichi Shimomura, Tsukuba (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 1781 days.

(21) Appl. No.: 11/587,240

(22) PCT Filed: Apr. 21, 2005

(86) PCT No.: PCT/JP2005/007630
§ 371 (c)(1),
(2), (4) Date: May 4, 2007

(87) PCT Pub. No.: WO2005/106778
PCT Pub. Date: Nov. 10, 2005

(65) Prior Publication Data
US 2007/0284759 A1    Dec. 13, 2007

(30) Foreign Application Priority Data
Apr. 27, 2004 (JP) ................. 2004-131340
Feb. 1, 2005 (JP) ................. 2005-025239

(51) Int. Cl.
*G08B 13/14* (2006.01)
(52) U.S. Cl.
USPC ........................ 340/572.8; 438/118
(58) Field of Classification Search
USPC ........................ 340/572.8; 438/118
See application file for complete search history.

(56) References Cited

U.S. PATENT DOCUMENTS

| 4,356,627 A | 11/1982 | Hoffman |
| 6,147,662 A | 11/2000 | Grabau et al. |

(Continued)

FOREIGN PATENT DOCUMENTS

| JP | A 2002-352206 | 12/2002 |
| WO | WO 03/071476 A1 | 8/2003 |
| WO | WO 03/092174 A2 | 11/2003 |

OTHER PUBLICATIONS

Office Action issued in European Patent Application No. 05 734 680.1 dated Sep. 23, 2011.
Office Action, Application No. EP 05 73 4680, Aug. 24, 2009, 8 pages.

*Primary Examiner* — David Vu
*Assistant Examiner* — Brandon Fox
(74) *Attorney, Agent, or Firm* — Oliff & Berridge, PLC

(57) ABSTRACT

A method of producing a sheet 1 with IC tags comprises the steps of: preparing and feeding a sheet 21a with electrical conductors formed thereon; providing an adhesive 18 on the sheet 21a with electrical conductors; preparing multiple IC chips 20 and successively feeding the IC chips 20; successively arranging each IC chip 20 on the electrical conductors 22 of the sheet 21a; and fixing each IC chip 20 onto the electrical conductors 22 through the adhesive 18. The sheet 21a with electrical conductors formed thereon includes a non-conductive sheet 21 and a pair of electrical conductors 22. The pair of electrical conductors 22 of the sheet 21a with the electrical conductors are provided on the non-conductive sheet 21, extend in the feed direction, and are spaced apart from each other.

2 Claims, 23 Drawing Sheets

U.S. PATENT DOCUMENTS 6,770,509 B2 * 8/2004 Halope et al. ............. 438/108
7,158,037 B2 * 1/2007 Forster et al. ............. 340/572.8
2003/0136503 A1 7/2003 Green et al.

* cited by examiner

METHOD FOR PRODUCING SHEET WITH IC TAGS, APPARATUS FOR PRODUCING SHEET WITH IC TAGS, SHEET WITH IC TAGS, METHOD FOR FIXING IC CHIPS, APPARATUS FOR FIXING IC CHIPS, AND IC TAG

BACKGROUND OF THE INVENTION

1. Field of the Invention

The present invention relates to an IC tag or interposer capable of transferring and receiving data in no contact with an external reader/writer, a sheet with IC tags having an IC tags or interposers, a method for producing a sheet with IC tags, and a producing apparatus (or a production line) of a sheet with IC tags.

The present invention also relates to a method for fixing IC chips and an apparatus for fixing IC chips, which can fix an IC chip to an electrical conductor or conductors as well as electrically connect an electrode or electrodes of the IC chip with the electrical conductor(s).

2. Background Art

Traditionally, an IC tag for transferring and receiving data in no contact with an external reader/writer includes an IC chip and extension electrodes (in this case, also referred to as a dipole antenna) which comprises a pair of electrical conductors and functions as an antenna upon transferring and receiving data in no contact with an external reader/writer. Typically, such an IC tag is supported on a base sheet.

An interposer used for connection of an antenna circuit also includes a pair of extension electrodes and an IC chip connected with these extension electrodes, and is usually supported on a base sheet. In the interposer, the extension electrodes function as a connecting terminal for a separate antenna circuit which serves as an antenna upon transferring and receiving data in no contact with an external reader/writer, and connect the antenna circuit with the IC chip.

In this application, the term "IC tag" is used as a concept implying an interposer.

Such an IC tag implying an interposer is obtained by providing on a base sheet a pair of electrical conductors extending in the longitudinal direction, making a sheet with IC tags by arranging IC chips successively between the pair of electrical conductors, and cutting the sheet with IC tags for each IC chip.

However, if the pair of electric conductors are not arranged accurately on the base sheet, the IC chips can not be arranged with high precision.

Since the size of each IC chip is quite small, handling of the IC tip is difficult. Therefore, it is difficult to provide such IC chips, one at a time, accurately and rapidly. Moreover, it is also difficult to arrange the fed IC chips with high accuracy and rapidly.

While IC tags can be obtained by cutting the sheet with IC tags as described above, since the electric conductors are continuous prior to the cutting, electric characteristics of each IC tag can not be detected, in a state of a sheet, without cutting the sheet with IC tags. Accordingly, inspection of each IC tag can be performed only after cutting the sheet with IC tags for each IC chip so as to form the IC tag. However, the inspection in such a situation can not be performed rapidly. In addition, defective IC tags may be produced continuously.

Furthermore, each arranged IC chip must be fixed onto the electrical conductors, and the fixed IC chip then be connected electrically with the electrical conductors. In this case, it would be preferable in the production efficiency of the sheet with IC tags if a plurality of IC chips could be fixed onto the electrical conductors and connected electrically therewith at a time. Contrary, if variation in the resistance between each IC chip and the electrical conductors becomes large, the performance of the IC tag will also be varied and hence not preferable.

It would be also significantly preferable not only in the production efficiency but also in the quality of the sheet with IC tags if the test on each IC chip itself could be performed efficiently before arranging the IC chip as well as production of defective IC tags due to deficiency of the IC chip itself could be prevented previously.

SUMMARY OF THE INVENTION

The present invention was made in light of the above, and therefore it is an object of the present invention to provide a method for producing a sheet with IC tags, in which a sheet with IC tags can be produced with high accuracy and efficiency, thereby to produce the sheet with IC tags at a low cost, a production line (or producing apparatus) of a sheet with IC tags, and a sheet with IC tags and IC tags to be obtained thereby.

It is another object of the present invention to provide a fixing method and a fixing apparatus for a IC chip, in which the IC chip can be fixed as well as electrically connected with an electrical conductor accurately and efficiently.

A first method of producing a sheet with IC tags according to the present invention comprises the steps of: preparing and feeding a sheet with electrical conductors formed thereon, the sheet with electrical conductors including a non-conductive sheet extending in a band-like fashion and a pair of electrical conductors provided on the non-conductive sheet, the pair of electrical conductors extending in the longitudinal direction of the non-conductive sheet and spaced apart from each other; preparing multiple IC chips and successively feeding the IC chips; providing an adhesive on the sheet with electrical conductors or on the IC chips; successively arranging each IC chip on the electrical conductors of the sheet with electrical conductors; and fixing each IC chip onto the electrical conductors through the adhesive. According to this invention, the sheet with IC tags can be produced with good precision and enhanced efficiency.

The first method of producing a sheet with IC tags according to the present invention may further comprises the steps of: cutting the pair of electrical conductors between each adjacent pair of IC chips, so as to form IC tags each comprising a pair of extension electrodes and an IC chip, successively, along the longitudinal direction, on the non-conductive sheet; and inspecting quality of each IC tag. Upon cutting the electrical conductors, the electrical conductors may be cut in the width direction perpendicular to the longitudinal direction.

In this case, the electrical conductors may be cut by a pair of non-conductive blades spaced apart from each other in the longitudinal direction of the non-conductive sheet, and the quality of each IC tag may be inspected while the pair of non-conductive blades are located across the IC tag and get into the sheet with IC tags.

Also, in this case, in the step of preparing and feeding the sheet with electrical conductors formed thereon, a sheet with electrical conductors may be prepared and fed, wherein the pair of electrical conductors are provided on the non-conductive sheet so as to be respectively spaced away from both ends in the width direction of the non-conductive sheet, and in the step of forming IC tags, successively, on the non-conductive sheet, the electrical conductors may be cut by forming through holes such that each through hole extends over a range narrower than a range defined between both ends in the width direction of the non-conductive sheet and over at least the full width of the pair of electrical conductors, and extends through both the non-conductive sheet and electrical conductors. Or otherwise, in the step of preparing and feeding the sheet with electrical conductors formed thereon, a sheet with electrical conductors may be prepared and fed, wherein the pair of electrical conductors are provided on the non-conductive sheet so as to be respectively spaced away from both ends in the width direction of the non-conductive sheet, and in the step of forming IC tags, successively, on the non-conductive sheet, the electrical conductors may be cut by forming cuts such that they extend over a range narrower than a range defined between both ends in the width direction of the non-conductive sheet and over at least the full width of the pair of electrical conductors, and extend through both the non-conductive sheet and electrical conductors.

In the first method of producing a sheet with IC tags of the present invention, the sheet with electrical conductors may be prepared by laminating an electrical conductor on the non-conductive sheet, and then forming a slit in the electrical conductor, along the longitudinal direction of the non-conductive sheet. In this case, the slit may be formed by dividing the electrical conductor into three pieces by using a pair of blades, and then peeling off the portion of the electrical conductor corresponding to the space between the pair of blades by using a scraper located on the downstream side of the pair of blades. Alternatively, the slit may be formed by cutting the electrical conductor along the longitudinal direction by using a cutting tool for lathing. Or otherwise, the slit may be formed by feeding the non-conductive sheet, on which the electrical conductor is laminated, between a roller having a circumferential blade and a supporting body disposed facing the roller, so as to divide the electrical conductor by the circumferential blade as well as to press the periphery of the divided portion using the roller and the supporting body.

A second method of producing a sheet with IC tags according to the present invention comprises the steps of: preparing and feeding a sheet with electrical conductors formed thereon, the sheet with electrical conductors including a non-conductive sheet extending in a band-like fashion and multiple pairs of electrical conductors provided on the non-conductive sheet, the multiple pairs of electrical conductors being arranged along a longitudinal direction of the non-conductive sheet; preparing multiple IC chips and successively feeding the IC chips; providing an adhesive on the sheet with electrical conductors or on the IC chips; successively arranging each IC chip on the electrical conductors of the sheet with electrical conductors; and fixing each IC chip onto the electrical conductors through the adhesive, so as to form IC tags each having a pair of extension electrodes and an IC chip and supported on the non-conductive sheet. According to this invention, a sheet with IC tags can be produced with good precision and enhanced efficiency. The inspection of each IC tag on the non-conductive sheet can be performed, in a state of a sheet, without cutting the sheet with IC tags.

In the second method of producing a sheet with IC tags according to the present invention, the step of preparing and feeding the sheet with electrical conductors formed thereon may include the steps of: preparing a non-conductive sheet which extends in a band-like fashion and on which a pair of electrical conductors are provided so as to be respectively spaced away from both ends in a width direction perpendicular to the longitudinal direction of the non-conductive sheet, the pair of electrical conductors extending in the longitudinal direction of the non-conductive sheet and spaced apart from each other; and forming through holes successively so as to be spaced apart from each other along the longitudinal direction of the non-conductive sheet, such that the through holes extend, over a range narrower than a range between both ends in the width direction of the non-conductive sheet and over at least the full width of the pair of electrical conductors, and extend through the non-conductive sheet and the electrical conductors; whereby the sheet with electrical conductors formed thereon, the sheet with electrical conductors including the non-conductive sheet extending in a band-like fashion and the multiple pairs of electrical conductors provided on the non-conductive sheet and arranged along the longitudinal direction of the non-conductive sheet, can be prepared. Alternatively, the step of preparing and feeding the sheet with electrical conductors formed thereon may include the steps of: preparing a non-conductive sheet which extends in a band-like fashion and on which a pair of electrical conductors are provided so as to be respectively spaced away from both ends in a width direction perpendicular to the longitudinal direction of the non-conductive sheet, the pair of electrical conductors extending in the longitudinal direction of the non-conductive sheet and spaced apart from each other; and forming cuts successively so as to be spaced apart from each other along the longitudinal direction of the non-conductive sheet, such that the cuts extend, over a range narrower than a range between both ends in the width direction of the non-conductive sheet and over at least the full width of the pair of electrical conductors, and enter up to the non-conductive sheet from a surface of the electrical conductors; whereby the sheet with electrical conductors formed thereon, the sheet with electrical conductors including the non-conductive sheet extending in a band-like fashion and the multiple pairs of electrical conductors provided on the non-conductive sheet and arranged along the longitudinal direction of the non-conductive sheet, can be prepared.

The second method of producing a sheet with IC tags according to the present invention may further comprise the step of inspecting quality of each IC tag supported on the non-conductive sheet.

In the first and second methods of producing a sheet with IC tags according to the present invention, the electrical conductors may be provided on the non-conductive sheet by printing an electrically conductive ink, etching a metal foil, or transfer of a metal foil.

In the first and second methods of producing a sheet with IC tags according to the present invention, in the step of providing an adhesive, an adhesive including a UV curable resin may be provided.

In the first and second methods of producing a sheet with IC tags according to the present invention, in the step of feeding the IC chips, wafer with release-sheet attached thereto, formed by adhering diced wafer including multiple IC chips onto a UV expanded release sheet, may be prepared, and UV light may be radiated onto a portion corresponding to one of the IC chips and this IC chip may be then released from the UV expanded release sheet, so as to feed the IC chips, one at a time.

In the first and second methods of producing a sheet with IC tags according to the present invention, in the step of arranging the IC chips, the IC chips may be fed, one at a time, by applying vibration to the multiple IC chips to arrange them in a line. In this case, in the step of arranging the IC chips, the front and back sides or orientation of each IC chip may be judged, such that IC chips judged to be normal in the front and back sides or orientation can be arranged on the electrical conductors, while other IC chips judged not to be normal in any of the front and back sides or orientation can be returned to the step of feeding IC chips.

In the first and second methods of producing a sheet with IC tags according to the present invention, in the step of arranging the IC chips, the fed IC chips may be adsorbed, one at a time, by a plurality of adsorbing pickup nozzles supported by a rotatable index table on the same circumference of a circle around a center of rotation of the index table, and each IC chip may be transferred by rotating the index table and arranged on the electrical conductors. In this case, the position of each IC chip relative to the electrical conductors can be determined, by adjusting the position of each IC chip adsorbed by each corresponding adsorbing pickup nozzle relative to the adsorbing pickup nozzle, or by adjusting the position of each pickup nozzle relative to the index table, or by adjusting the position of the index table relative to the sheet with electrical conductors, or by adjusting the position of the sheet with electrical conductors relative to the index table, so as to arrange the IC chips on the electrical conductors. Also, in this case, the IC chips may be fed at a plurality of points on a transfer route of the adsorbing pickup nozzles such that each pickup nozzle can receive an IC chip at any one of the plurality of points.

In the first and second methods of producing a sheet with IC tags according to the present invention, in the step of arranging the IC chips, each IC chip may be judged as to the deficiencies in breakage or crack, such that only IC chips judged to be normal can be arranged on the electrical conductors.

In the first and second methods of producing a sheet with IC tags according to the present invention, in the step of arranging the IC chips, quality of each IC chip may be checked by a quality checking unit, and only IC chips judged to be normal can be are arranged on the electrical conductors of the sheet with electrical conductors. In this case, the quality checking unit may include testing extension electrodes in order to form a testing IC tag together with an IC chip, and a communication characteristic measuring instrument may be capable of measuring a communication characteristic of each IC chip by a non-contact inspection with the testing IC tag such that during the process of arranging the fed IC chip on the electrical conductors, the testing IC tag can be formed by connecting the IC chip with the testing extension electrodes and the communication characteristic of the IC chip can be checked by a non-contact inspection using the communication characteristic measuring instrument, whereby quality of the IC chip can be checked. Alternatively, the quality checking unit may be a communication characteristic measuring instrument having a connecting portion for electrically connecting with an IC chip and may be capable of measuring a communication characteristic of the IC chip while being connected with the IC chip through the connecting portion such that during the process of arranging the fed IC chip on the electrical conductors, the communication characteristic of the IC chip can be checked by electrically contacting the IC chip with the connecting portion using the communication characteristic measuring instrument whereby quality of the IC chip can be checked. Or otherwise, the quality checking unit may include testing extension electrodes electrically connected with an antenna circuit in order to form a testing IC tag together with an IC chip, and a communication characteristic measuring instrument may be capable of measuring a communication characteristic of each IC chip by a non-contact inspection with the testing IC tag such that during the process of arranging the fed IC chip on the electrical conductors, the testing IC tag can be formed by connecting the IC chip with the testing extension electrodes and the communication characteristic of the IC chip can be checked by a non-contact inspection using the communication characteristic measuring instrument, whereby quality of the IC chip can be checked. Or otherwise, the quality checking unit may be an electric characteristic measuring instrument having a connecting portion for electrically connecting with an IC chip and may be capable of measuring an electric characteristic of the IC chip while being connected with the IC chip through the connecting portion such that during the process of arranging the fed IC chip on the electrical conductors, the electric characteristic of the IC chip can be checked by electrically contacting the IC chip with the connecting portion using the electric characteristic measuring instrument whereby quality of the IC chip can be checked.

In the first and second methods of producing a sheet with IC tags according to the present invention, in the step of arranging the IC chips, movement of a portion, on which IC chips are arranged, of the sheet with electrical conductors may be stopped, and during the stopping period, the sheet with electrical conductors or the non-conductive sheet on which the electrical conductors are provided, to be fed to the step of arranging IC chips, may be once accumulated in an accumulator provided on the upstream step side of the arranging step.

In the first and second methods of producing a sheet with IC tags according to the present invention, a some of IC chips may be fixed, at a time, onto the electrical conductors.

In this case, the adhesive provided between the some of IC chips and the electrical conductors may be cured while the some of IC chips are pressed against the electrical conductors, and the pressing force may be adjusted based on a measurement result obtained from a measuring instrument for measuring the number of IC chips, arranged on the sheet with electrical conductors, to be fed to the step of fixing IC chips.

Also, in this case, the step of fixing the IC chips may include the steps of: applying ultrasonic vibration to the some of IC chips while pressing the some of IC chips against the electrical conductors; and curing the adhesive provided between the some of IC chips and the electrical conductors. Alternatively, the step of fixing the IC chips may include the steps of: applying ultrasonic vibration to the some of IC chips while pressing the some of IC chips against the electrical conductors with pressing force being gradually increased up to a predetermined pressing force; and curing the adhesive provided between the some of IC chips and the electrical conductors. Or otherwise, in the step of curing the adhesive, the adhesive provided between the some of IC chips and the electrical conductors may be cured while the some of IC chips are pressed against the electrical conductors. Or otherwise, the pressing force may be adjusted based on a measuring result obtained from a measuring instrument for measuring the number of IC chips on the sheet with electrical conductors to be fed to the step of fixing IC chips. Furthermore, in the step of providing an adhesive, an adhesive including a thermosetting resin may be provided, and in the step of curing an adhesive in the step of fixing IC chips, the adhesive may be heated.

In the first and second methods of producing a sheet with IC tags according to the present invention, an adhesive including a UV curable resin may be provided in the step of providing an adhesive, and the step of fixing the IC chips may include the steps of: applying ultrasonic vibration to the IC chips while pressing the IC chips against the electrical conductors; and irradiating the adhesive provided between the IC chips and the electrical conductors with UV light. Alternatively, an adhesive including a UV curable resin may be provided in the step of providing an adhesive, and step of fixing the IC chips may include: applying ultrasonic vibration to the IC chips while pressing each IC chip against the electrical conductors with pressing force being gradually increased up to a predetermined pressing force; and irradiating the adhesive provided between the IC chips and the electrical conductors with UV light. In these cases, in the step of irradiating the adhesive with UV light, the adhesive provided between each IC chip and the electrical conductors may be irradiated with UV light while the IC chip is pressed against the electrical conductors.

In the first and second methods of producing a sheet with IC tags according to the present invention, in the step of fixing the IC chips, movement of a portion, on which IC chips are arranged, of the sheet with electrical conductors may be stopped, and during the stopping period, the sheet with electrical conductors, to be fed to the step of fixing the IC chips, may be once accumulated in an accumulator provided on the upstream step side of the fixing step.

In the first and second methods of producing a sheet with IC tags according to the present invention, a step of protecting each IC chip fixed onto the electrical conductors through the adhesive may be further provided.

In the first and second methods of producing a sheet with IC tags according to the present invention, a step of degreasing the electrical conductors may be further provided prior to the step of arranging the IC chips.

In the first and second methods of producing a sheet with IC tags according to the present invention, a step of removing oxide films from the electrical conductors may be further provided prior to the step of arranging the IC chips.

A first apparatus for producing a sheet with IC tags according to the present invention comprises: means for preparing and feeding a sheet with electrical conductors formed thereon, the sheet with electrical conductors including a non-conductive sheet extending in a band-like fashion and a pair of electrical conductors provided on the non-conductive sheet, the pair of electrical conductors extending in a longitudinal direction of the non-conductive sheet and spaced apart from each other; means for preparing multiple IC chips and for successively feeding the IC chips; means for providing an adhesive on the sheet with electrical conductors or on the IC chips; means for successively arranging each IC chip on the electrical conductors of the sheet with electrical conductors; and means for fixing each IC chip onto the electrical conductors through the adhesive. According to this invention, a sheet with IC tags can be produced with high precision and good efficiency.

In the first apparatus for producing a sheet with IC tags according to the present invention, means for cutting the pair of electrical conductors between each adjacent pair of IC chips so as to form IC tags successively along the longitudinal direction of the non-conductive sheet, each IC tag including a pair of extension electrodes and an IC chip; and means for inspecting quality of each IC tag may be further provided. In this case, the means for forming IC tags successively may be configured to cut the electrical conductors along the width direction which is perpendicular to the longitudinal direction.

A second apparatus for producing a sheet with IC tags according to the present invention comprises: means for preparing and feeding a sheet with electrical conductors formed thereon, sheet with electrical conductors including a non-conductive sheet extending in a band-like fashion and multiple pairs of electrical conductors provided on the non-conductive sheet, the multiple pairs of electrical conductors being arranged along a longitudinal direction of the non-conductive sheet; means for preparing multiple IC chips and successively feeding the IC chips; means for providing an adhesive on the sheet with electrical conductors or on the IC chips; means for successively arranging each IC chip on the electrical conductors of the sheet with electrical conductors; and means for fixing each IC chip onto the electrical conductors through the adhesive, so as to form IC tags each having a pair of extension electrodes and an IC chip and supported by the non-conductive sheet. According to this invention, a sheet with IC tags can be produced with high precision and good efficiency. The inspection on each IC tag on the non-conductive sheet can be performed, in a state of a sheet, without cutting the sheet with IC tags.

In the first and second apparatuses for producing a sheet with IC tags according to the present invention may further comprise means for inspecting quality of each IC tag.

In the first and second apparatuses for producing a sheet with IC tags according to the present invention, a plurality of means for feeding IC chips may be provided to one means for arranging IC chips.

A first sheet with IC tags according to the present invention comprises: a non-conductive sheet extending in a band-like fashion; multiple pairs of electrical conductors provided on the non-conductive sheet and arranged along a longitudinal direction of the non-conductive sheet; and IC chips respectively arranged on each pair of electrical conductors, wherein each pair of electrical conductors arranged along the longitudinal direction of the non-conductive sheet are formed by cutting the pair of electrical conductors extending in the longitudinal direction of the non-conductive sheet and spaced apart from each other. According to this invention, the inspection on each IC tag on the non-conductive sheet can be performed, in a state of a sheet, without cutting the sheet with IC tags. Such a sheet with IC tags can be produced at a low cost. The electrical conductors may be cut along a width direction which is perpendicular to the longitudinal direction.

A second sheet with IC tags according to the present invention comprises: a non-conductive sheet extending in a band-like fashion: multiple pairs of electrical conductors provided on the non-conductive sheet and arranged along the longitudinal direction of the non-conductive sheet; and IC chips respectively arranged on each pair of electrical conductors, wherein, between each adjacent pair of IC chips, a cut is formed such that the cut extends over the full width of each pair of electrical conductors and enter up to the non-conductive sheet from a surface of the electrical conductors. According to this invention, the inspection on each IC tag on the non-conductive sheet can be performed, in a state of a sheet, without cutting the sheet with IC tags. In this case, the electrical conductors may be provided such that they are respectively spaced away from both ends in the width direction perpendicular to the longitudinal direction of the non-conductive sheet.

A third sheet with IC tags according to the present invention comprises: a non-conductive sheet extending in an elongated fashion; multiple pairs of electrical conductors provided on the non-conductive sheet so as to be respectively spaced away from both ends in the width direction perpendicular to a longitudinal direction of the non-conductive sheet, and arranged along the longitudinal direction of the non-conductive sheet; and IC chips respectively arranged on each pair of electrical conductors, wherein, between each adjacent pair of IC chips, a through hole is formed in the non-conductive sheet such that the through hole extends over a range narrower than a rage defined between both ends in the width direction of the non-conductive sheet and over at least the full width of each pair of electrical conductors. According to this invention, the inspection on each IC tag on the non-conductive sheet can be performed, in a state of a sheet, without cutting the sheet with IC tags. Such a sheet with IC tags can be produced at a low cost.

A first method of fixing IC chips according to the present invention is a method of fixing a some of IC chips respectively having an electrode, at a time, onto an electrical conductor and comprises the steps of: preparing and feeding the electrical conductor on which IC chips are arranged through an adhesive, with the electrode of each IC chip facing the electrical conductor; measuring the number of IC chips on the electrical conductor to be fed by using a measuring instrument; and curing the adhesive provided between the some of IC chips and the electrical conductor while pressing the some of IC chips against the electrical conductor; wherein the pressing force used upon pressing the some of IC chips is adjusted based on a measurement result obtained from the measuring instrument; whereby the some of IC chips can be fixed, at a time, onto the electrical conductor, while the electrode of the some of IC chips can be electrically connected with the electrical conductor. According to this invention, readily and efficiently, the some of IC chips can be fixed onto the electrical conductor as well as the electrodes of the some of IC chips can be electrically connected with the electrical conductor. Due to the pressing of IC chips with adequate pressing force, the rate of good items can be enhanced.

A second method of fixing IC chips according to the present invention is a method of fixing a some of IC chips respectively having an electrode, at a time, onto an electrical conductor and comprises the steps of: preparing and feeding the electrical conductor on which IC chips are arranged through an adhesive, with the electrode of each IC chip facing the electrical conductor; applying ultrasonic vibration to the some of IC chips while pressing the some of IC chips against the electrical conductor; and curing the adhesive provided between the some of IC chips and the electrical conductor; whereby the some of IC chips can be fixed, at a time, onto the electrical conductor, while the electrode of the some of IC chips can be electrically connected with the electrical conductor. According to this invention, readily and efficiently, the some of IC chips can be fixed onto the electrical conductor, while the electrode of the some of IC chips can be electrically connected with the electrical conductor. Since oxide films on the electrical conductor can be removed by providing ultrasonic vibration to the IC chips, the electrical resistance between each IC chip and the electrical conductor, as well as, variation of the electrical resistance can be reduced. In addition, by adjusting the conditions concerning the ultrasonic vibration provided to the IC chips, the IC chips and the electrical conductor may be ultrasonically joined together. In this case, the electrical resistance between each IC chip and the electrical conductor, as well as, variation of the electrical resistance can be further reduced.

A third method of fixing IC chips according to the present invention is a method of fixing a some of IC chips respectively having an electrode, at a time, onto an electrical conductor and comprises the steps of: preparing and feeding the electrical conductor on which IC chips are arranged through an adhesive, with the electrode of each IC chip facing the electrical conductor; applying ultrasonic vibration to the some of IC chips while pressing the some of IC chips against the electrical conductor, with pressing force being gradually increased up to a predetermined pressing force; and curing the adhesive provided between the some of IC chips and the electrical conductor; whereby the some of IC chips can be fixed, at a time, onto the electrical conductor, while the electrode of the some of IC chips can be electrically connected with the electrical conductor. According to this invention, readily and efficiently, the some of IC chips can be fixed onto the electrical conductor, while the electrode of the some of IC chips can be electrically connected with the electrical conductor. Since oxide films on the electrical conductor can be removed by providing ultrasonic vibration to the IC chips, the electrical resistance between each IC chip and the electrical conductor, as well as, variation of the electrical resistance can be reduced. In addition, by adjusting the conditions concerning the ultrasonic vibration provided to the IC chips, the IC chips and the electrical conductor may be ultrasonically joined together. In this case, the electrical resistance between each IC chip and the electrical conductor, as well as, variation of the electrical resistance can be further reduced.

In the second and third methods of fixing IC chips according to the present invention, in the step of curing the adhesive, the adhesive provided between the some of IC chips and the electrical conductor may be cured while the some of IC chips are pressed against the electrical conductors.

In the second and third methods of fixing IC chips according to the present invention, a step of measuring the number of IC chips on the electrical conductor to be fed, by using a measuring instrument, may be further provided, such that the pressing force employed upon pressing the some of IC chips can be adjusted based on a measurement result obtained from the measuring instrument.

In the first, second and third methods of fixing IC chips according to the present invention, the adhesive provided between each IC chip and the electrical conductor may include a thermosetting resin, such that the adhesive can be heated so as to be cured in the step of curing the adhesive.

A fourth method of fixing an IC chip according to the present invention is a method of fixing an IC chip having an electrode onto an electrical conductor and comprises the steps of: preparing and feeding the electrical conductor on which the IC chip is arranged through an adhesive including a UV curable resin, with the electrode of the IC chip facing the electrical conductor; applying ultrasonic vibration to the IC chip while pressing the IC chip against the electrical conductor; and irradiating the adhesive provided between the IC chip and the electrical conductor with UV light; whereby the IC chip can be fixed onto the electrical conductor, while the electrode of the IC chip can be electrically connected with the electrical conductor. According to this invention, readily and efficiently, the IC chip can be fixed onto the electrical conductor, while the electrode of the IC chip can be electrically connected with the electrical conductor. Since oxide films on the electrical conductor can be removed by providing ultrasonic vibration to the IC chip, the electrical resistance between the IC chip and the electrical conductor, as well as, variation of the electrical resistance can be reduced. In addition, by adjusting the conditions concerning the ultrasonic vibration provided to the IC chip, the IC chip and the electrical conductor may be ultrasonically joined together. In this case, the electrical-resistance between the IC chip and the electrical conductor, as well as, variation of the electrical resistance can be further reduced. Furthermore, by using the UV curable resin, the time required for curing the adhesive can be shortened, thereby enhancing productivity of the sheet with IC tags.

A fifth method of fixing IC chips according to the present invention is a method of fixing an IC chip having an electrode onto an electrical conductor and comprises the steps of: preparing and feeding the electrical conductor on which the IC chip is arranged through an adhesive including a UV curable resin, with the electrode of the IC chip facing the electrical conductor; applying ultrasonic vibration to the IC chip while pressing the IC chip against the electrical conductor, with pressing force being gradually increased up to a predetermined pressing force; and irradiating the adhesive provided between the IC chip and the electrical conductor with UV light; whereby the IC chip can be fixed onto the electrical conductor, while the electrode of the IC chip can be electrically connected with the electrical conductor. According to this invention, readily and efficiently, the IC chip can be fixed onto the electrical conductor, while the electrode of the IC chip can be electrically connected with the electrical conductor. Since oxide films on the electrical conductor can be removed by providing ultrasonic vibration to the IC chip, the electrical resistance between the IC chip and the electrical conductor, as well as, variation of the electrical resistance can be reduced. In addition, by adjusting the conditions concerning the ultrasonic vibration provided to the IC chip, the IC chip and the electrical conductor may be ultrasonically joined together. In this case, the electrical resistance between the IC chip and the electrical conductor, as well as, variation of the electrical resistance can be further reduced. Furthermore, by using the UV curable resin, the time required for curing the adhesive can be shortened, thereby enhancing productivity of the sheet with IC tags.

In the fourth and fifth methods of fixing IC chips according to the present invention, in the step of irradiating with UV light, the adhesive provided between the IC chip and the electrical conductor may be irradiated with UV light while the IC chip is pressed against the electrical conductor.

A first apparatus for fixing a some of IC chips, the some of IC chips respectively having an electrode and arranged on an electrical conductor through an adhesive with the electrode of each IC chip facing the electrical conductor, at a time, onto the electrical conductor, according to the present invention, comprises: a supporting unit to support the electrical conductor; a pressing unit arranged to face the supporting unit, the pressing unit being movable toward the supporting unit and adapted to press the some IC chips against the electrical conductor; a measuring instrument for measuring the number of IC chips on the electrical conductor to be fed to the supporting unit; and a control unit adapted to receive a signal concerning a measurement, result from the measuring instrument and adjust a pressing force of the pressing unit based on the signal; whereby the some of IC chips can be fixed, at a time, onto the electrical conductor, while the electrode of the some of IC chip can be electrically connected with the electrical conductor. According to this invention, readily and efficiently, the some of IC chips can be fixed onto the electrical conductor, while the electrode of the some of IC chips can be electrically connected with the electrical conductor. Due to the pressing of the some of IC chips with an appropriate pressing force, the rate of good items can be enhanced.

A second apparatus for fixing a some of IC chips, the some of IC chips respectively having an electrode and arranged on an electrical conductor through an adhesive with the electrode of each IC chip facing the electrical conductor, at a time, onto the electrical conductor, according to the present invention, comprises: a supporting unit to support the electrical conductor; a pressing unit arranged to face the supporting unit, the pressing unit being movable toward the supporting unit and adapted to press the some of IC chips against the electrical conductor; and an ultrasonic horn connected to the pressing unit and adapted to apply ultrasonic vibration to the pressing unit; whereby the some of IC chips can be fixed, at a time, onto the electrical conductor, while the electrode of the some of IC chip can be electrically connected with the electrical conductor. According to this invention, readily and efficiently, the some of IC chips can be fixed onto the electrical conductor, while the electrode of the some of IC chips can be electrically connected with the electrical conductor. Since oxide films on the electrical conductor can be removed by providing ultrasonic vibration to the IC chips, the electrical resistance between each IC chip and the electrical conductors, as well as, variation of the electrical resistance can be reduced. In addition, by adjusting the conditions concerning the ultrasonic vibration provided to the some of IC chips, the some of IC chips and the electrical conductors may be ultrasonically joined together. In this case, the electrical resistance between each IC chip and the electrical conductors, as well as, variation of the electrical resistance can be further reduced.

In the second apparatus for fixing IC chips according to the present invention, a measuring instrument for measuring the number of IC chips on the electrical conductor to be fed to the supporting unit, and a control unit adapted to receive a signal concerning a measurement result from the measuring instrument and adjust the pressing force of the pressing unit based on the signal may be further provided.

In the second and third apparatuses for fixing IC chips according to the present invention, a heating mechanism for heating the pressing unit or supporting unit, or both of the pressing unit and supporting unit may be further provided.

A third apparatus for fixing an IC chip, the IC chip having an electrode and arranged on an electrical conductor through an adhesive including a UV curable resin with the electrode of the IC chip facing the electrical conductor, onto the electrical conductor, according to the present invention, comprises: a supporting unit to support to the electrical conductor; a pressing unit arranged to face the supporting unit, the pressing unit being movable toward the supporting unit and adapted to press the IC chip against the electrical conductor; an ultrasonic horn connected to the pressing unit and adapted to apply ultrasonic vibration to the pressing unit; and a UV irradiating system adapted to irradiate the adhesive with UV light; whereby the IC chip can be fixed onto the electrical conductor, while the electrode of the IC chip can be electrically connected with the electrical conductor. According to this invention, readily and efficiently, the IC chip can be fixed onto the electrical conductor, while the electrode of the IC chip can be electrically connected with the electrical conductor. Since oxide films on the electrical conductor can be removed by providing ultrasonic vibration to the IC chip, the electrical resistance between the IC chip and the electrical conductor, as well as, variation of the electrical resistance can be reduced. In addition, by adjusting the conditions concerning the ultrasonic vibration provided to the IC chip, the IC chip and the electrical conductor may be ultrasonically joined together. In this case, the electrical resistance between the IC chip and the electrical conductor, as well as, variation of the electrical resistance can be further reduced. Furthermore, by using the UV curable resin, the time required for curing the adhesive can be shortened, thereby enhancing productivity of the sheet with IC tags.

A first IC tag according to the present invention comprises: a non-conductive sheet; a pair of extension electrodes provided on the non-conductive sheet, the pair of extension electrodes being spaced apart from each other across a slit; and an IC chip electrically connected with the extension electrodes; wherein the slit includes a pair of notches entering up to the non-conductive sheet, and a rectangular portion provided between the notches and having a generally rectangular cross section.

A second IC tag according to the present invention comprises: a non-conductive sheet; a pair of extension electrodes provided on the non-conductive sheet, the pair of extension electrodes being spaced apart from each other across a slit; and an IC chip electrically connected with the extension electrodes; wherein the slit has a generally V-shaped cross section.

According to the present invention, an inspecting method of efficiently inspecting a sheet with IC tags.

A first method of inspecting a sheet with IC tags according to the present invention comprises the steps of: preparing a sheet with IC tags including a non-conductive sheet extending in a band-like fashion, a pair of electrical conductors provided on the non-conductive sheet and extending in a band-like fashion, and multiple IC chips on the pair of electrical conductors; cutting the electrical conductors of the sheet with IC tags, so as to form IC tags each including a pair of extension electrodes and an IC chip, in succession, on the non-conductive sheet, along the longitudinal direction; and inspecting quality of each IC tag. According to the method of inspecting the sheet with IC tags, the inspection on the quality of each IC tag including an IC chip and extension electrodes can be performed in a state of a sheet. Therefore, the inspecting step can be performed readily and rapidly.

In the first method of inspecting a sheet with IC tags according to the present invention, the electrical conductors may be cut on both sides across the IC chip by using a pair of non-conductive blades spaced apart from each other in the longitudinal direction of the non-conductive sheet. In this case, the quality of IC tag may be inspected while the pair of non-conductive blades get into the sheet with IC tags.

A second method of inspecting a sheet with IC tags according to the present invention comprises the steps of: preparing a sheet with IC tags including a non-conductive sheet extending in a band-like fashion, a pair of electrical conductors provided on the non-conductive sheet so as to be respectively spaced away from both ends in a width direction perpendicular to a longitudinal direction of the non-conductive sheet, the pair of electrical conductors extending in the longitudinal direction of the non-conductive sheet and spaced apart from each other, and multiple IC chips arranged on the pair of electrical conductors; forming a through hole between each adjacent pair of IC chips, such that the through hole extends over a range narrower than a range defined between both ends in the width direction of the non-conductive sheet and over at least the full width of the pair of electrical conductors, and extends through both the non-conductive sheet and the electrical conductors, so as to form IC tags each including a pair of extension electrodes and an IC chip, in succession, on the non-conductive sheet, along the longitudinal direction; and inspecting quality of each IC tag. According to the method of inspecting a sheet with IC tags, the inspection on the quality of each IC tag including an IC chip and extension electrodes can be performed in a state of a sheet. Therefore, the inspecting step can be performed rapidly with ease.

A third method of inspecting a sheet with IC tags according to the present invention comprises the steps of: preparing a sheet with IC tags including a non-conductive sheet extending in a band-like fashion, a pair of electrical conductors provided on the non-conductive sheet so as to be respectively spaced away from both ends in a width direction perpendicular to a longitudinal direction of the non-conductive sheet, the pair of electrical conductors extending in the longitudinal direction of the non-conductive sheet and spaced apart from each other, and multiple IC chips arranged on the pair of electrical conductors; forming a cut between each adjacent pair of IC chips, such that the cut extends over a range narrower than a range defined between both ends in the width direction of the non-conductive sheet and over at least the full width of the pair of electrical conductors, and enters up to the non-conductive sheet from a surface of the electrical conductors, so as to form IC tags each including a pair of extension electrodes and an IC chip, in succession, on the non-conductive sheet, along the longitudinal direction; and inspecting quality of each IC tag. According to the method of inspecting a sheet with IC tags, the inspection on the quality of each IC tag comprising an IC chip and extension electrodes can be performed in a state of a sheet. Therefore, the inspecting step can be performed rapidly with ease.

In the first, second and third methods of inspecting a sheet with IC tags, a step of marking each IC tag judged not to be normal may be further provided.

BEST MODE FOR CARRYING OUT THE INVENTION

Hereinafter, several embodiments of the present invention will be described with reference to the drawings.

FIGS. 1 through 7 illustrate one embodiment of a sheet with IC tags, a producing method for the sheet with IC tags, and a production line (also referred to as a producing apparatus) for the sheet with IC tags, respectively, according to the present invention.

<Sheet 1 with IC Tags>

Figure 1:
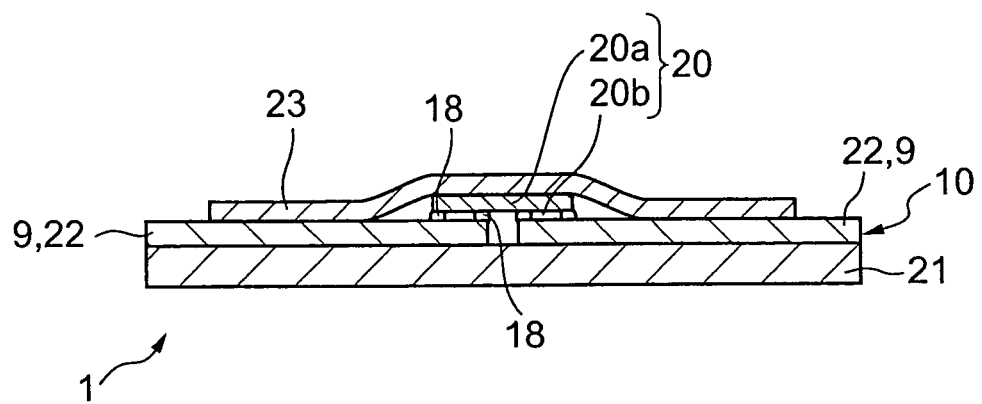
FIG. 1 is a sectional view taken along the width direction, showing a sheet with IC tags produced in accordance with one embodiment of a method for producing sheet with IC tags according to the present invention.
Figure 2:
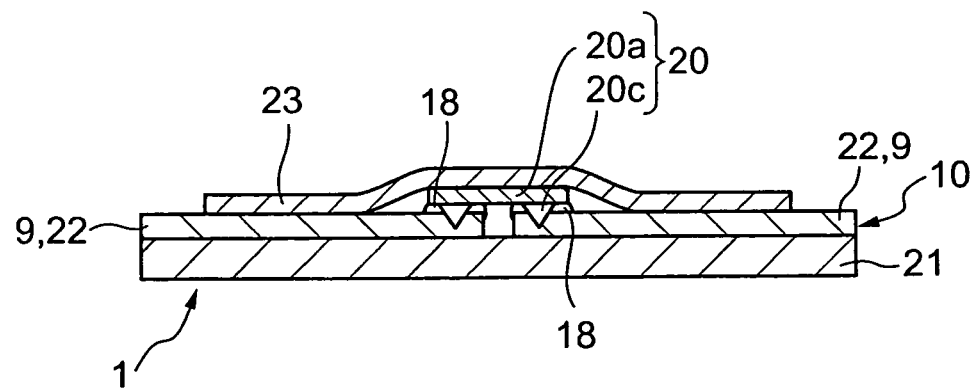
FIG. 2 is a sectional view showing a variation of the sheet with IC tags.

First, a sheet 1 with IC tags and an IC tag 10 will be described with reference to FIGS. 1 and 2. FIG. 1 is a sectional view taken along the width direction of a sheet with IC tags, and FIG. 2 is a sectional view showing a variation of the sheet with IC tags.

Herein, it should be noted that the term "IC tag 10" implies not only a non-contact IC tag adapted to transfer and receive data in no contact with an external reader/writer, but also an interposer to be used in connection with a separate antenna circuit comprising a loop antenna or dipole antenna.

As shown in FIG. 1, a sheet 1 with IC tags in this embodiment comprises a non-conductive sheet (also referred to as a base sheet) 21, electrical conductors 22 provided on the non-conductive sheet 21, IC chips 20 arranged on the electrical conductors 22, and protective films 23 disposed on each IC chip 20. Individual IC tags are obtained by forming extension electrodes 9 from the electrical conductors 22 by cutting such a sheet with IC tags along the width direction for each IC chip 20.

While the protective film 23 serves to prevent each IC chip 20 from breakage, getting off from the electrical conductors 22 (extension electrodes 9) or the like, it is not essential. In this embodiment, the protective film 23 covers each the IC chips 20 and a part of electrical conductors 22 (FIG. 1), but this is not limited to such a manner. Namely, the protective film 23 may cover only each IC chip 20, or otherwise, it may cover the entire bodies including each IC chip 20 and electrical conductors 22. Furthermore, the protection of each IC chip 20 may be provided by sealing the IC chip 20 with a resin, rather than the lamination with the protective film 23 on the IC chip.

Each IC tag 10 to be obtained by cutting the sheet 1 with IC tags comprises a pair of extension electrodes 9 formed from a pair of electrical conductors 22, and an IC chip 20 disposed across the pair of extension electrodes 9, 9 and connected with these extension electrodes 9. Such an IC tag 10 is supported on the non-conductive sheet 21 and covered with the protective film 23 on its face on the side of IC chip 20.

Each IC chip 20 includes an IC chip body 20a and flat electrodes 20b provided on a bottom face of the IC chip body 20a. The flat electrodes 20b are applied with an adhesive 18 and also subjected to thermo-compression bonding, crimping or ultrasonic joining (metal-metal bonding) so as to fix and electrically connect the flat electrodes 20b to the electrical conductor 22. In this embodiment, while an anisotropic conductive adhesive is used as the adhesive 18 as will be described below, a non-conductive adhesive or commonly known conductive adhesive may also be used.

Alternatively, as shown in FIG. 2, each IC chip 20 may include the IC chip body 20a and pointed electrodes 20c provided to the IC chip body 20a. As shown in FIG. 2, since the electrodes 20c are pointed, when the IC chip 20 is subjected to thermo-compression bonding or crimping, the electrodes 20c stick in the electrical conductors through the anisotropic conductive adhesive, conductive adhesive or non-conductive adhesive. Thus, the electrodes 20c can be securely fixed to the electrical conductors 22.

<Outline of a Producing Method for the Sheet with IC Tags>

Next, an outline of a producing method for the sheet 1 with IC tags will be explained with reference to FIG. 3.

Figure 3:
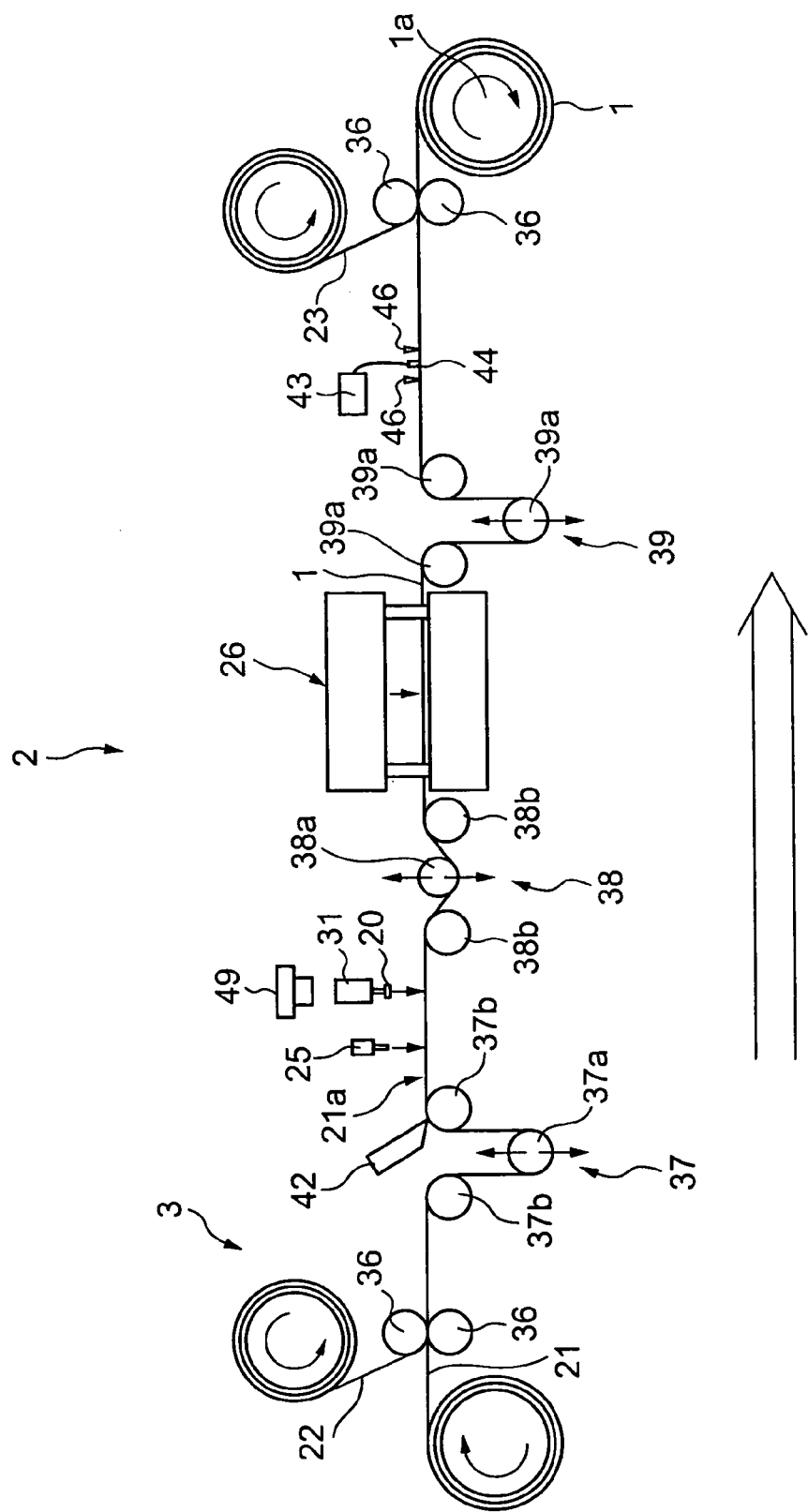
FIG. 3 is a schematic view showing one embodiment of a method for producing sheet with IC tags according to the present invention and one embodiment of a production line for sheet with IC tags according to the present invention.

FIG. 3 is a schematic view illustrating one embodiment of a producing method and a production line for the sheet 1 with IC tags according to the present invention. In FIG. 3, each step of the producing method proceeds from left to right. That is to say, the left side is an upstream step while the right side expresses a downstream step.

As shown in FIG. 3, the producing method for the sheet 1 with IC tags comprises the steps of: preparing a sheet 21a with electrical conductors formed thereon, the sheet 21a with electrical conductors includes a non-conductive sheet 21 extending in a band-like fashion and a pair of electrical conductors 22 provided on the non-conductive sheet 21, the pair of electrical conductors 22 extending in the longitudinal direction of the non-conductive sheet 21 and spaced apart from each other, and feeding and carrying the sheet 21a with electrical conductors in the same direction as the longitudinal direction of the non-conductive sheet 21; providing an electrically conductive adhesive 18 on the electrical conductors 22 of the sheet 21a with electrical conductors by using a dispenser 25; preparing multiple IC chips 20 and feeding the IC chips 20 successively; mounting (arranging) each IC chip 20 on each portion, on which electrically conductive adhesive 18 is provided, of the electrical conductors 22; fixing each IC chip 20 onto the electrical conductors 22 through the electrically conductive adhesive 18; producing IC tags each comprising a pair of extension electrodes 9 and the fed IC chip 20, successively, along the feed direction, on the non-conductive sheet 21 extending in a band-like fashion, by cutting the pair of electrical conductors 22, between each adjacent pair of IC chips, in the width direction which is perpendicular to the feed direction; and inspecting each IC tag 10.

In this embodiment, as shown in FIG. 3, the method further comprises the steps of: protecting each IC chip 20 by laminating the protective film 23 on the sheet 1 with IC tags; and winding the sheet with IC tags on which the protective film 23 is laminated around a winding core 1a.

As stated above, and also apparently seen from FIG. 3 or the like, in this embodiment, the sheet 21a on which the electrical conductors are already formed is fed in the same direction as the longitudinal direction of the non-conductive sheet 21, while each step is performed. Accordingly, in this embodiment, the terms "feed direction" and "longitudinal direction" mean the same direction.

Hereinafter, each of the above steps will be described in more detail.

<Production and Feed of the Sheet 21a with Electrical Conductors Formed Thereon>

First, a step of producing and feeding the sheet 21a on which the electrical conductors are already formed is explained with reference to FIG. 4.

Figure 4:
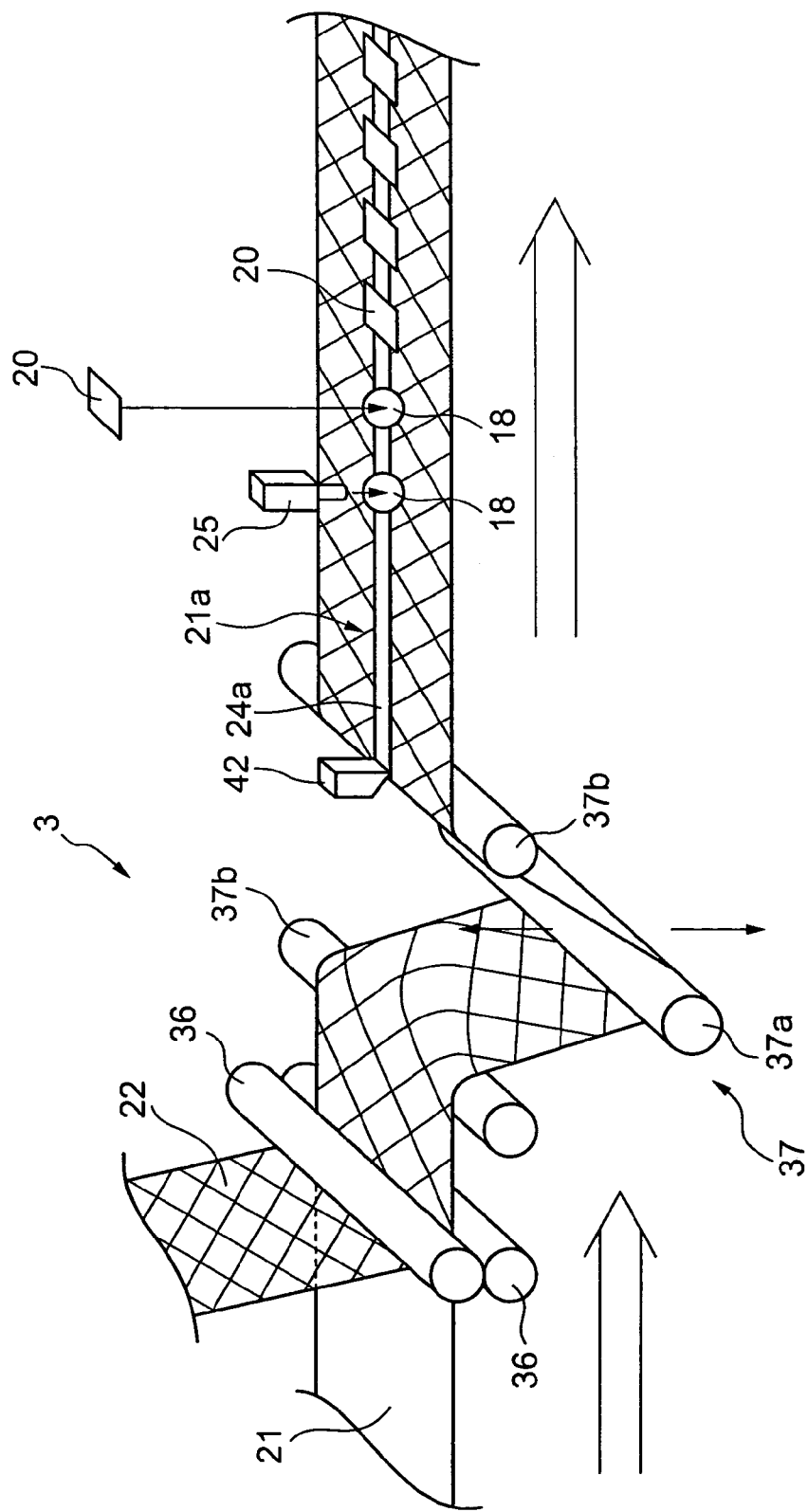
FIG. 4 is a perspective view illustrating a method of producing sheet with IC tags.

FIG. 4 is a perspective view showing a producing method for the sheet 1 with IC tags. Also in FIG. 4, similar to FIG. 3, the left side expresses an upper step, while the right side depicts a lower step.

As shown in FIG. 4, means 3 for producing and feeding the sheet 21a on which the electrical conductors are already formed includes means for feeding the non-conductive sheet 21, means for feeding the electrically conductor 22, nip rollers 36, and a cutter 42.

As illustrated in FIG. 4, the non-conductive sheet 21 extending in a band-like fashion is fed continuously and carried toward the nip rollers 36 while the electrical conductor 22 extending in a band-like fashion is continuously fed and carried toward the nip rollers 36. During this process, a pressure-adhesion type adhesive (not shown) is applied between the non-conductive sheet 21 and the electrical conductor 22. Thereafter, the non-conductive sheet 21 and the electrical conductor 22 are crimped together by the nip rollers 36. Thus, the non-conductive sheet 21 and the electrical conductor 22 are securely adhered to each other such that the electrical conductor 22 can be laminated on the non-conductive sheet 21. In this embodiment, the width of the electrical conductor 22 and that of the non-conductive sheet 21 are the same.

The non-conductive sheet 21 is formed from, for example, PET or paper, while the electrical conductor 22 is formed from, for example, aluminum or copper alloys.

Next, the non-conductive sheet 21 on which the electrical conductor 22 is laminated is fed to a first accumulator 37. The first accumulator 37 includes a pair of supporting rollers 37b, 37b and a movable roller 37a which is provided between the supporting rollers 37b, 37b and movable in the vertical direction. When the movable roller 37a is lowered, the non-conductive sheet 21 on which the electrical conductor 22 is laminated is accumulated in the first accumulator 37, while, when the movable roller 37a rises, the accumulated non-conductive sheet 21 is fed to the downstream side from the first accumulator 37. In this way, the feed amount and the demanded amount of the non-conductive sheet 21 on which the electrical conductor 22 is laminated, on the front and back sides of the first accumulator 37, can be controlled.

The non-conductive sheet 21 on which the electrical conductor 22 is laminated is then transferred toward the cutter 42.

By pressing the cutter against the electrical conductor 22 on the transferred non-conductive sheet 21, the electrical conductor 22 is cut so as to form a slit 24a along the feed direction (the direction along a wider arrow depicted in FIG. 4, which is also referred to as the longitudinal direction) at a substantially central position in the width direction which is perpendicular to the feed direction. Thus, the electrical conductor 22 is cut into a pair of electrical conductors, and the width of the slit 24a is designed to be smaller than the width between the electrodes 20b, 20b of the IC chip 20. The cutting manner by using the cutter 42 is the so-called half cut, and hence the layered product formed of the electrical conductor 22 and non-conductive sheet 21 is not cut over the full thickness, but only the electrical conductor 22 is divided into two parts. Thus, the non-conductive sheet 21 remains intact without being divided.

In this way, the sheet 21a, on which electrical conductors are already formed and which includes the non-conductive sheet 21 and the pair of divided electrical conductors 22 provided on the non-conductive sheet 21 and spaced away from each other, is produced and fed to the downstream side.

In this embodiment, while an example in which the cutter 42 is located on the downstream side of the first accumulator 37 has been described, the location is not limited to this case, and therefore the cutter 42 may be positioned on the upstream side of the first accumulator 37.

<Coating of the Adhesive 18>

As shown in FIG. 4, on the downstream side of the cutter 42, a dispenser (means for providing an adhesive) 25 for providing the electrically conductive adhesive 18 is located. Thus, the sheet 21a with electrical conductors is applied with the electrically conductive adhesive 18 due to the dispenser 25, at its portions where the IC chip 20 should be disposed. In this embodiment, the electrically conductive adhesive 18 is provided on the electrical conductors 22 of the sheet 21a with electrical conductors.

In this embodiment, an anisotropic conductive adhesive is used as the electrically conductive adhesive 18. This anisotropic conductive adhesive is formed from, for example, non-conductive binder resin including a gold plated resin filler, electrically conductive particles of nickel or gold, or the like. The binder resin comprises a thermosetting resin. Accordingly, as shown in FIG. 4, even if the electrically conductive adhesive 18 is provided across the pair of electrical conductors over the slit 24a, these electrical conductors will not short-circuit through the adhesive 18.

Rather than using the anisotropic conductive adhesive, a non-conductive adhesive or usual conductive adhesive may be utilized. Alternatively, as the adhesive 18 or binder resin of such an anisotropic conductive adhesive, not only a thermosetting resin but also a thermoplastic resin may be used.

In this embodiment, while an example of providing the adhesive 18 by using the dispenser 25 has been disclosed, the coating is not limited to this aspect. For example, the adhesive 18 may be provided on the sheet 21a with electrical conductors, by using a screen printing machine.

<Production and Feed of IC Chips 20>

Next, a step of producing and feeding IC chips 20 will be described with reference to FIG. 5.

Figure 5:
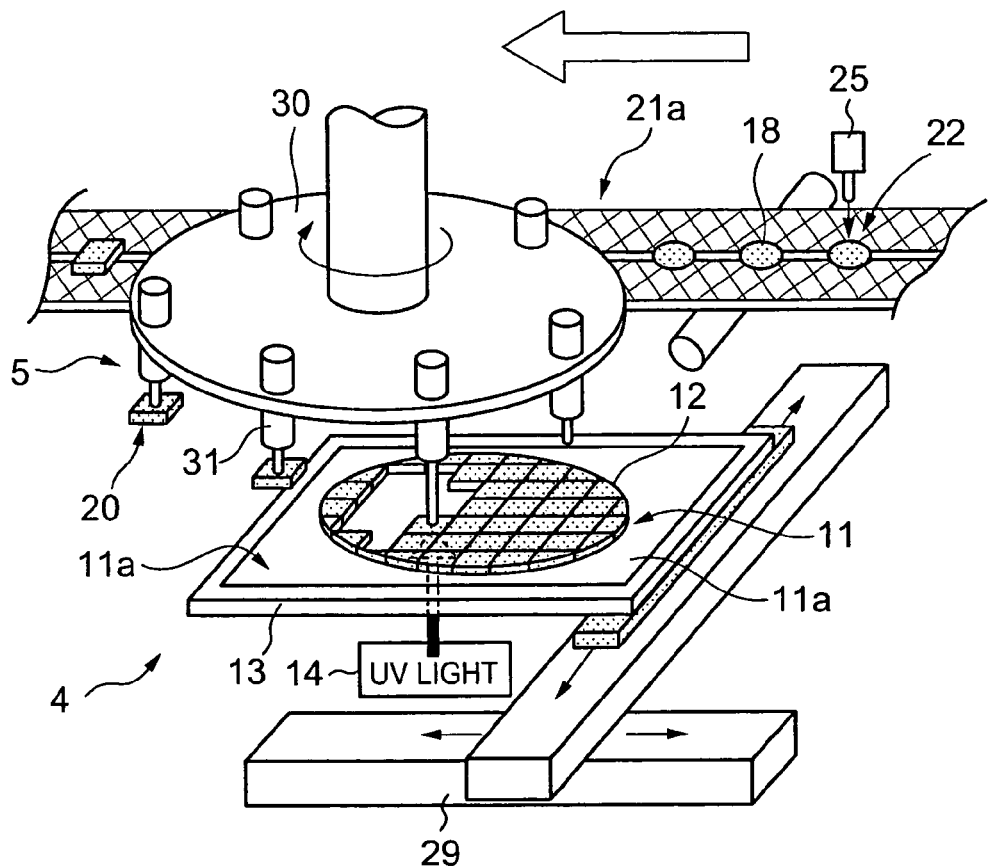
FIG. 5 is a perspective view illustrating a method of producing sheet with IC tags.

FIG. 5 is a perspective view illustrating a producing method for the sheet 1 with IC tags. In FIG. 5, a device (means) 4 for feeding IC chips is shown on the near side, while a line for feeding the sheet 21a with electrical conductors is depicted on the far side. Between these apparatuses, an arranging apparatus (also referred to as an arranging means, mounting apparatus or mounting means) 5 for IC chips is shown. It is noted that the sheet 21a with electrical conductors is transferred from right to left in FIG. 5.

First, the means (apparatus) 4 for feeding IC chips is explained. As shown in FIG. 5, the apparatus 4 for feeding IC chips includes a wafer holding plate (wafer holding portion) 13 for holding wafer 11 with release-sheet attached thereto constructed by adhering diced wafer 12 comprising multiple IC chips 20 onto a UV expanded release sheet 11a, and a UV light irradiating portion 14 for radiating UV light corresponding to a single IC chip 20 in the UV expanded release sheet 11a of the wafer 11 with release-sheet attached thereto held by the wafer holding portion 13.

The wafer holding portion 13 is formed of an optically transparent glass such that the UV light from the UV light irradiating portion 14 described below can be transmitted through this portion 13 and reach the wafer 11 with release-sheet. The wafer holding portion 13 is supported movably in both X and Y directions by an XY locomotive robot 29. Accordingly, the wafer 11 with release-sheet can be moved in a plane which is parallel to both the X and Y directions, and thus enabling to position each diced wafer 12 relative to the UV light irradiating portion 14 described below and each adsorbing pickup nozzle 31. In this embodiment, the X direction is a direction which is parallel to the feed direction (the direction from left to right in FIG. 5) of the sheet 21a with electrical conductors, while the Y direction is a direction which is perpendicular to the X direction (the direction along the line defined to connect the lower left to the upper right in FIG. 5).

Figure 6:
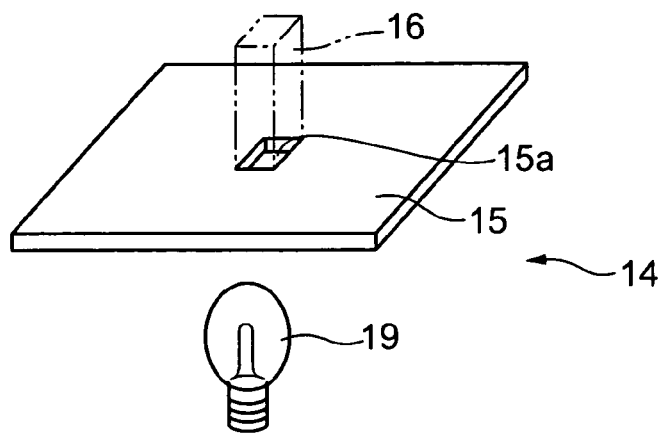
FIG. 6 is a perspective view illustrating a UV light irradiating portion of an apparatus for feeding IC chips.

Next, the UV light irradiating portion 14 will be described in more detail with reference to FIG. 6. FIG. 6 is a perspective view illustrating the UV light irradiating portion 14.

As shown in FIG. 6, the UV light irradiating portion 14 includes a UV lamp 19 for radiating UV light, and a mask 15 for guiding the UV light 16 from the UV lamp 19 toward the wafer 11 with release-sheet through an opening 15a having the same shape as that of each IC chip 20. In such a UV light irradiating portion 14, UV light from the UV lamp 19 is guided through the opening 15a of the mask 15 toward the wafer 11 with release-sheet, and the UV light emerging from the mask 15 reaches a portion corresponding to a single IC chip 20 in the UV expanded release sheet 11a of the wafer 11 with release-sheet. The UV expanded release sheet 11a is configured such that, when it is irradiated with the UV light 16, the adhesive strength of its irradiated portion will be degraded.

Rather than using the mask 15, the irradiation of the portion corresponding to the single IC chip 20 in the UV expanded release sheet 11a may be performed by condensation of the UV light 16 from the UV lamp 19 by utilizing a light condensing lens.

Next, a method of producing and feeding multiple IC chips 20 successively by using the IC chip feeding apparatus 4 will be described.

First, the wafer 11 with release-sheet are produced by adhering and fixing the diced wafer 12 comprising multiple IC chips 20 onto the UV expanded release sheet 11a. Subsequently, the wafer 11 with release-sheet are placed on the wafer holding portion 13 formed of an optically transparent glass and then fixed thereto. At this time, the circuit surfaces (those in which electrodes 20b of the IC chips 20 are formed) of the wafers 12 of the wafer 11 with release-sheet face downward, i.e., toward the UV expanded release sheet 11a. Such a position of the wafer 11 with release-sheet in which the circuit surfaces of the wafer 12 are facing downward is achieved by placing first the wafer 12 on a dicing sheet (not shown) with their circuit surfaces facing upward, dicing the wafer 12 on the dicing sheet, followed by repositioning the wafer 12 on the UV expanded release sheet 11a such that their circuit surfaces face the UV expanded release sheet 11a.

Next, the UV lamp 19 of the UV light irradiating portion 14 radiates UV light 16 from below the wafer holding portion 13 holding the wafer 11 with release-sheet. In this case, between the UV lamp 19 and the wafer 11 with release-sheet, a mask 15 having an opening 15a with a shape corresponding to a single IC chip 20 is disposed. Then, the UV light 16 from the UV lamp 19 is transmitted through the opening 15a of the mask 15 and reaches a rear portion corresponding to the single IC chip 20 in the UV expanded release sheet 11a of the wafer 11 with release-sheet.

In this case, the irradiation of the portion corresponding to the single IC chip 20 in the UV expanded release sheet 11a of the wafer 11 with release-sheet may be performed by utilizing a condensing lens (not shown) adapted to condense the UV light 16 from the UV lamp 19 into a size corresponding to the IC chip 20.

Once the UV light 16 reaches the wafer 11 with release-sheet, the adhesive strength of a portion irradiated with the UV light 16 in the UV expanded release sheet 11a is degraded. At this time, among the diced wafer 12 adhered onto the UV expanded release sheet 11a, the single IC chip 20 corresponding to the portion whose adhesive strength of the UV expanded release sheet 11a is degraded is released and floats up from the UV expanded release sheet 11a. In this way, only the single IC chip 20 can be fed from the wafer 12 comprising multiple IC chips 20. As used herein, the term "Multiple" means a plural number of tow or more. It is however preferred that the number is several tens to several hundreds in view of the production efficiency (FIG. 5).

It is noted that this step may proceed in parallel with the aforementioned step of feeding the sheet with electrical conductors and/or the subsequent step of providing the adhesive.

<Arranging (Mounting) of IC Chips 20>

Next, a step of arranging IC chips 20 will be described with reference to FIG. 5.

First, an arranging apparatus (means) 5 for IC chips 20 is described.

The arranging apparatus (adsorbing transfer portion) 5 for IC chips 20 includes a rotatable index table 30 having a generally disk-like shape, adsorbing pickup nozzles 31 which are arranged at an equal interval on the same circumference of a circle around a center of rotation of the index table 30, supported in large numbers on the index table 30, and adapted to adsorb IC chips 20 respectively released from the UV expanded release sheet 11a, and a CCD camera 49 (FIG. 3) which is used for positioning and inspection of the IC chips. The adsorbing pickup nozzles 31 are configured to be lifted and lowered relative to the index table 30.

Next, a method of arranging (mounting) multiple IC chips 20 on the sheet 21a with electrical conductors, by utilizing the arranging apparatus 5 for IC chips 20 is described.

As shown in FIG. 5, when the sheet 21a with electrical conductors provided with the electrically conductive adhesive 18 reaches around the arranging apparatus 5, an IC chip 20 floating up from the UV expanded release sheet 11a is then adsorbed by one of the adsorbing pickup nozzles 31 which is lowered from the index table 30. As described above, at this time, the circuit surface, i.e., the surface on the side of electrodes 20b, of the IC chip 20 which has been fed from the IC chip feeding means 4 faces downward, so that the adsorbing pickup nozzle 31 adsorbs a surface opposite to the circuit surface in which the electrodes 20b of the IC chip are formed (FIG. 5).

Thereafter, the adsorbing pickup nozzle 31 is lifted up, and the index table 30 is then rotated, and thus the IC chip 20 adsorbed by this adsorbing pickup nozzle 31 is carried toward the sheet 21a with electrical conductors.

At that time, inspection on the IC chip 20 which is adsorbed by the adsorbing pickup nozzle 31 is performed based on an image taken from the CCD camera 49 (FIG. 3). In the inspection, deficiencies in appearance, such as breakage or cracks, of the IC chip 20 are checked. IC chips 20 which are judged to be deficient in this step will never be arranged on the sheet 21a with electrical conductors.

On the other hand, IC chips 20 which are judged to be proper upon the inspection for breakage or cracks will be subjected to positioning relative to locations, at which they are to be arranged, on the sheet 21a with electrical conductors, base on an image taken from the CCD camera 49. In this case, the alignment between the IC chips 20 and the sheet 21a with electrical conductors, on which these IC chips 20 are to be arranged, is performed, based on an image taken from the CCD camera 49, by adjusting the position of each IC chip 20 adsorbed by the corresponding adsorbing pickup nozzle 31 by moving (shifting) the IC chip relative to the adsorbing pickup nozzle 31; by adjusting the position of the adsorbing pickup nozzle 31 by moving it relative to the index table 32; by adjusting the position of the index table 32 by moving it relative to the sheet 21a with electrical conductors; or by adjusting the position of the sheet 21a with electrical conductors relative to the index table 32.

In this embodiment, while an example in which the same CCD camera 49 is used for appearance inspection as well as for positioning has been described, the aspect of performing these operations is not limited to this case. For example, exclusive CCD cameras may be used for them, respectively.

Once the positioning is ended, the adsorption pickup nozzle 13 is lowered, and the IC chip 20 is then arranged on the adhesive provided portion on the electrical conductors 22 of the sheet 21a with electrical conductors, thereafter the IC chip 20 is temporarily fixed on the electrical conductors 22 through the electrically conductive adhesive 18. As stated above, at this time, the surface on the side of electrodes 20b of the IC chip 20 faces the sheet 21a with electrical conductors. Namely, the adsorbing pickup nozzle 31 places the IC chip 20 on the sheet 21a with electrical conductors, without changing the front and back sides of the IC chip 20, or keeping the side of the IC chip 20 as it was fed from the IC chip feeding means 4. This is because the wafer 11 release-sheet attached thereto are so formed that each wafer 12 is arranged such that its circuit surface faces the UV expanded release sheet 11a. Therefore, as compared with the case where the front and back faces of the IC chip must be changed each time it is placed on the sheet 21a with electrical conductors, both the production efficiency and the quality can be enhanced.

During the placement of the IC chip 20, the transfer in the feed direction of the sheet 21a with electrical conductors is stopped for a period of time, for example, 1 to 5 seconds per IC chip. During the stopping period, the continuously fed non-conductive sheet 21 on which the electrical conductor 22 is laminated is accumulated in the first accumulator 37 described above.

As shown in FIG. 3, a second accumulator 38 is disposed on the downstream side of the arranging apparatus 5. While feeding of the sheet 21a with electrical conductors is stopped during the arrangement of the IC chip 20, the sheet 21a with electrical conductors, on which further the IC chips 20 are already arranged and which is then accumulated in the second accumulator 38, is drawn out toward the downstream side as needed. The second accumulator 38 is constructed similarly to the first accumulator 37, and includes a pair of supporting rollers 38b, 38b and a movable roller 38a which is movable in the vertical direction.

Once a single IC chip 20 is adsorbed by a corresponding adsorbing pickup nozzle 31, in parallel to the arranging step, the wafer holding portion 13 is moved in the X and Y directions due to the XY locomotive robot 29, a next IC chip 20 is moved to a position immediately above the opening 15a of the mask 15. Thereafter, each IC chips 20 is fed to the place successively in accordance with the procedure as described above, and is then adsorbed by each corresponding adsorbing pickup nozzle 31. In this way, IC chips 20 are arranged (mounted) successively on the sheet 21a on which the electrical conductors are already formed.

<Fixing of IC Chips 20>

Next, a step of fixing IC chips 20 will be described with reference to FIG. 3.

On the downstream side of the second accumulator 38, a thermo-compression bonding machine (means for fixing IC chips) 26 is provided extending along the feed direction. Due to the thermo-compression bonding machine 26, a plurality of IC chips 20 are pressurized, for a period of time, while being heated, against the sheet 21a with electrical conductors. In this case, the heating temperature is in the range of from 150° C. to 250° C., the pressurizing time is in the range of from several seconds to several tens of seconds, and the number of the IC chips pressurized at a time is in the range of from ten to hundred.

Thus, the flat electrodes 20b of each IC chip 20 can be securely adhered and fixed to the electrical conductors 22 of the sheet 21a with electrical conductors, through the anisotropic conductive adhesive 18. Also at this time, the flat electrodes 20b are securely and electrically connected with the electrical conductors 22 through electrically conductive particles.

According to this embodiment, as described above, a sheet 1 with IC tags including the non-conductive sheet 21, the pair of electrical conductors 22 provided on the non-conductive sheet 21 and extending in a band-like fashion, and the multiple IC chips 20 arranged on the pair of electrical conductors 22 is produced.

During the pressurization due to the thermo-compression bonding machine 26, the transfer in the feed direction of the sheet 21a with electrical conductors is stopped. During the stopping period, the sheet 21a with electrical conductors, on which further the IC chips are already arranged and which is continuously fed from the arranging apparatus 5, is accumulated in the second accumulator 38 described above.

Again, as shown in FIG. 3, a third accumulator 39 is located on the downstream side of the thermo-compression bonding machine 26. While feeding of the sheet 21a with electrical conductors is stopped during the fixation of the IC chips 20, the sheet with IC tags accumulated in the third accumulator 39 is drawn out toward the downstream side as needed. The third accumulator 39 is constructed similarly to the first accumulator 37 and second accumulator 38, and includes a pair of supporting rollers 39b, 39b and a movable roller 39a which is movable in the vertical direction.

The thermo-compression bonding machine 26 may be configured to move reciprocally along the feed direction. In such a case, due to the movement in the feed direction of the thermo-compression bonding machine 26 while heating and pressing the IC chip 20 against the sheet 21a with electrical conductors, there is no need of stopping movement of the sheet 21a with electrical conductors, along the fed direction.

Thus, the accumulators 38, 39 can be eliminated, or otherwise, the accumulating amounts in these accumulators 38, 39 can be reduced.

Figure 8:
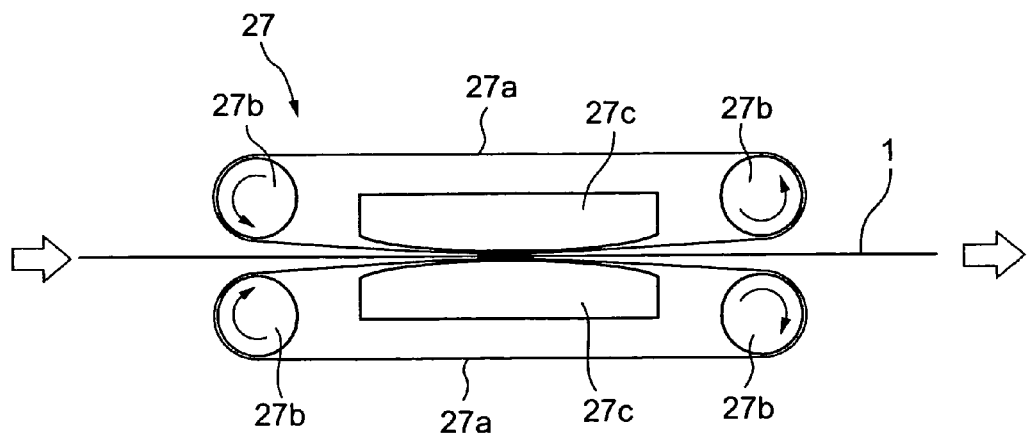
FIG. 8 is a side view showing a variation of the fixing method for IC chips.

Alternatively, a thermo-compression machine (means for fixing IC chips) as shown in FIG. 8 may be used. FIG. 8 illustrates a variation of the fixing method for IC chips 20, and is a side view showing the thermo-compression bonding machine 27. In FIG. 8, the sheet 21a with electrical conductors, on which further the IC chips 20 are already arranged, is fed from left to right. The thermo-compression bonding machine 27 includes a pair of annular belts 27a disposed such that the sheet 21a with electrical conductors, on which further the IC chips 20 are already arranged, can be interposed therebetween, driving rollers 27b adapted to support and drive each annular belt 27a, and a pair of pressing members 27c each disposed in each annular belt 27a and adapted to press the annular belt 27a against the sheet 21a with electrical conductors, on which further the IC chips 20 are already arranged. In addition, at least one of the pair of pressing members 27c is provided with a heating mechanism. In this thermo-compression boding machine 27, the driving rollers 27b are adapted to drive the annular belts 27a at the same feed speed as that of the sheet 21a with electrical conductors. When the sheet 21a with electrical conductors, on which further the IC chips 20 are already arranged and which is interposed between the annular belts 27a, is transferred between the pressing members 27c, the IC chips 20 are heated and pressed against the sheet 21a with electrical conductors. Thus, without stopping movement in the feed direction of the sheet 21a with electrical conductors, the sheet 1 with IC tags can be produced by successively fixing the IC chips 20 to the sheet 21a with electrical conductors. In the thermo-compression bonding machine 27, the end face of each pressing member 27a on the sheet feeding side is chamfered so as to be of an arcuate shape when viewed from a side (see FIG. 8), such that the sheet 21a with electrical conductors, on which further the IC chips are already arranged, can be introduced in a space between the pressing members 27c without being broken.

In this embodiment, while an example in which the IC chips 20 are thermo-compressively fixed onto the electrical conductors 22 by heating and pressing the IC chips 20 against the electrical conductors 22 by using the thermo-compression bonding machine 26, 27 has been described, it is, of course, contemplated that the adhesive used for fixing the IC chips 20 to the electrical conductors 22 includes a thermosetting resin. However, this process is not limited to such an aspect. Depending on the type of adhesive 18, the IC chips 20 may be compressively fixed onto the electrical conductors 22 only by compression without heating.

Furthermore, in the case where a non-conductive adhesive is used as the adhesive, an ultrasonic vibrator is used as the fixing means for the IC chips 20, and the IC chips can be fixed onto the electrical conductors 22 by applying ultrasonic vibration to the IC chips 20. In this case, the non-conductive adhesive layer is broken or melted away so as to create metal bond of the electrodes 20b of the IC chips 20 to the electrical conductors 22. In this way, even though the non-conductive adhesive is provided between the electrodes 20b of the IC chips 20 and the electrical conductors 22, electrical connection can be securely established between the electrodes 20b of the IC chips 20 and electrical conductors 22.

<Production and Inspection of IC Tags 10>

Next, a step of producing and inspecting IC tags 10 will be explained with reference to FIGS. 3 through 7.

Figure 7:
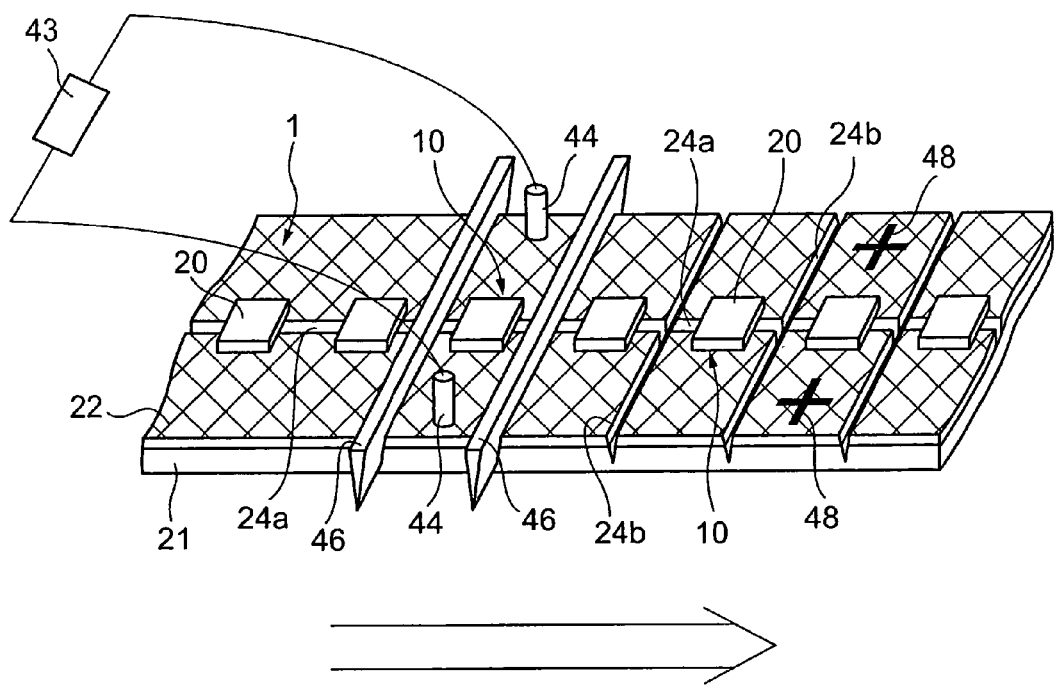
FIG. 7 is a perspective view illustrating a cutting method for electrical conductors on a sheet with IC tags and an inspection method for IC tags.

FIG. 7 is a perspective view showing a cutting method for the electrical conductors 22 of the sheet 1 with IC tags and a method of inspecting IC tags 20. In FIG. 7, the sheet with IC tags is fed from left to right.

As shown in FIG. 3, a pair of non-conductive blades (means for producing IC tags) 46 are arranged on the downstream side of the third accumulator 39. The pair of non-conductive blades 46 are spaced apart from each other along the feed direction, and extend along the width direction perpendicular to the feed direction, respectively. Further, the pair of non-conductive blades 46 are movable in the vertical direction.

When the sheet 1 with IC tags is fed just below the non-conductive blades 46, the movement in the feed direction of the sheet 1 with IC tags is stopped. During the stopping period, the continuously fed sheet 1 with IC tags is accumulated in the third accumulator 39 described above.

As such, the pair of non-conductive blades 46 are lowered to cut into the sheet 1 with IC tags to interpose each IC chip 20 therebetween. At this time, as shown in FIG. 7, the non-conductive blades 46 do not cut the full thickness of the sheet 1 with IC tags, but cut and separate only the electrical conductors 22 for each IC chip 20, thus leaving the non-conductive sheet 21 uncut. In this way, IC tags 10 each comprising a pair of extension electrodes 9 formed from the pair of electrical conductors 22 and an IC chips 20 connected with the extension electrodes 9 are produced successively along the feed direction of the non-conductive sheet 21, with the IC tags 10 being supported on one sheet of non-conductive sheet 21 extending in a band-like fashion. Accordingly, after this step, the sheet with IC tags includes the non-conductive sheet 21 extending in a band-like fashion, multiple pairs of electrical conductor 22 provided along the longitudinal direction of the non-conductive sheet 21, and IC chips respectively arranged across (between) each pair of electrical conductor 22. In addition, between each adjacent pair of IC chips 20, a cut (notch, opening) 24b extends over the full width of each pair of electrical conductors 22 such that cut gets into the non-conductive sheet 21 from the surface of the electrical conductors 22.

The quality inspection of IC tags 10 is performed by contacting a pair of inspection electrodes 44 extending from an inspection means (means for inspection) 43 with the extension electrodes 9 of each IC tag 10 interposed between the pair of non-conductive blades 46, with the pair of non-conductive blades 46 getting into the sheet 1 with IC tags. In this time, edges of the pair of non-conductive blades 46 are in contact with the non-conductive sheet 22. Accordingly, the extension electrodes 9 interposed between the pair of non-conductive blades 46 are securely isolated, through the blades 46, from the adjacent pairs of extension electrode 9 or electrical conductors 22 on both sides. Thus, the IC tags supported on the single non-conductive sheet 21 extending in a band-like fashion can be securely inspected, one at a time.

As the inspection mean 43, for example, a reader/writer, impedance analyzer or resistance meter may be used.

In the case of using a reader/writer as the inspection means 43, whether sending and receiving data in contact with each IC tag 10 is possible or impossible can be inspected. In this case, adding to quality confirmation of each IC tag 10, information can also be written into the IC chip 20 by utilizing the reader/writer. The written information, for example, includes results of quality confirmation, or product information of each IC chip 20 or final IC tag 10. As the product information, a lot number, date of manufacture, name of the product, name of the manufacturer, information on the person to whom the product is delivered or the like can be mentioned.

In the case of using an impedance analyzer as the inspection means 43, sensitivity of each IC chip 20 to radio waves of various frequencies can be measured in order to confirm a shift in the resonance frequency or the like. Also, electric capacity or state of memory of a capacitor in each IC chip 20 can be inspected.

In the case of using a resistance meter as the inspection means 43, the electric resistance between the extension electrodes 9 can be measured to inspect the presence of abnormality of electric resistance of each IC chip 20, electrical continuity between each pair of extension electrodes 9 or the like.

As shown in FIG. 7, an NG mark 48 is marked by using an ink jet (not shown) or the like if the result of inspection provides a decision that a certain IC tag 10 is deficient. In this embodiment, the NG mark 48 is provided on the extension electrodes 9 of an IC tag. However, the marking is not limited to this aspect, the mark 48 may be provided on an IC chip 20 or other portions. Consequently, even though a deficient IC tag 10 is included in a sheet 1 with IC tags, it can be securely selected in the following steps.

Once the inspection is ended, the inspection electrodes 44 are detached from the inspected IC tag 10, and at the same time, the non-conductive blades 46 are lifted up. Thereafter, the sheet 1 with IC tags is fed by one IC tag, i.e., fed by a length of a space defined between the pair of non-conductive blades 46. Then, as shown in FIG. 7, in the sheet 1 with IC tags which has been fed downstream from the inspection step, the cuts 24b each separating the electrical conductors 22 are formed along the width direction.

Once the sheet 1 with IC tags is fed by one IC tag, the pair of non-conductive blades 46 are lowered again toward the sheet 1 with IC tags. In this case, the non-conductive blade 46 disposed on the downstream side (right in FIG. 7) gets into the cut 24b formed by immediately previous lowering of the upstream non-conductive blade 46. On the other hand, the upstream non-conductive blade 46 forms a new cut 24b by cutting the electrical conductors 22, as described above, thus forming an IC tag 10 between the pair of non-conductive blades 46. Again, the pair of non-conductive blades 46 get into the sheet 1 with IC tags, with the IC tag 10 being interposed therebetween. Then, the IC tag 10 is inspected, while being isolated through the blades 46 from the adjacent pairs of extension electrode 9 or electrical conductors 22 on both sides.

In such a way, while the sheet 1 with IC tags is fed intermittently, multiple IC tags 10 can be produced successively on the non-conductive sheet 21 extending in a band-like fashion, as well as, the inspection of the so produced IC tags 10 can be performed successively.

In this embodiment, the sheet 1 with IC tags produced through the above steps and inspection is further laminated with a protective film 23 thereon, as shown in FIG. 3, and then wound around a winding core 1a.

As stated above, the lamination by the protective film 23 is a protective process for preventing the IC chips 20 from being broken or shifted from the proper positions on the electrical conductors 22 (extension electrodes 9). As described above, rather than utilizing the lamination of the protective film 23 on the IC chips, the protective process for the IC chips 20 may be performed by sealing the IC chips 20 using a resin.

Alternatively, the protective process for the IC chips 20 may be performed by arranging a pair of sheets having an equal or greater thickness as compared to the thickness of the IC chips 20 on both sides of the IC chips 20 on the sheet 1 with IC tags, and then winding them with the sheet 1 with IC tags around the winding core 1a. Such sheets can serve to prevent the IC chips 20 on the wound sheet with IC tags from being shifted on the electrical conductors 22 (extension electrodes 9) or being applied with undue stress. Furthermore, these sheets can stabilize the wound state of the sheet 1 with IC tags, as well as, can prevent unwinding.

Alternatively, without winding the sheet 1 with IC tags, the IC tags 10 may be produced in a line by cutting the sheet 1 with IC tags along each cut 24b.

As stated above, according to this embodiment, the sheet 21a with electrical conductors is made by laminating the electrical conductor 22 on the non-conductive sheet 21, and providing the slit 24a in the electrical conductor 22 using the cutter 42. Accordingly, the space provided between the cut pair of electrical conductors 22 is constant, thereby facilitating the positioning of IC chips 20 upon subsequent arrangement of the IC chips.

Since an anisotropic conductive adhesive is used as the electrically conductive adhesive 18, even though the electrically conductive adhesive 18 is provided such that it extends across (between) both the electrical conductors 22 interposing the slit 24a, the pair of electrical conductors will not short-circuit through the electrically conductive adhesive 18. Therefore, the electrically conductive adhesive can be provided with ease and rapidly.

The UV light irradiating portion 14 irradiates only one IC chip portion with UV light from the UV lamp 19 through the mask 15 so as to weaken adhesive strength for the only one IC chip to the UV expanded release sheet 11a. Thus, the only one so processed IC chip 20 can be picked up by a corresponding adsorbing pickup nozzle 31 without requiring any special procedure, such as pushing up the UV expanded sheet 11a from below. Therefore, the IC chips 20 can be fed, one at a time, rapidly and securely, without breaking any IC chip 20.

Furthermore, since the circuit surface of the wafer 12 in the wafer 11 with release-sheet face downward, i.e., in the direction toward the UV expanded release sheet 11a, the IC chip 20 picked up by the adsorbing pickup nozzle 31 can be placed on the electrical conductor 22, as it is, without changing its front and back sides. The adsorption pickup nozzle 31 is provided in large numbers around the index table 30. As such, the IC chips 20 can be transferred to and placed on the sheet 21a with electrical conductors, continuously and rapidly.

In addition, the IC chips 20 are fixed to the sheet 21a with electrical conductors, collectively in plural numbers at a time, by thermo-compression bonding machine 26, and the second accumulator 38 and the third accumulator 39 are disposed in front of and behind the thermo-compression bonding machine 26, respectively. In this way, the IC chips 20 can be fixed to the sheet 21a with electrical conductors, efficiently and securely, as well as, the electrodes 20b of the IC chips 20 and the electrical conductors 22 can be connected electrically and steadily with each other.

By making the IC tags 10 by cutting the electrical conductors 22, using the non-conductive blades 46 each extending along the width direction, electric characteristics of each IC tag 10 can be inspected while the IC tag 10 is supported on the non-conductive sheet 21 extending in a band-like fashion. Thus, the inspection of the electrical conductors 22 can be performed continuously and efficiently. In the case where deficient products are detected continuously, each step can be inspected by stopping the production line 2. Therefore, it is possible to prevent such deficient products from being made continuously in a greater amount.

The inspection is performed with the pair of non-conductive blades 46 getting into the electrical conductors 22. Accordingly, no contact between the extension electrodes 9 of each IC tag 10 to be inspected and both of the extension electrodes and electrical conductors 22 of the adjacent IC tags 10 on both sides would be established even though expansion and contraction of the sheet 1 with IC tags occur. As such, each targeted IC tag 10 can be inspected accurately, with the IC tag 10 being isolated securely from the other IC tags 10 and the sheet 1 with IC tags.

Due to these mechanisms, the sheet 1 with IC tags can be produced with high accuracy and efficiency, and the IC tags 10 can be inspected successively on the sheet 1 with IC tags by making the multiple IC tags supported on the non-conductive sheet 21 extending in a band-like fashion. Consequently, the inspected sheet 1 with IC tags can be produced at a low cost.

<Variations of Preparation and Feed of IC Chips 20>

In this embodiment, while an example in which the IC chip 20 is fed, one at a time, by using the wafer holding plate (wafer holding portion) 13 for holding the wafer 11 with release-sheet, and the UV light irradiating portion 14 for radiating-UV light 16 corresponding to a single IC chip 20 has been described, this embodiment is not limited to this aspect.

Figure 9:
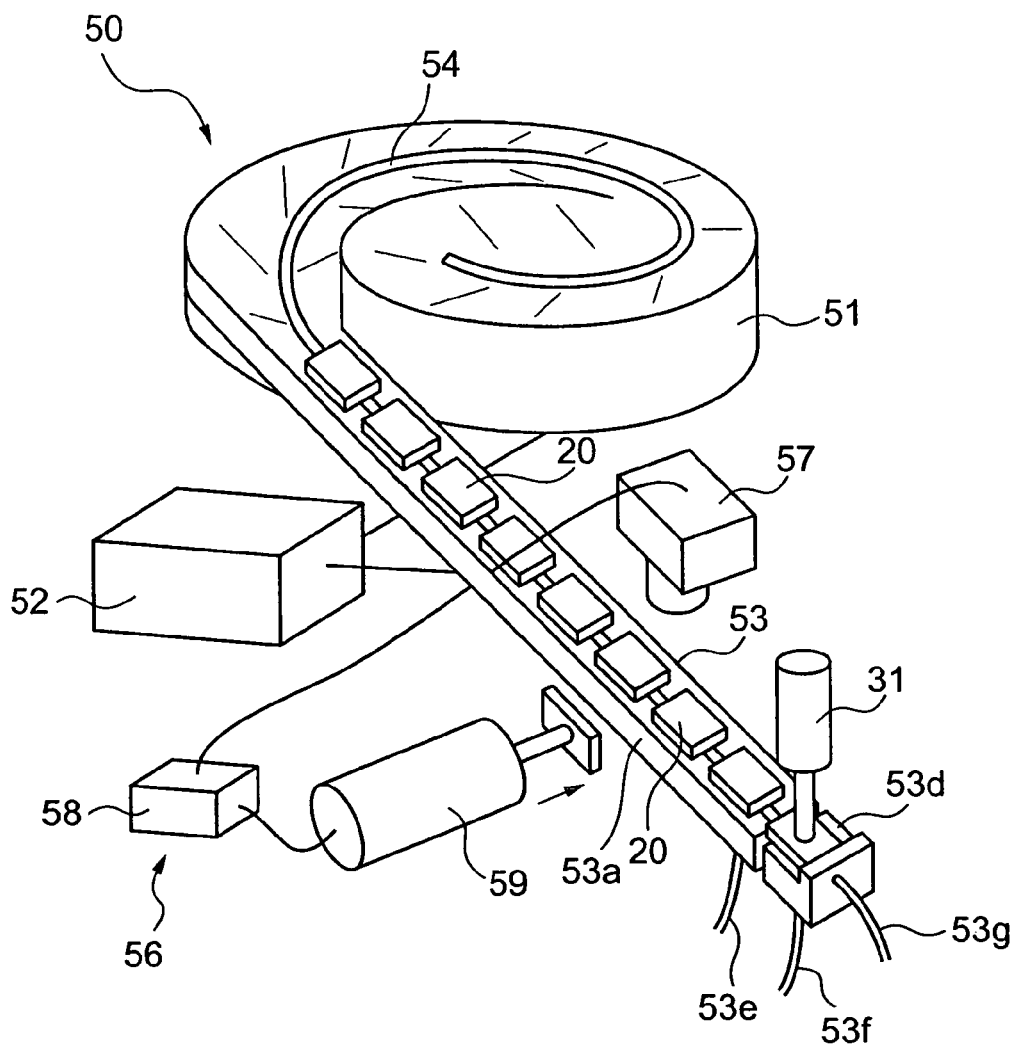
FIG. 9 is a perspective view showing a variation of the feeding method for IC chips.
Figure 10:
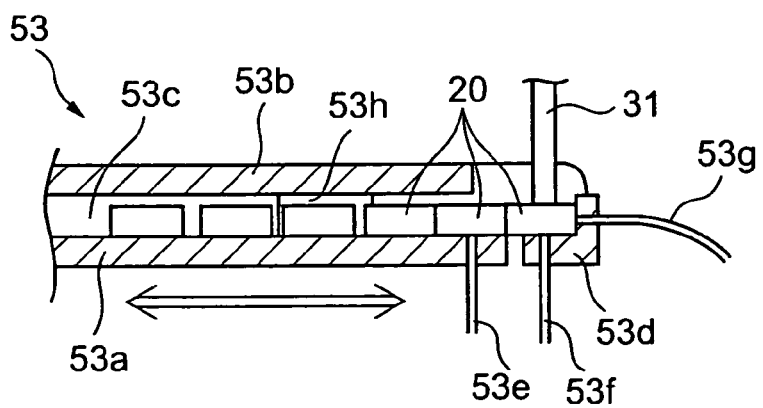
FIG. 10 is a sectional view showing a variation of the method of feeding IC chips.

Hereinafter, a variation of the feeding method for IC chips will be described with reference to FIGS. 9 and 10. FIG. 9 is a perspective view illustrating a variation of the feeding method for IC chips.

First, a feed apparatus 50 for IC chips is described.

The feed means (apparatus) 50 (also referred to as a parts feeder) for IC chips comprises a receiving body 51 for receiving IC chips 20 therein, a passage 53 connected with the receiving body 51 and adapted to arrange the IC chips 20 in a line, and a vibrator 52 adapted to provide vibration to the receiving body 51 and passage 53 in a predetermined direction.

While the receiving body 51 is shown in FIG. 9 to be generally circular, it may be rectangular. A groove 54 is formed in the receiving body 51 along the vibrating direction of the vibrator 52. The groove 54 is provided such that it describes, for example, a curve from the center to a periphery of the receiving body 51 (like a spiral) in the case where the receiving body 51 is circular. The groove 54 is also provided in order to arrange IC chips 20 in a line due to vibration. In the receiving body 51, for example, multiple IC chips 20 having been released collectively from the UV expanded release sheet 11a are housed. As used herein, the term "multiple" means a plural number of two or more. It is however preferred that the number is several tens to several hundreds in view of the production efficiency (FIG. 9).

The vibrator 52, for example, is disposed in large numbers at predetermined portions of the receiving body 51 so as to generate vibration depicting a spiral defined from the center to a periphery of the receiving body 51 along the groove 54. In such a manner, since IC chips 20 can be moved with vibration along the vibrating direction, those overlapping each other can be scattered during the movement. Also, since the groove 54 is provided along the vibrating direction, the IC chips 20 can be moved while getting in the groove 54.

Next, the passage 53 is described. FIG. 10 is a cross section taken along the longitudinal direction, illustrating a variation of the feeding method for IC chips 20. As shown in FIGS. 9 and 10, the passage 53 includes a supporting portion 53a adapted to support IC chips 20 from below, side portions 53c arranged on both sides of the supporting portion 53a, a top face portion 53b located above the supporting portion 53a, and a transferring table 53d disposed at a distal end of the supporting portion 53a and adapted to transfer IC chips 20 to the adsorption pickup nozzles 31. It is noted that the top face portion 53b and side portions 53c are not shown in FIG. 9.

The supporting portion 53a, side portions 53c and top face portion 53b are secured to one another. These supporting portion 53a, side portions 53c and top face portion 53b are connected to the vibrator 52 (FIG. 9) such that they are vibrated respectively along the longitudinal direction (the direction along a wider arrow depicted in FIG. 10) due to the vibrator 52. As such, the IC chips 20 on the supporting portion 53a can be moved toward the distal end successively.

In the vicinity of the distal end of the supporting portion 53a, a first suction mechanism 53e is provided. The first suction mechanism 53e is constructed to adsorb an IC chip 20 arranged on the first suction mechanism 53e and fix it in position.

The transferring table 53d is separated from the supporting portion 53a, side portions 53c and top face portion 53b, and hence fixed not to be vibrated by the vibrator 52. As shown in FIG. 10, while the side portions 53c extend up to the transferring table 53d, the side portions 53c are not connected to the transferring table 53d, and they can slide relative to the transferring table 53d due to the effect of the vibrator 52.

The length of a bottom face of the transferring table 53d is designed to be slightly shorter than the length generally corresponding to one IC chip 20, and a second suction mechanism 53f is provided at approximately the center of the bottom face. In addition, at a distal side face of the transferring table 53d, a third suction mechanism 53g is provided to adsorb an IC chip 20 from the side face of the IC chip 20. The second suction mechanism 53f and third suction mechanism 53g, similar to the first suction mechanism 53e, are configured such that each of them can adsorb an IC chip 20 which will be arranged above it, and fix the IC chip 20 in position.

The space between the side portions 53c is of a width such that only one IC chip 20 can pass through at a time. Accordingly, in the case where each of the IC chips 20 used is of an oblong (rectangular) shape, the orientation of the IC chip 20 can be controlled due to the passage 53 as well as these IC chips 20 can be arranged in a line by restricting each offset in the lateral direction. Also in the passage 53, a groove 54 is provided to arrange the IC chips 20 in a line. It is preferred that this groove 54 is connected with the groove 54 formed in the receiving body 51, as shown in FIG. 9.

In the middle of the passage 53, an inspection unit 56 is provided for inspecting the front and back sides and orientation of each IC chip 20. The inspection of the front and back sides and orientation of each IC chip 20 means to inspect whether the surface of electrodes 20b faces downward or not and whether the position of the IC chip 20 is adequate or not. The inspection unit 56 includes a photographing instrument 57 for photographing each IC chip 20, and a control device 58 for deciding the front and back sides and orientation of the IC chip 20 from the photographed image. As the photographing instrument 57, a CCD camera or photo-sensor is used. Additionally, on one side of the passage 53, a pushing instrument 59 is provided. The pushing instrument 59 is adapted to push out an IC chip, which has been decided, by the control device 58, to be abnormal in either of its front and back sides or orientation (hereinafter, such an IC chip will be referred to as a front-or-back-side-or-orientation deficient IC chip), from an opening 53h provided in the passage 53.

Next, a method of feeding IC chips 20 by using the parts feeder 50 will be described.

First, multiple IC chips 20 released collectively from the UV expanded release sheet 11a are fed to the receiving body 51. Next, by using the vibrator 52, vibration is given in a predetermined direction to the receiving body 51 and passage 53. In this way, the IC chips in the receiving body 51 are arranged in a line and then moved into the passage 53. While being properly oriented by the side portions 53c, each IC chip 20 on the passage 53 is moved toward its distal end in a linearly arranged state.

When a sensor (not shown) detects that an IC chip 20 reaches the transferring table 53d, the first suction mechanism 53e, second suction mechanism 53f and third suction mechanism 53g start adsorption, respectively. Thus, only one IC chip 20 is adsorbed and fixed onto the transferring table 53d, and another adjacent one IC chip 20 is adsorbed and fixed onto the distal end of the supporting portion 53a. Because the top face portion 53b is provided on the supporting portion 53a, even though the passage 53 is vibrated continuously by the vibrator 52, both riding over one fixed IC chip of another IC chip and falling out from the passage 53 of such riding IC chip 20 can be prevented.

Thereafter, the adsorbing pickup nozzle 31 is lowered, and the IC chip 20 fixed onto the transferring table 53d is thus adsorbed by the nozzle 31. Because the transferring table 53d is fixed without being vibrated and the IC chip 20 is positioned on the transferring table 53d due to the side portions 53c and the distal side face of the transferring table 53d as well as adsorbed and fixed onto the transferring table 53d, the adsorbing pickup nozzle 31 can adsorb the IC chip 20 accurately at a desired point. As described above, since the riding over one fixed IC chip 20 of another IC chip 20 can be prevented, the IC chip 20 can be adsorbed smoothly by the adsorbing pickup nozzle 31.

When the IC chip 20 on the transferring table 53d is adsorbed by the adsorbing pickup nozzle 31, the second suction mechanism 53f and the third suction mechanism 53g stop sucking. Subsequently, the adsorbing pickup nozzle 31 is lifted up while adsorbing the IC chip 20, and the adsorbed IC chip 20 is then placed on the sheet 21a with electrical conductors, as described above. In this case, since the position of the IC chip 20 relative to the adsorbing pickup nozzle 31 is determined accurately as described above, the IC chip 20 can be securely positioned on the electrical conductors 22.

When the adsorbing pickup nozzle 31 is lifted up, the adsorption due to the first suction mechanism 53e is stopped, and a next IC chip 20 is moved again toward the transferring table 53d. In this variation, as described above, the IC chips 20 are fed successively, one at a time.

On the passage 53, during arrangement of IC chips 20, the IC chips 20 being arranged in a line are photographed by the photographing instrument 57. Subsequently, the control device 58 judges whether the front and back sides and orientation of each IC chip 20 is proper or not, based on an image taken by the photographing instrument 57. From the result, if the IC chip 20 is judged to be proper in the front and back sides and orientation, the judged IC chip 20 further goes forward one after another on the passage 53, as described above. Contrary, if any IC chip with an improper front or back side or orientation is found, the control device 58 drives the pushing instrument 59. As a result, the pushing instrument 59 pushes out such a front-or-back-side-or-orientation deficient IC chip 20 in the line of IC chips 20 arranged on the passage 53, so as to remove the deficient IC chip 20 from the passage 53 through the opening 53h of the passage 53. The removed deficient IC chip 20 is returned to the receiving body 51, arranged again in a line, and fed onto the passage 53.

Furthermore, in the arranging step, based on an image provided from the CCD camera 49 of the arranging apparatus 5 described above, the front and back sides and orientation of each IC chip 20 adsorbed by the adsorbing pickup nozzle 31 can be inspected again. In the result of this inspection, it is preferred that any IC chip which is judged to be improper in the front or back side or orientation will be returned to the receiving body 51, arranged again in a line, and fed onto the passage 53.

Also in this variation, the IC chips 20 can be fed accurately, one at a time.

<Variation of Preparation of the Sheet 21a with Electrical Conductors>

In the embodiment described above, the sheet 21a with electrical conductors is prepared by laminating the electrical conductor 22 on the non-conductive sheet 21 and forming the slit 24a in the electrical conductor 22 has been exemplified. However, in this example, while the slit 24a is formed by cutting the electrical conductor 22 by using the cutter 42, the slit formation is not limited to this process.

Figure 12:
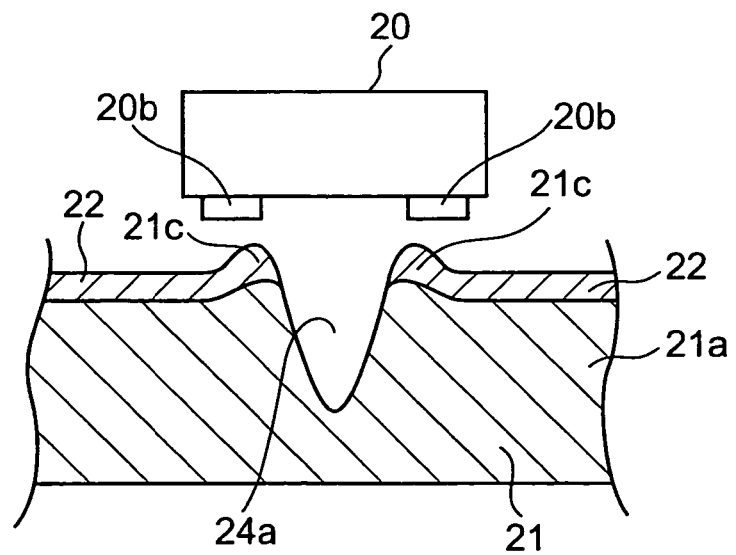
FIG. 12 is a sectional view illustrating the sheet with electrical conductors, with a slit being formed in the sheet by a cutter.
Figure 13:
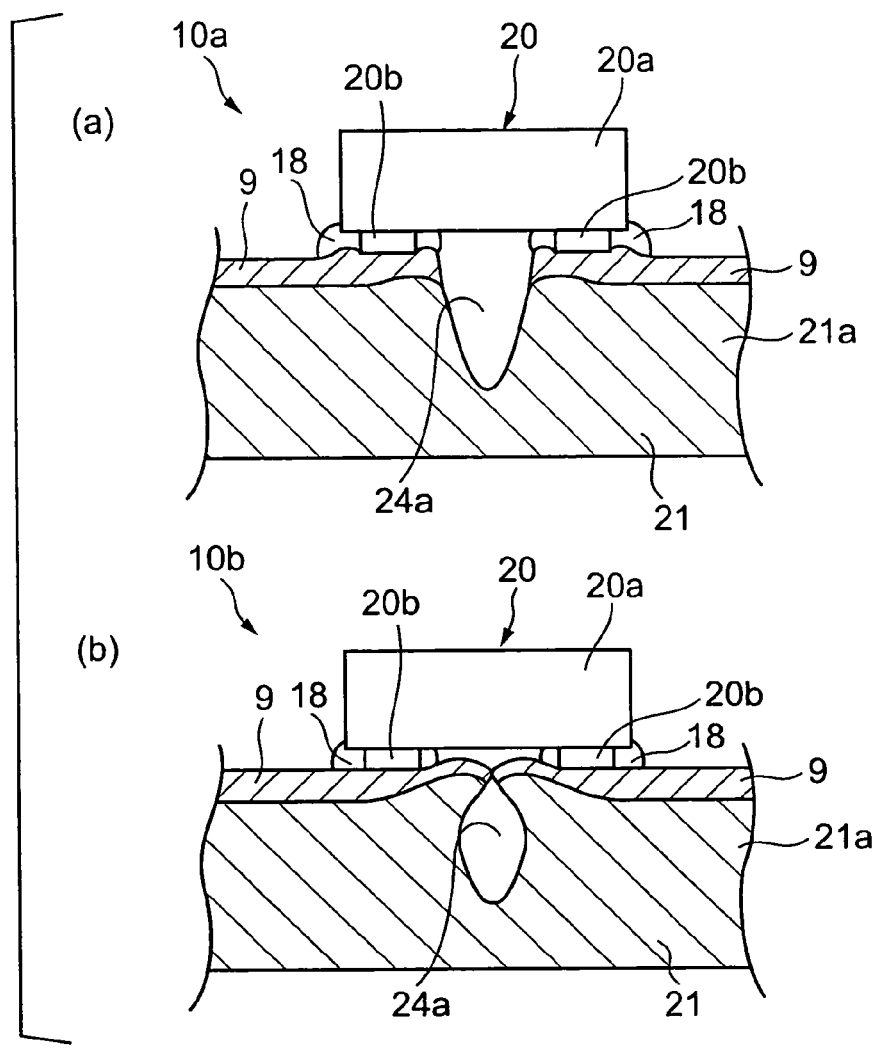
FIGS. 13(a) and 13(b) are sectional views, each illustrating an IC tag.

In the case where the electrical conductor 22 is divided into two conductors by the cutter 42, the slit 24a is formed to have a V-shaped cross section as shown in FIG. 12, whereby occurrence of remnants can be prevented and a simple apparatus construction can be obtained. As a result, as shown in FIG. 13(a), the finally obtained IC tag 10a includes the non-conductive sheet 21, the pair of extension electrodes 9, 9 formed on the non-conductive sheet 12 and spaced apart from each other across the slit 24a, and the IC chip 20 electrically connected with the extension electrodes 9, wherein the slit 24a has a V-shaped cross section.

However, when the electrical conductor 22 is divided by the cutter 42, as shown in FIG. 12, the cut electrical conductors 22 and the non-conductive sheet 21 can be slightly bulged (approximately 10 µm) around the slit 24a. Further, in the case where the IC chip 20 is arranged (mounted) on the sheet 21a with electrical conductors and the IC chip is then pressed by a fixing means against the sheet 21a with electrical conductors, depending on the shape or size of the IC chip 20, inconvenience such that the IC chip 20 can not be stabilized on the electrical conductors 22 may occur. Additionally, if the IC chip 20 is unduly pressed against the electrical conductors, or if the position in which the IC chip 20 is arranged (mounted) on the electrical conductors 22 is inaccurate, the bulging portions 21c (FIG. 12) are pressed by the electrodes 20b of the IC chip 20, so that these bulging portions 21c of the respective electrical conductors 22 may be deformed toward the slit 24a to contact with each other (FIG. 13(b)). Furthermore, in order not to contact the pair of electrical conductors 22 with each other, or because of a lengthy distance between the electrodes 20b of the IC chip 20 used, the width of the slit 24a should be sometimes enlarged (for example, up to 250 µm) correspondingly. In addition, in the case of forming such a slit 24a by the cutter 42, the cutting amount of the cutter 42 should be increased, and with the increase of amount, the thickness of the non-conductive sheet 21 should be enlarged (for example, 50 µm or greater), inevitably.

In view of merits and demerits upon forming the slit 24a by the cutter 42, the method of forming the slit 24a or even the method of forming the sheet 21a with electrical conductors itself may be modified as needed.

Now, alternative examples of the method of forming the slit 24a or the method of forming the sheet 21a with electrical conductors will be explained with reference to FIG. 11 and FIGS. 14 through 20. It is noted that like parts in the embodiment described above and its variations are denoted with like reference numerals, and their repetitive details will be omitted here.

(First Variation)

Figure 14:
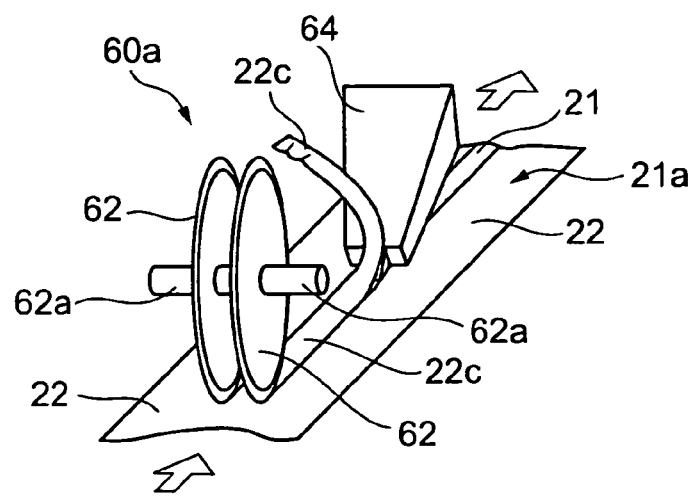
FIG. 14 is a diagram illustrating a variation of the method of forming a slit.
Figure 15:
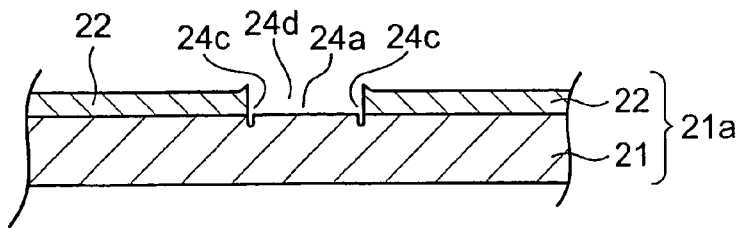
FIG. 15 is a sectional view illustrating a sheet with electrical conductors.
Figure 16:
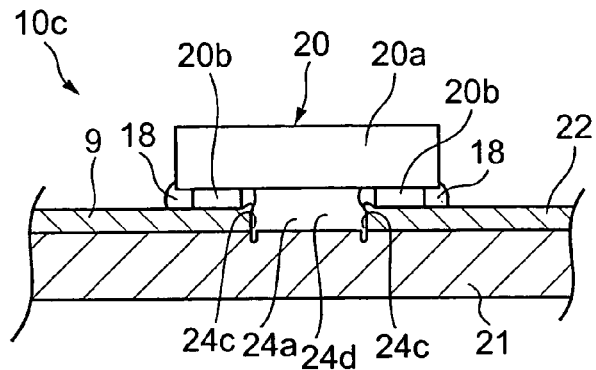
FIG. 16 is a sectional view illustrating an IC tag.

FIG. 14 illustrates a variation of the method of forming the slit 24a. In FIG. 14, the left lower side designates the upstream side, wherein the electrical conductor 22 is carried from the left lower side to the right upper side. FIG. 15 shows a cross section of the sheet 21a with electrical conductors by the variation of the method, and FIG. 16 shows a cross section of an IC tag 10c obtained by the variation.

As shown in FIG. 14, in this variation, a slit forming means 60a includes a pair of blades 62, a scraper 64 disposed on the downstream side of the blades 62, and a remnant-collecting portion (not shown). Each blade 62 comprises a rotatable cutter, and is rotatably supported by a blade supporting portion (not shown) about a shaft 62a which is parallel with the width direction of the electrical conductor 22 to be fed. The pair of blades 62 are spaced apart from each other, by the width of the slit 24a to be formed, along the width direction of the electrical conductor 22. The scraper 64 is supported by a scraper supporting portion (not shown), in a position corresponding to a space between the blades 62 along the width direction of the electrical conductor 22 and shifted toward the downstream along the feed direction of the electrical conductor 22.

Figure 18:
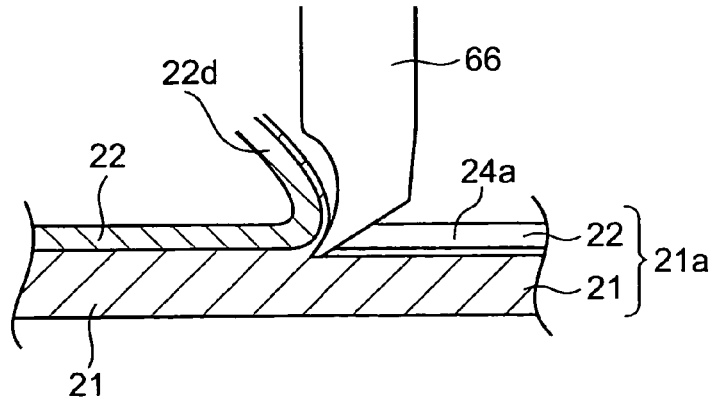
FIG. 18 is a diagram illustrating another variation of the method of forming a slit.

Upon feeding the non-conductive sheet 21 on which the electrical conductor 22 is laminated toward the slit forming means 60a, the pair of blades 62 cut into the laminated material form the side of the electrical conductor 22. The cutting manner of the blades 62 in this case is the so-called half-cut, and thus the edges of the pair of blades 62 cut the electrical conductor 22 until reaching the non-conductive sheet 21, but do not extend through and divide the non-conductive sheet 21 (FIG. 15). With the feed of the non-conductive sheet 21 on which the electrical conductor 22 is laminated, the pair of blades 62 can divide the electrical conductor 22 supported on the non-conductive sheet 21 into three pieces while rotating about the shaft 62a (FIG. 14). Thereafter, due to the scraper 64 arranged on the downstream side of the pair of blades 62, an electrically conductive portion 22c (also referred to as remnants), fed between the pair of blades 62, of the electrical conductor 22 is scraped away and removed from the non-conductive sheet 21, thereby forming the slit 24a (FIG. 14). The removal of the conductive material due to the scraper 64 in this case may be performed by peeling only the electrical conductor portion 22c from the non-conductive sheet 21, or the electrically conductive portion 22c may be scraped away with a portion of the non-conductive sheet 21, as shown in FIG. 18.

The peeled electrically conductive portion 22c is collected in a remnant collecting portion (not shown). The penetrating amounts of the pair of blades 62 and the scraper 64 are controlled by a blade supporting portion and a scraper supporting portion, respectively.

As shown in FIG. 15, the so-formed slit 24a of the sheet 21a with electrical conductors includes a pair of notches 24c extending up to the non-conductive sheet 21, and a rectangular portion 24d having a generally rectangular cross section provided between the notches 24c. This configuration serves to control the electrical conductors 22 and non-conductive sheet 21 not to be bulged conspicuously around the periphery of the slit 24a (even though they are bulged, the height of the bulged portion is 5 μm or less). The IC tag 10c finally obtained by using this method, as shown in FIG. 16, includes the non-conductive sheet 21, the pair of extension electrodes 9, 9 spaced apart from each other across the slit 24a, and the IC chip 20 connected with the extension electrodes 9, and further includes the pair of notches 24c between which the slit 24a extends up to the non-conductive sheet 21, and the rectangular portion 24d provided between the notches 24c, 24c and having a generally rectangular cross section. As shown in FIG. 16, in such an IC tag 10c, the IC chip 20 can be disposed stably on the electrical conductors 22, and any electrical continuity between the pair of electrical conductors 22 (extension electrodes 9) during production or use of the IC tag 10c can be prevented. That is to say, regardless of the size and shape of the IC chip 20, high grade IC tags 10c can be produced stably.

Because the pair of electrical conductors 22 (extension electrodes 9) can be prevented from being in an electrical connection, there is no need of forming the slit 24a into a large size. Even though there is some need to arrange the width of slit 24a into a relatively large size due to the size of the IC chip 20, the width of slit 24a can be enlarged without increasing the cutting amount, by controlling the cutting amount into the non-conductive sheet 21 due to the pair of blades 62 and the scraper 64. Accordingly, the thickness of the non-conductive sheet 21 can be reduced. Thus, the cost of materials can be decreased, thereby to reduce the production cost per IC tag 10c.

In this variation, while an example in which the pair of blades 62 are formed of rotatable cutters has been disclosed, the blades are not limited to this aspect provided that they can divide the electrical conductor linearly. For example, the blades may be formed of a pair of flat plate cutters.

(Second Variation)

Figure 17:
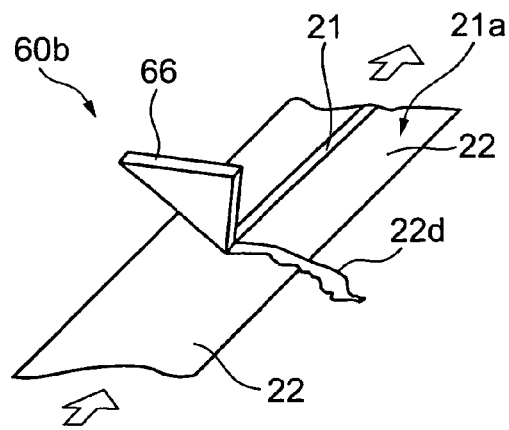
FIG. 17 is a diagram illustrating a variation of the method of forming a slit.

A second variation of the method of forming the slit 24a is shown in FIGS. 17 and 18. FIG. 17 is a perspective view showing the second variation of the method of forming the slit 24a, and FIG. 18 is a cross section taken along the longitudinal direction showing the second variation of the method of forming the slit 24a, and the sheet 21a with electrical conductors, which is prepared by the second variation of the method of forming the slit 24a.

As shown in FIGS. 17 and 18, in this embodiment, a slit forming apparatus 60b includes a cutting tool 66 for lathing, a tool supporting portion (not shown) for holding the cutting tool 66 on the side of electrical conductor 22 of the non-conducting sheet 21 on which the electrical conductor is laminated, and a remnant collecting portion (not shown). The quality of material of the cutting tool 66 is not limited in particular, but, for example, diamond can be used as the material.

When the non-conductive sheet 21 on which the electrical conductor 22 is laminated is fed toward the slit forming apparatus 60b, the cutting tool 66 cuts the electrical conductor 22 from above. The cutting manner of the cutting tool 66 in this case is the so-called half-cut, and thus the edge of the cutting tool 66 cuts the electrical conductor 22 until reaching the non-conductive sheet 21, but do not extend through the sheet 21 (FIG. 18). With the feed of the non-conductive sheet 21 on which the electrical conductor 22 is laminated, a central portion 22d (also referred to as a cut remnant) in the width direction of the electrical conductor 22 is scraped off by the cutting tool 66, thereby forming the slit 24a (FIG. 18). The scraped-off cut remnant 22d is collected in a remnant collecting portion (not shown). The cutting amount of the cutting tool 66 is controlled by the cutting tool supporting portion.

According to this variation, the same effect can be obtained as in the first variation described above of the method of forming the slit 24a. That is to say, since this configuration can serve to control the electrical conductors 22 and non-conductive sheet 21 not to be bulged conspicuously around the slit 24a, the IC chip 20 can be disposed stably on the electrical conductors 22, and any occurrence of electrical continuity between the pair of electrical conductors 22 (extension electrodes 9) during production or use of the IC tag 10 can be prevented. The thickness of the non-conductive sheet 21 can be reduced, thereby decreasing the cost of materials and reducing the production cost per IC tag 10.

The finally obtained IC tag 10a, as shown in FIG. 13(a), includes the non-conductive sheet 21, the pair of extension electrodes 9, 9 spaced apart from each other across the slit 24a, and the IC chip 20 electrically connected with the extension electrodes 9, wherein the slit 24a has a generally V-shaped cross section.
(Third Variation)

Figure 19:
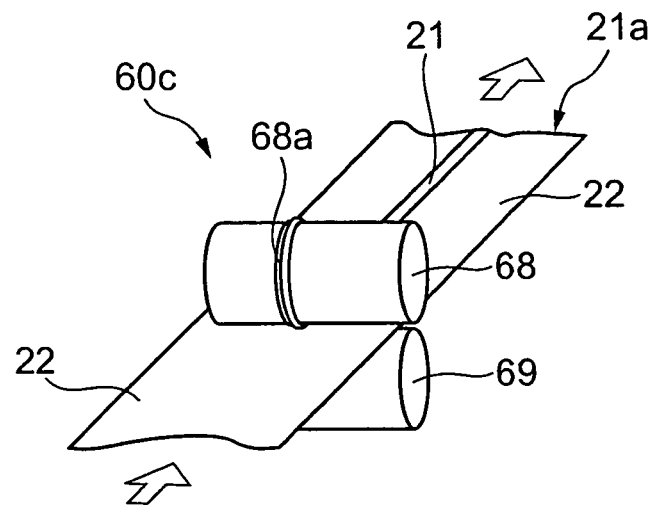
FIG. 19 is a diagram illustrating another variation of the method of forming a slit.
Figure 20:
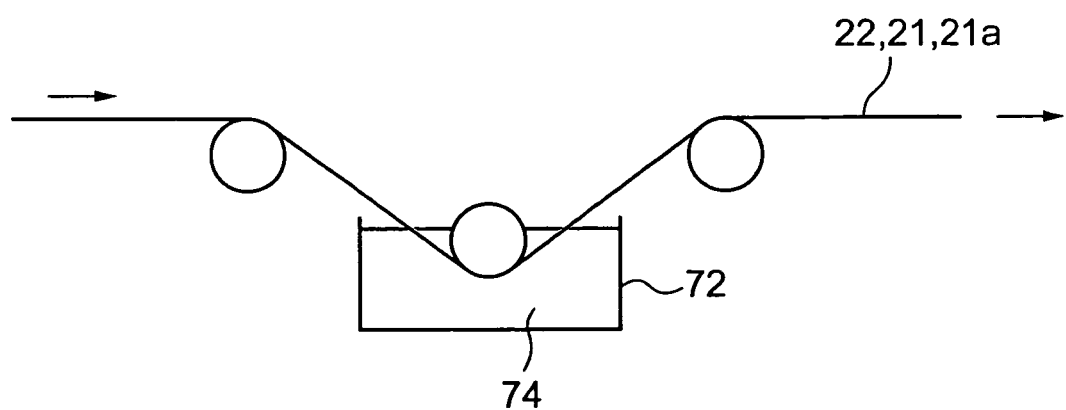
FIG. 20 is a diagram illustrating still another variation of the method of forming a slit.

FIGS. 19 and 20 show a third variation of the method of forming the slit 24a, respectively. FIG. 19 is a perspective view showing the third variation of the method of forming the slit 24a, and FIG. 20 is a cross section showing the third variation of the method of forming the slit 24a.

As shown in FIGS. 19 and 20, in this embodiment, a slit forming apparatus 60c includes a roller 68 which is rotatably held about a shaft extending parallel to the width direction of the non-conductive sheet 21 and has a circumferential blade 68a at a generally central portion of its circumferential face, and a supporting body 69 located facing the roller 68. In this embodiment, the supporting body 69 is composed of a supporting roller which is rotatable about a shaft parallel to the rotation axis of the roller 68.

In this variation, between the roller 68 and the supporting body 69, the non-conductive sheet 21 on which the electrical conductor 22 is laminated is fed. In this case, the electrical conductor 22 is fed so as to face the roller 68, and the circumferential blade 68a cuts the electrical conductor 22 up to the non-conductive sheet 21. This cutting manner of the circumferential blade 68a is the so-called half cut, and thus the edge of the circumferential blade 68a cut the electrical conductor 22 until reaching the non-conductive sheet 21, but do not extend through the sheet 21 (FIG. 20). In this way, the slit 24a is formed into the electrical conductor 22 by cutting with the circumferential blade 69a.

At this time, as described above, the electrical conductor 22 and the non-conductive sheet 21 tend to be bulged around the periphery of the slit 24a. However, the non-conductive sheet 21, on which the electrical conductor 22 is laminated, is interposed between the roller 68 and the supporting body 69, and the periphery of the portions formed by division due to the circumferential blade 68 is pressed from above and below by the roller 68 and the supporting body 69, thereby restricting the formation of bulged portion 21c (FIG. 12).

As a result, as shown in FIG. 13(a), the finally obtained IC tag 10a includes the non-conductive sheet 21, the pair of extension electrodes 9, 9 formed on the non-conductive sheet 12 and spaced apart from each other across the slit 24a, and the IC chip 20 electrically connected with the extension electrodes 9, wherein the slit 24a has a V-shaped cross section.

According to this variation, the same effect can be obtained as in the first and second variations described above of the method of forming the slit 24a. That is to say, this configuration can serve to control the electrical conductors 22 and non-conductive sheet 21 not to be bulged conspicuously around the slit 24a, the IC chip 20 can be disposed stably on the electrical conductors 22, and any occurrence of electrical continuity between the pair of electrical conductors 22 (extension electrodes 9) during production or use of the IC tag 10 can be prevented. Thus, the thickness of the non-conductive sheet 21 can be reduced, thereby decreasing the cost of materials and reducing the production cost per IC tag 10.

Also, according to this embodiment, the electrical conductor 22 can be cut without producing any remnants. That is to say, the need of the remnant collecting portion as in the first and second variations can be eliminated.

In this variation, while an example which comprises the supporting body 69 has been disclosed, such an apparatus is not limited to this aspect, provided that the non-conductive sheet 21, on which the electrical conductor 22 is laminated, can be pressed between the roller 68 and any appropriate alternative means. For example, the supporting body 69 may be formed of a supporting table, such as a surface plate.
(Fourth Variation)

In this embodiment, while an example has been disclosed, in which the electrical conductor 22 is laminated on the non-conductive sheet 21, and the slit 24a is formed by the cutter 42 or the like in the electrical conductor 22, so as to prepare the sheet 21a with electrical conductors, which includes the non-conductive sheet 21 extending in a band-like fashion, and the pair of electrical conductors 22 provided on the non-conductive sheet 21, extending in the feed direction of the non-conductive sheet 21, and spaced apart from each other, the example is not limited to this aspect. For example, a pair of electrical conductors extending in a band-like fashion which have been formed in advance may be laminated on the non-conductive sheet 21a.
(Fifth Variation)

By printing an electrically conductive ink on the non-conductive sheet 21 by using a printer, by etching a metal foil by using an etching apparatus, or by transferring a metal foil onto the non-conductive sheet 21 by using a transferring apparatus, the sheet 21a with electrical conductors may be prepared. In this case, as shown in FIG. 11, a pair of electrical conductors 22a spaced apart from each other in the width direction of the non-conductive sheet 21 extending in a band-like fashion may be arranged in large numbers continuously in the feed direction of the non-conductive sheet 21.

By using the sheet 21a with electrical conductors, which includes the non-conductive sheet 21 extending in a band-like fashion and multiple pairs of electrical conductors 22a arranged along the feed direction of the non-conductive sheet 21, the sheet 1 with IC tags may be formed and inspected in accordance with the method described above. In this case, by fixing IC tags 10 onto the electrical conductors 22a, the sheet 1 with IC tags can be obtained, in which IC tags 10 each comprising the pair of extension electrodes 9 and an IC chip 20 are formed in large numbers, on the non-conductive sheet 21 extending in a band-like fashion, in succession, along the feed direction of the sheet 21. Thus, without cutting the electrical conductors 22 by segmenting the sheet 1 with IC tags using the non-conductive blade 46, each IC tag 10 can be inspected while being arranged on the sheet 1 with IC tags.

Figure 11:
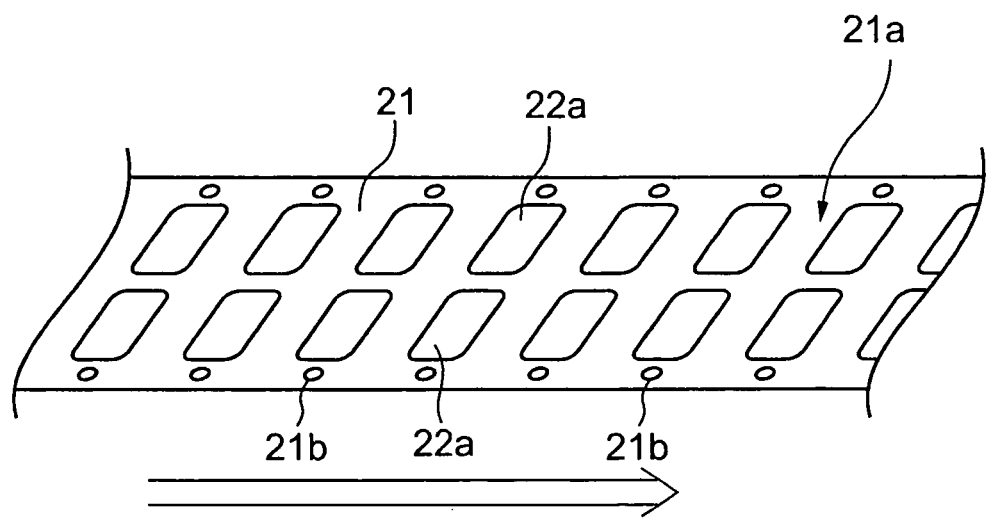
FIG. 11 is a perspective view showing a variation of the sheet with electrical conductors.

In FIG. 11, through openings 21b are formed in the vicinity of both peripheries, opposed to each other in the width direction at an equal interval, of the sheet 21a with electrical conductors. By engaging the through openings 21b and projections provided to a roller or the like for use in feed of the sheet 21a with electrical conductors, any offset in the width direction of the sheet 21a with electrical conductors and sheet 1 with IC tags can be prevented. Since there is no occurrence of slipping between a roller or the like and the sheet 21a with electrical conductors, the sheet 21a with electrical conductors can be moved forward by a predetermined amount. Accordingly, based on the through openings 21b, the positioning of the sheet 21a with electrical conductors and the sheet 1 with IC tags both in the width direction and the feed direction can be established. As such, it becomes possible to arrange IC chips 20 with high precision as well as to perform the inspection mentioned above with high accuracy. Of course, such through openings 21b can be used not only for the variation of the sheet 21a with electrical conductors, as shown in FIG. 11, but also for the sheets 21a with electrical conductors, which have been described previously with reference to FIGS. 1 through 8.

<Variation in which a Degreasing Step or Oxide-Film Removing Step is Added>

In this embodiment, while an example, in which the adhesive 18 is provided after preparation of the sheet 21*a* with electrical conductors, and IC chips 20 are then arranged on the portions provided with the adhesive, has been described, this example is not limited to this aspect. For example, a step may be further provided, in which the portions where the electrical conductors 22 are provided, more specifically the portions where IC chips 20 are to be arranged on the electrical conductors are degreased before arranging the IC chips 20.

Now, such a variation will be described with reference to FIGS. 21 and 22. It is noted that like parts in the embodiments described above and their variations are denoted with like reference numerals, and their repetitive detailed description will be omitted here.

Figure 21:
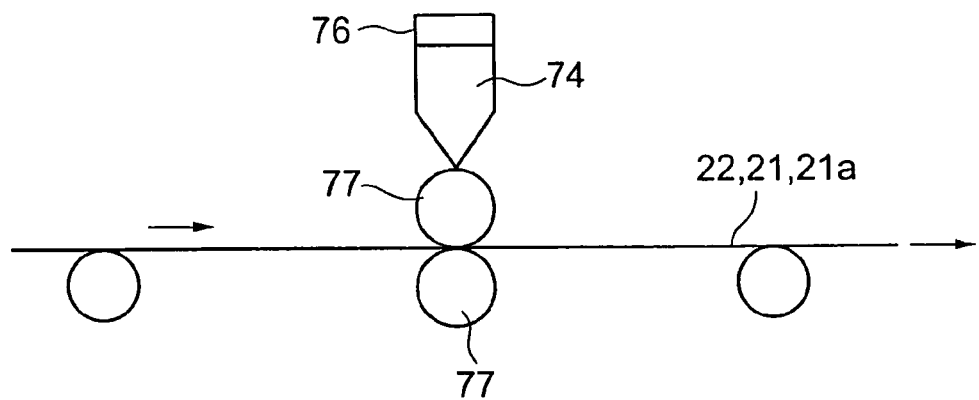
FIG. 21 is a diagram illustrating a degreasing step for the electrical conductors or an oxide film removing step for the electrical conductors.
Figure 22:
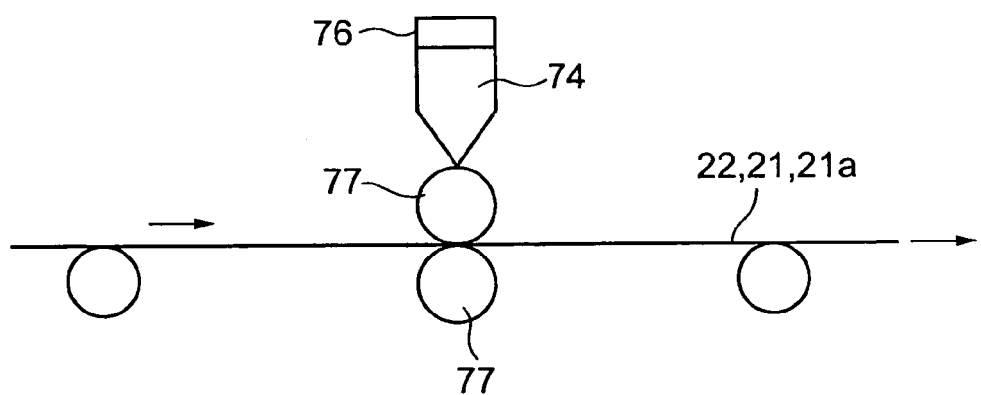
FIG. 22 is a diagram illustrating a degreasing step for the electrical conductors or an oxide film removing step for the electrical conductors.

The degreasing step for the electrical-conductors 22 can be performed by dipping and moving the electrical conductors 22, the non-conductive sheet 21 on which the electrical conductors 22 are laminated, or the sheet 21*a* with electrical conductors, through a tank filled with a chemical agent 74, as shown in FIG. 21, or by carrying it between washing rollers 77 soaked with the chemical agent 74 supplied from a dispenser 76 or the like, as shown in FIG. 22. In this case, as the chemical agent 74, for example, ethyl alcohol or acetone can be used.

By degreasing the electrical conductors 22, the electrical resistance between the electrodes 20*b* of each IC chip 20 and the electrical conductors 22 (extension electrodes 9) after the electrical connection between the electrodes 20*b* of each IC chip 20 and the electrical conductors 22 can be reduced, as well as, variation of the electrical resistance can be decreased. Thus, the performance of the finally obtained IC tags 10 can be enhanced as well as variation of quality of the IC tags 10 can be reduced.

In place of degreasing the electrical conductors 22, or in addition to the degreasing, a step may be provided, in which oxide films formed on the portions where the electrical conductors 22 are provided, more specifically the portions where IC chips 20 are to be arranged on the electrical conductors are removed prior to the step of arranging IC chips 20. Thus, as compared with the case of providing the degreasing step, the electrical resistance between the electrodes 20*b* of each IC chip 20 and the electrical conductors 22 (extension electrodes 9) can be further reduced, as well as, the variation of the electrical resistance can be more decreased. The oxide films on the electrical conductors 22 or the like can be removed by using an alkali-type chemical agent as the chemical agent 74 in the method (FIGS. 21 and 22) for degreasing as mentioned above.

<Variation of the Method of Fixing and Electrically Connecting IC Chips 20>

In this embodiment, while an example, in which the thermo-compression bonding means 26, 27 are used as a fixing means so as to fix IC chips to the electrical conductors 22 of the sheet 21*a* with electrical conductors as well as to establish an electrical connection (electrical continuity) between the electrodes 20*b* of IC chips 20 and the electrical conductors 22, has been disclosed, this variation is not limited to this aspect.

Figure 23:
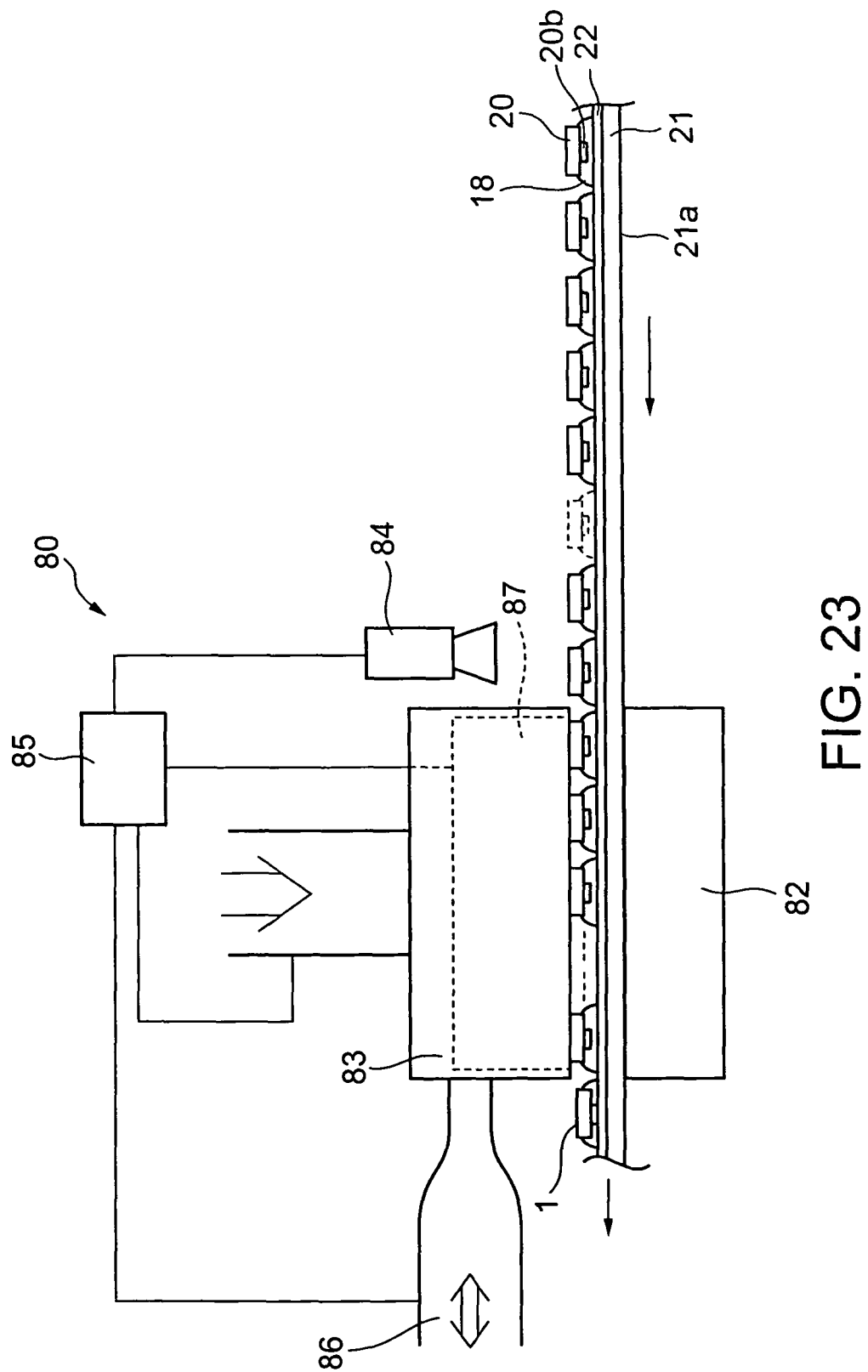
FIG. 23 is a side view showing a variation of the fixing method for IC chips.

Next, a variation of the method of fixing and electrically connecting IC chips 20 will be described with reference to FIGS. 23 and 24. FIG. 23 is a side view showing a variation of the method of fixing IC chips 20. FIG. 23 illustrates a fixing apparatus (fixing means) 80 for fixing each IC chip 20 to the electrical conductors 22 as well as for electrically connecting the electrodes 20*b* of each IC chip 20 with the electrical conductors 22. In FIG. 23, the right side is the upstream side, thus the electrical conductors 22 are fed from right to left. Again, like parts in the embodiments described above and their variations are denoted with like reference numerals, and their repetitive details will be omitted here.

As shown in FIG. 23, the fixing apparatus 80 comprises a supporting unit 82 for supporting the electrical conductors 22 (or the sheet 21*a* with electrical conductors), a pressing unit 83 arranged to face the supporting unit 82, movable toward the supporting unit 82, and adapted to press IC chips 20 against the electrical conductors 22, a measuring instrument 84 for measuring the number of IC chips 20 arranged on the electrical conductors 22 of the sheet 21*a* with electrical conductors to be fed to the supporting unit 82, a control unit 85 adapted to receive a signal concerning measurement results from the measuring instrument 84 and adjust (control) the pressing force of the pressing unit 83 based on the received signal, an ultrasonic horn 86 connected with the pressing unit 83 and adapted to provide ultrasonic vibration to the pressing unit 83, and a heating mechanism 87 for heating the pressing unit 83.

Among the above elements, the measuring instrument 84 is composed of a CCD camera, a photoelectric-sensor (photoelectric conversion element) or the like. The measuring instrument 84 is arranged on the upstream side of the supporting unit 82 and the pressing unit 83, and is adapted to optionally detect the presence of IC chips 20 on the electrical conductors 22. In this way, a signal concerning a detection result is transmitted from the measuring instrument 84 to the control unit 85, whereby the control unit 85 can grasp the number of IC chips 20 on the electrical conductors 22 supported on the supporting unit 82 to be fed.

Next, a method of fixing IC chips 20 to the electrical conductors 22 as well as electrically connecting the electrodes 20*b* of IC chips 20 with the electrical conductors 22, by using the fixing apparatus 80, will be described.

In a first step, the electrical conductors 22, each of which extends in a band-like fashion and on which IC chips 20 are arranged in large numbers through the adhesive 18 such that the electrodes 20*b* of the IC chip 20 face the electrical conductors 22, are prepared and fed to the fixing apparatus 80. In this variation, similar to the previously described embodiments, the sheet 21*a* with electrical conductors, on which multiple IC chips 20 are arranged through the anisotropic conductive adhesive 18, passes below the measuring instrument 84 of the fixing apparatus 80, and is fed to a space between the pressing unit 83 and the supporting unit 82. Also, the anisotropic conductive adhesive 18 includes a binder formed from a thermosetting resin.

Next, in a second step, the feed of the sheet 21*a* with electrical conductors is once stopped. Then, while the pressing force is increased gradually up to a predetermined pressing force, multiple IC chips 20 arranged between the supporting unit 82 and the pressing unit 83 are pressed against the electrical conductors 22, and at the same time, ultrasonic vibration is applied to the multiple IC chips 20. Simultaneously, the adhesive 18 disposed between the multiple IC chips 20 and the electrical conductors 22 is heated. As such, while the adhesive 18 is heated, the IC chips 20 are pressed against the electrical conductors 22 while being ultrasonically vibrated. The relationship between the pressing force applied to each IC chip 20, state of ultrasonic vibration, and heating temperature, at this time, is shown in FIG. 24. It is noted that the second step is continued for about 0.01 to 2.0 seconds.

The force for pressing IC chips 20 against the electrical conductors 22 is provided due to movement of the pressing unit 83 toward the supporting unit 82. As shown in FIG. 24, in this variation, each of the IC chips 20 starts to be pressed with first pressing force for one chip. The pressing force is then gradually increased over time. Finally, each of the IC chips 20 is pressed with second pressing force for one chip.

The pressing force is adjusted (controlled) by the control unit 85, corresponding to the number of IC chips 20 arranged between the supporting unit 82 and the pressing unit 83. The number of IC chips 20 on the electrical conductors 22 is measured by the measuring instrument 84 disposed on the upstream side of the pressing unit 83 and the supporting unit 82, and the control unit 85 adjusts (controls) a transfer amount of the pressing unit 82 based on the measurement results provided by the measuring instrument 84. As a result, the pressing force is adjusted. While the pressing force can be varied appropriately depending on types and characteristics of the IC chips 20 and adhesive 18 to be used, it is preferred that the first pressing force described above is in the range of approximately 0 g to 500 g for one IC chip, and the second pressing force is in the range of approximately 200 g to 800 g.

The ultrasonic vibration is applied to each IC chip 20 due to the ultrasonic horn 86 adapted to drive the pressing unit 83 to be vibrated. As shown in FIG. 24, the ultrasonic vibration is provided to each IC chip 20 over the second step. The number of vibrations is in the range of 30,000 to 70,000, per second. It is noted that the ultrasonic vibration is a type of reciprocating vibration applied in a plane parallel to the electrical conductors 22 extending in a band-like fashion, and its direction is preferably the same as the feed direction of the sheet 21*a* with electrical conductors, i.e., the direction along the slit 24*a* dividing the electrical conductors 22 (FIG. 23). This is because damage of the electrical conductors 22, which would be produced by IC chips 20 ultrasonically vibrated in the other directions, can be avoided, and as such preventing contact between the pair of electrical conductors 22.

When the heating mechanism 87 heats the pressing unit 83, the adhesive 18 is indirectly heated through the pressing unit 83 and each IC chip 20 contacting with the pressing unit 83. The heating temperature (first temperature) of the heating mechanism 87 at this time is in the range of about 50° C. to 200° C.

In such a second step, the electrodes 20*b* of each IC chip 20 are contacted with the electrical conductors 22 as well as vibrated relative to the electrical conductors 22. Accordingly, some friction occurs between the electrodes 20*b* of each IC chip 20 and the electrical conductors 22, thus removing oxide films formed on the electrical conductors 22. The pressing force at this time is determined by the control unit 85 corresponding to the number of IC chips 20 being pressed by the pressing unit 83, such that strength of the pressing force to be applied to each IC chip will be adequate for the type of IC chip 20 or characteristics of the adhesive 18. If some IC chips 20 would lack on the electrical conductors 22, the pressing force to be applied to each IC chip would be unduly strong, and as such damaging (or breaking) IC chips. Or, sometimes, the oxide films could not be removed due to unduly weak pressing force. However, in accordance with this embodiment, such inconveniences can be avoided by the control of the pressing force due to the control unit 85.

As stated above, the anisotropic conductive adhesive 18 comprising a thermosetting resin is interposed between each IC chip 20 and the electrical conductors 22. Accordingly, the anisotropic conductive adhesive 18 begins to be cured when heated by the heating mechanism 87. However, because of a low temperature and short heating time (duration of the second step) due to the heating mechanism 87, the anisotropic conductive adhesive 18 will not reach a completely cured state, and thus each IC chip 20 is fixed, only temporarily, to the electrical conductors 22. Therefore, influence on the vibration of each IC chip 20 can also be avoided.

Next, in a third step, the vibration of the pressing unit 83 due to the ultrasonic horn 86 is stopped, the pressing unit 83 presses continuously multiple IC chips 20 against the electrical conductors 22 with the second pressing force for one IC chip. At the same time, the heating mechanism 87 heats the pressing unit 83 at a second temperature higher than the first temperature in the second step, and hence the adhesive 18 is also heated at a temperature higher than that in the second step. The heating temperature (second temperature) of the heating mechanism 87 in the third step is preferably in the range of about 150° C. to 300° C. The third step is continued for about 1.0 to 20.0 seconds (FIG. 24).

Also in the third step, as described above, the pressing force of the pressing unit 83 is controlled by the control unit 85, corresponding to the number of the IC chips 20 placed between the supporting unit 82 and the pressing unit 83.

In the third step, the adhesive 18 including a binder comprising a thermosetting resin is completely cured, and thus the IC chips 20 are securely fixed onto the electrical conductors 22. Since the adhesive 18 is pre-heated at a temperature of 50° C. to 200° C. in the second step described above, the heating time required for the complete cure in the third step can be reduced, thereby enhancing the production efficiency.

At this time, the electrodes 20*b* of each IC chip 20 is in contact with the electrical conductors 22, and thus electrical connection between the electrodes 20*b* of each IC chip 20 and the electrical conductors 22 can be securely provided. Since the oxide films formed on the electrical conductors 22 to be opposed to the electrodes 20*b* of each IC chip 20 have been removed in the second step, the electrical resistance between the electrodes 20*b* of each IC chip 20 and the electrical conductors 22 (extension electrodes 9) can be reduced, as well as, variation of the electrical resistance can be decreased. Thus, the performance of the finally obtained IC tags 10 can be enhanced as well as variation of quality of the IC tags 10 can be reduced.

The pressing force provided by the pressing unit 83 is determined by the control unit 85, corresponding to the number of IC chips 20 being pressed by the pressing unit 83, such that strength of the pressing force to be applied for each IC chip will be adequate for the type of IC chip 20 or characteristics of the adhesive 18. If some IC chips 20 would lack on the electrical conductors 22, the pressing force to be applied for each IC chip 20 would be unduly strong, and as such damaging (or breaking) IC chips. Or, sometimes, due to unduly weak pressing force, the fixing of IC chips 20 could not be stabilized, or otherwise the electrical continuity between IC chips 20 and the electrical conductors 22 could not be securely established. However, in accordance with this embodiment, such inconveniences can be avoided by the adjustment of the pressing force due to the control unit 85.

In this way, IC chips 20 can be fixed and electrically connected to the electrical conductors 22 of the sheet 21*a* with electrical conductors, and as such the sheet 1 with IC tags can be produced and then fed toward the downstream from the fixing apparatus 80. At the same time, new electrical conductors 22 on which a plurality of (multiple) IC chips 20 are arranged through the adhesive 18 are fed again into the fixing apparatus 80.

According to this variation, readily and efficiently, a plurality of IC chips can be fixed to the electrical conductors, as well as, electrodes of the plurality of IC chips can be electrically connected (i.e., in electrical continuity) with the electrical conductors. In addition, by providing ultrasonic vibration to the IC chip, the oxide films on the electrical conductors 22 can be broken or removed. Thus, the electrical resistance between each IC chip 20 and the electrical conductors 22 can be reduced, as well as, variation of the electrical resistance can be decreased. Accordingly, the performance of the finally obtained IC tags 10 can be enhanced as well as variation of quality of the IC tags 10 can be reduced.

The pressing force provided by the pressing unit 83 is controlled by the control unit 85, corresponding to the number of IC chips 20. Accordingly, a plurality of IC chips 20 can be fixed and electrically connected to the electrical conductors 22 accurately and securely at a time without damaging the IC chips 20, thereby enhancing the production efficiency and the acceptable rate of IC tags 10. This is significantly effective because all of the IC tags 10 can be obtained as good items even from both end portions of the sheet 1 with IC tags where the number of IC chips 20 to be provided into the fixing means (fixing apparatus 80) is often fluctuated. Thus, this variation enables reduction of cost in a small lot production applicable for various types of IC tags 10 as greatly needed today.

In the second step of this variation, while an example in which the pressing force of the pressing unit 83 is gradually increased up to a predetermined pressing force (second pressing force) has been disclosed, this example is not limited to this aspect. For example, as designated by two-dot chain lines in FIG. 24, a constant pressing force, for example, the first pressing force may also be applied between the first step and the second step. Such a case can facilitate the control of the fixing apparatus 80.

Additionally, in this variation, while an example in which oxide films on the electrical conductors 22 are removed by ultrasonic vibration given to each IC chip 20 has been disclosed, ultrasonic joining, i.e., metal-metal bonding may be provided between the electrodes 20b of each IC chip 20 and the electrical conductors 22 in the second step by adjusting the frequency, pressing force and duration of this step, applied to each IC chip 20. In this case, electrical connection between the electrodes 20b of each IC chip 20 and the electrical conductors 22 can be securely established. Also, electrical resistance between each IC chip 20 and the electrical conductors 22 can be further reduced, and variation of the electrical resistance can be more decreased. In the second step of this case, since the electrodes 20b of each IC chip 20 and electrical conductors 22 are in electrical connection, there is no need of heating the adhesive 18 while pressing the IC chip 20 against the electrical conductors 22 in the third step. That is to say, upon curing the adhesive 18 in the third step 3, since each IC chip 20 is already contacted with the electrical conductors 22 without need of further positively contacting the IC chip 20 with the electrical conductors 22, the adhesive 18 can be heated without requiring any pressing force in the third step, i.e., without need of pressing the IC chip 20 against the electrical conductors 22 in the third step. Alternatively, in the case where each IC chip 20 and the electrical conductors 22 are ultrasonically joined together, it is quite effective to gradually increase the pressing force applied to each IC chip 20 in the second step, as described above. In this case, each IC chip 20 is vibrated in a long vibrating stroke while being pressed with a low pressing force at an initial stage of the second step. Thereafter, the vibrating stroke is shortened with increase of the pressing force, and finally, each IC chip 20 is vibrated in a short vibrating stroke while being pressed with a high pressing force. Thus, at an initial stage, the oxide films in a wider range of the electrical conductors 22 can be removed, and at a final stage, metal-metal bonding can be securely provided between each IC chip 20 and the electrical conductors 22 due to localized frictional effect.

Moreover, in this variation, while an example in which the heating mechanism 87 is built in the pressing unit 83 to heat this pressing unit 83 has been disclosed, the construction is not limited to this aspect. For example, the heating mechanism 87 may be built in the supporting unit 82, or otherwise the heating mechanism 87 may be built both in the supporting unit 82 and the pressing unit 83.

Similar to the thermo-compression bonding machine 26 described above, the fixing apparatus 80 may be moved reciprocally along the feed direction of the electrical conductors 22. In such a case, since the fixing apparatus 80 can go forward in the feed direction upon fixing IC chips 20 (in the second step and the third step), there is no need of stopping movement of the electrical conductors 22 in the feed direction. Thus, the accumulators 38, 39 described above can be eliminated, or otherwise the accumulation amount in the accumulators 38, 39 can be reduced.

Also in this variation, rather than using the anisotropic conductive adhesive, another type of conductive adhesive or non-conductive adhesive may be utilized. By accurately controlling the pressing force of the pressing unit 83 due to the control unit 85, or by vibrating each IC chip 20 due to the ultrasonic horn 86, the electrodes 20b of each IC chip 20 can be securely contacted with the electrodes 22.

In this variation, and the embodiments and their variations previously disclosed, while an example in which each IC chip 20 is fixed to the electrical conductors 22 due to the fixing means 26, 27, 80, and the IC chip 20 is also electrically connected with the electrical conductors 22 in the same step has been disclosed, the fixing and connecting processes are not limited to this aspect. Of course, each IC chip 20 may be fixed to the electrical conductors 22 through the adhesive 18, and thereafter the electrodes 20b of the IC chip 20 may be electrically connected (or in electrical continuity) with the electrical conductors 22 due to a connecting means (e.g., a melting machine (a welding machine)) provided separately from the fixing means. That is to say, the fixing of the IC chip 20 onto the electrical conductors 22 and the electrical connection of the IC chip 20 to the electrical conductor 22 may be performed in separate steps, respectively.

<Variation of the Adhesive 18>

(Variation of the Coating Method)

In the embodiments described above, an example in which the adhesive 18 is provided on portions where IC chips 20 are to be arranged on the sheet 21a with electrical conductors, by using the means 25 for providing the adhesive, has been disclosed, the providing process is not limited to this aspect. For example, the face of each IC chip 20, which is fed from the IC chip feeding means 4, to be opposed to the sheet 21a with electrical conductors, may be provided with the adhesive 18, by using the means 25 for providing the adhesive, so as to arrange IC chips 20 each applied with the adhesive 18, on the sheet 21a with electrical conductors.

(Variation of the Type of Adhesive 18)

In the embodiments and their variations previously described, while an anisotropic conductive adhesive, usual conductive adhesive or non-conductive adhesive may be used as the adhesive 18, and the adhesive 18 may contain a thermosetting resin or thermoplastic resin, the type of adhesive 18 is not limited to them. For example, such an adhesive 18 may also be used that includes a UV curable resin or includes a UV curable resin as a main component.

As used herein, the term "UV curable resin" means an adhesive 18 which is cured when irradiated with UV light, and commonly, it can be cured within a time shorter than that required for curing thermosetting resins or thermoplastic resins. That is to say, when the adhesive 18 containing a UV curable resin is interposed between each IC chip 20 and the electrical conductors 22, by irradiating the resin with UV light, the IC chip 20 can be fixed onto the electrical conductors 22 in a shorter time, thereby enhancing the productivity of sheet 1 with IC tags.

In the step of fixing IC chips 20 onto the electrical conductors 22, as described with reference to FIGS. 3, 8 and 23, in the case of using an adhesive 18 including a thermosetting resin, the adhesive 18 is heated, or otherwise the adhesive 18 is cured by heating it while each IC chip 20 is pressed against the electrical conductors 22. However, when using the adhesive 18 including a UV curable resin, the adhesive 18 can be cured, by irradiating the adhesive 18 with UV light, or otherwise by irradiating the adhesive 18 with UV light while each IC chip 20 is pressed against the conductors 22, rather than by heating it.

Figure 25:
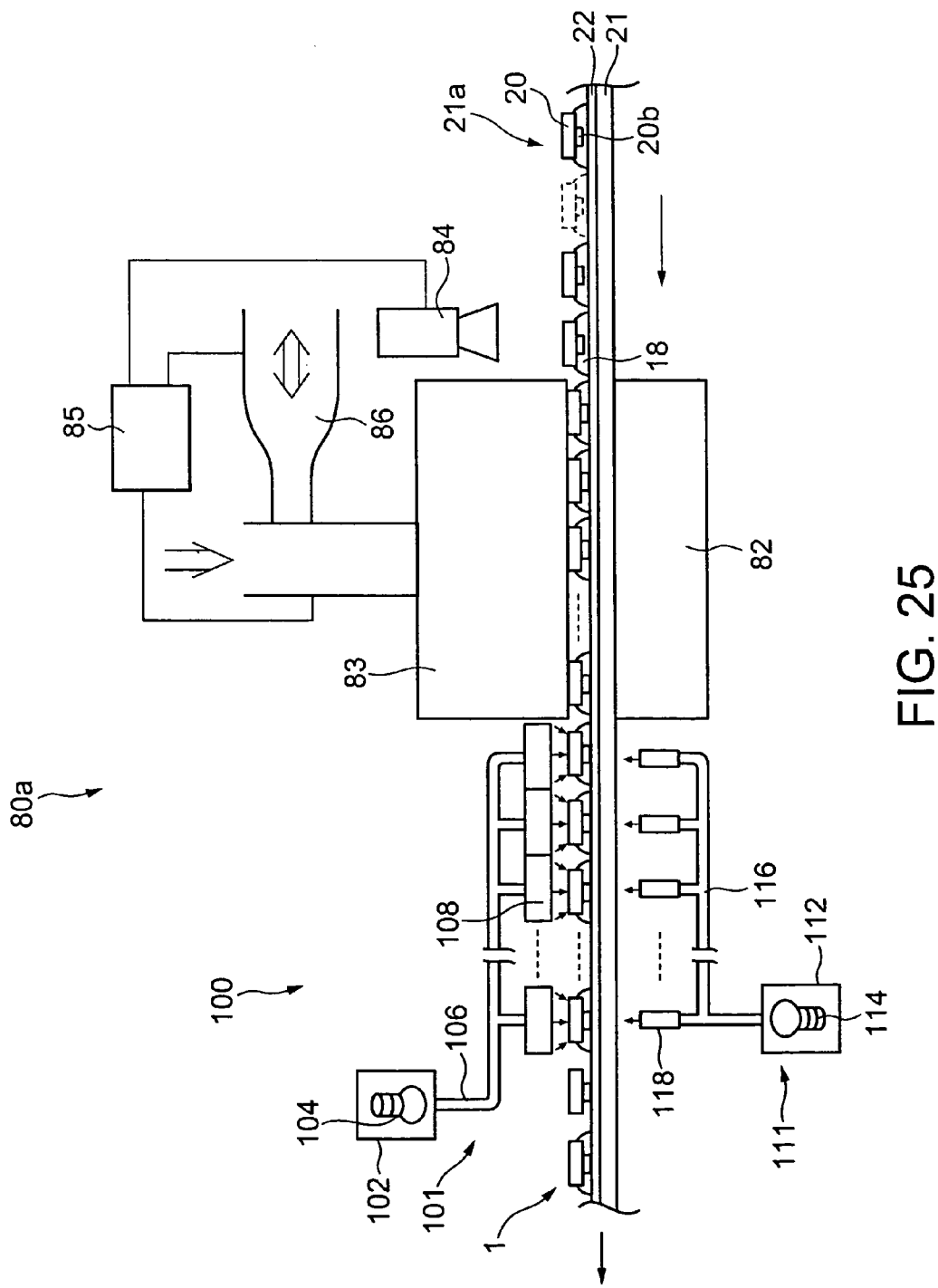
FIG. 25 is a side view illustrating a variation of the fixing method for IC chips.
Figure 26:
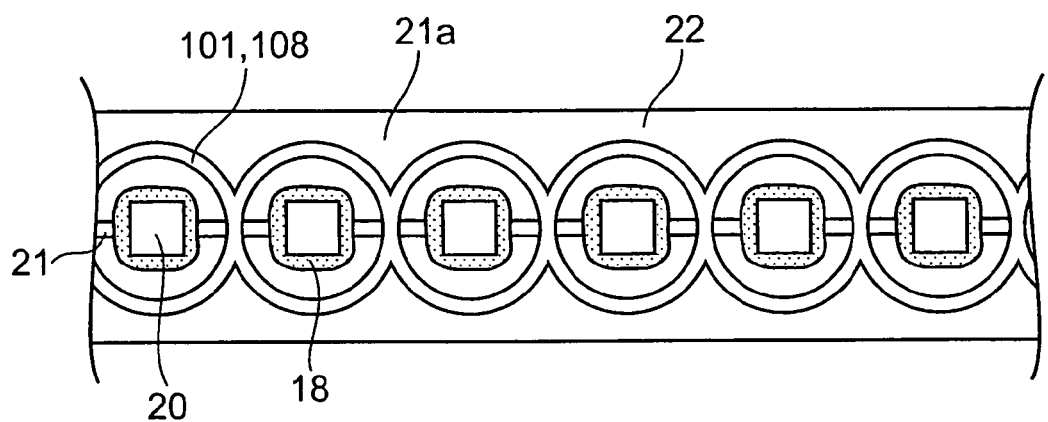
FIG. 26 is a top view showing a variation of the fixing method for IC chips.
Figure 27:
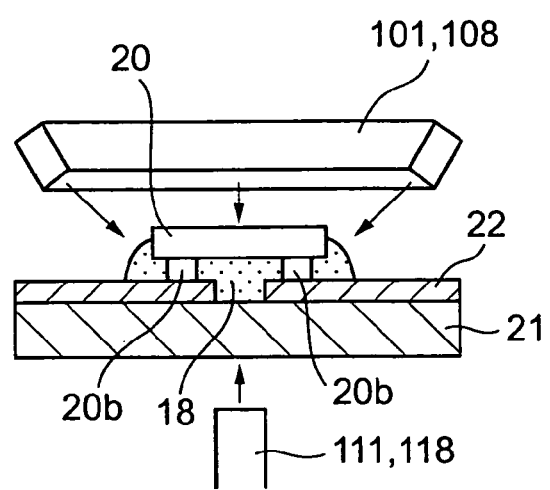
FIG. 27 is a sectional view showing a variation of the fixing method for IC chips.

Now, with reference to FIGS. 25 through 28, one example of the method of fixing each IC chip 20 onto the electrical conductors 22 as well as electrically connecting the electrodes 20b of each IC chip 20 with the electrical conductors 22, in the case where the adhesive 18 including a UV curable resin is fed from the means 25 for providing the adhesive, will be described. FIG. 25 is a side view illustrating a fixing method for IC chips 20, FIG. 26 is a top view showing the fixing method for IC chips 20, and FIG. 27 is a cross section taken along the width direction for showing the fixing method for IC chips 20. In FIGS. 25 to 27, a fixing apparatus (fixing means) 80a is shown, which is adapted to fix IC chips 20 onto the electrical conductors 22 as well as to electrically connect the electrodes 20b of each IC chip 20 with the electrical conductors 22. In FIG. 25, the right side expresses the upstream side, and hence the electrical conductors 22 are fed from right to left. It is noted that like parts in the embodiment and their variations described above, especially in the <Variation of the method of fixing and electrically connecting IC chips 20> described with reference to FIGS. 23 and 24, are denoted with like reference numerals, and their repetitive details will be omitted here.

As shown in FIG. 25, the fixing apparatus 80a comprises the supporting unit 82 for supporting the electrical conductors 22 (or the sheet 21a with electrical conductors), the pressing unit 83 arranged to face the supporting unit 82, and adapted to press IC chips 20 against the electrical conductors 22, the measuring instrument 84 for measuring the number of IC chips 20 arranged on the electrical conductors 22 of the sheet 21a with electrical conductors and which is fed to the supporting unit 82, the control unit 85 adapted to receive a signal concerning the measurement results from the measuring instrument 84 and adjust (control) the pressing force of the pressing unit 83 based on the received signal, the ultrasonic horn 86 connected with the pressing unit 83 and adapted to provide ultrasonic vibration to the pressing unit 83, and a UV light irradiating apparatus 100 which is disposed on the downstream side of the supporting unit 82 and the pressing unit 83 and adapted to irradiate the adhesive 18 interposed between each IC chip 20 and the electrical conductors 22 with UV light.

The UV light irradiating apparatus 100 includes an upper UV light irradiating unit 101 for irradiating the adhesive 18 with UV light from the side of the IC chips 20, and a lower UV light irradiating unit 111 for irradiating the adhesive 18 with UV light transmitted through the non-conductive sheet 21 from the side of the electrical conductors 22. Each UV light irradiating unit 101, 111 includes UV light source 102, 112 having UV lamp 104, 114, UV light guide units 106, 116 for guiding. UV light from the UV light source 102, 112, and UV light projecting units 108, 118 for projecting UV light toward adhesives 18 provided between the continuously arranged multiple IC chips 20 and the electrical conductors 22. In this variation, the UV light guide units 106, 116 are composed of an optical fiber, respectively.

As shown in FIG. 25, each UV light projecting unit 118 of the lower UV light irradiating unit 111 is arranged below each IC chip 20 on the electrical conductors and adapted to project UV light toward the adhesive 18 mainly located between the electrodes 20b of each IC chip 20 and generally provided between each IC chip 20 and electrically conductors 22.

On the other hand, the UV light projecting unit 108 of the upper UV light irradiating unit 101 is shaped such that multiple hollow rings are connected, and placed above the IC chips 20 at positions such that the center of each IC chip 20 becomes coincident with the center of the ring of each UV light irradiating unit 108 (FIG. 26). As shown in FIG. 27, each UV light projecting unit 108 of the upper UV light irradiating unit 101 is configured to project UV light to each IC chip 20 obliquely from above the IC chip 20, and the projected UV light is radiated on the adhesive 18 which is provided mainly on the electrical conductors 22 and also at the periphery of each IC chip 20. It is appreciated that in the case where the non-conductive sheet 21 comprises a UV light non-transparent material, the lower UV light irradiating unit 111 is not required.

Next, a method of fixing each IC chip 20 to the electrical conductors 22 by using the fixing apparatus 80a as well as of connecting the electrodes 20b of each IC chip 20 with the electrical conductors 22 will be explained.

In a first step, the electrical conductors 22 on which IC chips 20 are arranged through the adhesive 18 including a UV curable resin such that the electrodes 20b face the electrical conductors 22 are prepared and fed to the fixing apparatus 80a. In this variation, similar to the previously described embodiments, the sheet 21a with electrical conductors, on which multiple IC chips 20 are arranged through the adhesive 18, passes below the measuring instrument 84 of the fixing apparatus 80a, and is fed to a space between the pressing unit 83 and the supporting unit 82 (FIG. 25).

Figure 28:
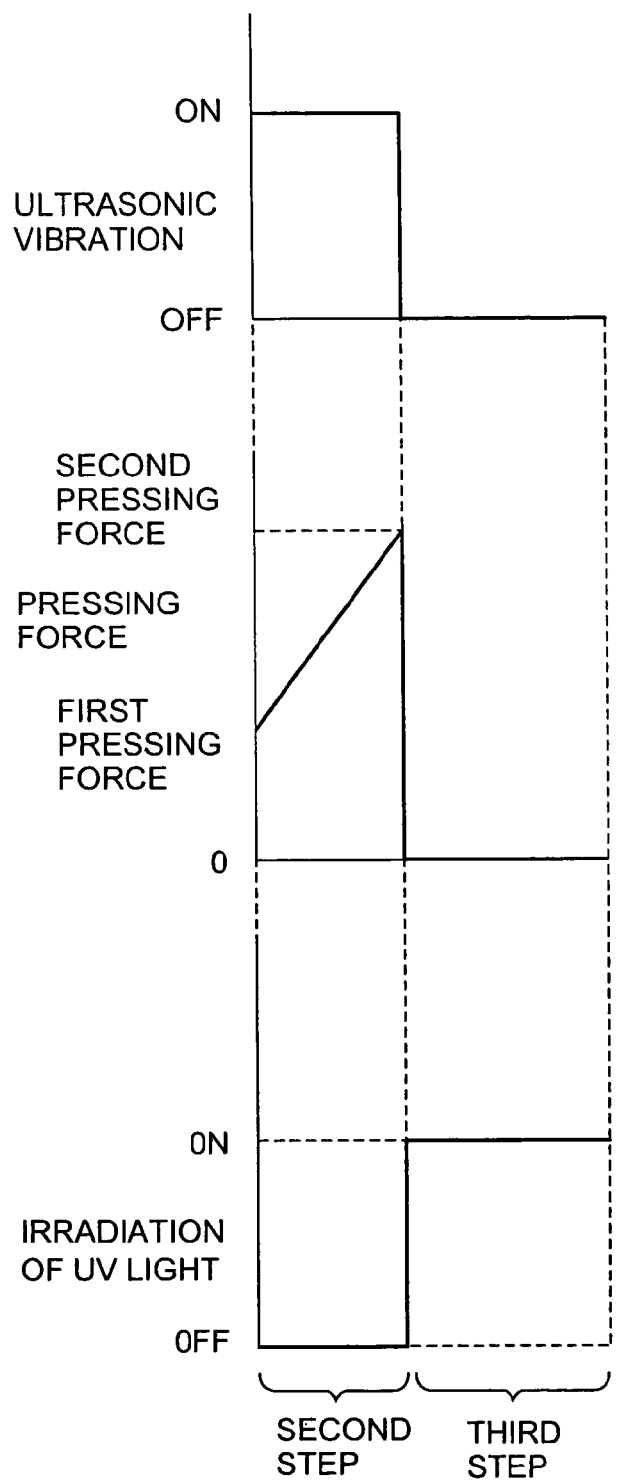
FIG. 28 is a graph showing a relationship between pressing force, state of ultrasonic vibration, and state of UV light irradiation, respectively, to be applied to an IC chip.

Next, in a second step, the feed of the sheet 21a with electrical conductors is once stopped. Then, while the pressing force is increased gradually up to a predetermined pressing force, multiple IC chips 20 arranged between the supporting unit 82 and the pressing unit 83 are pressed against the electrical conductors 22, and at the same time, ultrasonic vibration is applied to the multiple IC chips 20. As such, the IC chips 20 are pressed against the electrical conductors 22 while being ultrasonically vibrated. As a result, the electrodes 20b of the multiple IC chips 20 are contacted with the electrical conductors 22 while being vibrated relative to the electrical conductors 22. The relationship between the pressing force applied to each IC chip 20, state of ultrasonic vibration, and state of UV light irradiation, at this time, is shown in FIG. 28. It is noted that the second step is continued for about 0.01 to 2.0 seconds.

The method of applying pressing force to IC chips 20 and the method of providing ultrasonic vibration thereto are the same as in the second step of the method of fixing and electrically connecting IC chips 20 with the electrical conductors 22 by using the fixing apparatus 80 described with reference to FIGS. 23 and 24. Accordingly, in the second step of this variation, it is possible not only to remove oxide films on the electrical conductors but also to ultrasonically join the electrodes 20b of each IC chip 20 to the electrical conductors 22. Hereinafter, the second step of this variation will be described on the premise that the electrodes 20b of each IC chip 20 are ultrasonically joined to the electrical conductors 22.

In a third step, UV light is radiated on the adhesive 18 provided between multiple IC chips 20 and the electrical conductors 22 due to the UV light irradiating apparatus 100. As shown in FIG. 25, the UV light irradiating apparatus 100 is located at a position sifted toward the downstream side relative to the supporting unit 82 and the pressing unit 83. Accordingly, upon transferring from the second step to the third step, vibration of the pressing unit 83 due to the ultrasonic horn 86 is stopped, and the pressing unit 83 is retracted in the direction to move away from the supporting unit 82. Thereafter, the electrical conductors 22 are fed from the supporting unit 82 to the UV light irradiating apparatus 100, where it is stopped again.

As described above, the UV light irradiating apparatus 100 includes the upper UV light irradiating unit 101 and the lower UV light irradiating unit 111. The upper UV light irradiating unit 101 is disposed at a position such that the center of each ring of the UV light projecting units 108 is generally coincident with the center of each IC chip 20 on the electrical conductors 22. Meanwhile, the lower UV light irradiating unit 111 is disposed at a position such that each UV light projecting unit 118 is positioned below each IC chip 20 on the electrical conductors 22. Accordingly, the upper UV light irradiating unit 101 can radiate UV light onto the adhesive 18 mainly located at the periphery of each IC chip 20, while the lower UV light irradiating unit 111 can radiate UV light onto the adhesive 18 provided between each IC chip 20 and the electrical conductors 22. Thus, in the third step, the entire adhesive 18 can be irradiated effectively with UV light by using the UV light irradiating apparatus 100. It is noted that the third step is continued for about 1.0 to 3.0 seconds.

In the third step, the adhesive 18 is completely cured, and as such each IC chips 20 is fixed onto the electrical conductors 22. Usually, the adhesive 18 including a UV curable resin can be cured within a time shorter than that required for curing thermosetting resins or thermoplastic resins. Accordingly, the time required for the step of fixing each IC chip 20 onto the electrical conductors 22 can also be reduced. That is to say, by using the adhesive including a UV curable resin, the productivity of sheet 1 with IC tags can be enhanced.

As described above, upon transferring from the second step to the third step, the electrical conductors 22 are moved from the upstream side to the downstream side. At this time, along with such a movement of the electrical conductors 22, new electrical conductors 22 on which multiple (a plurality of) IC chips 20 are arranged through the adhesive 18 is fed again onto the supporting unit 82 of the fixing apparatus 80a. In this way, the step of fixing and electrically connecting the IC chips 20 onto the electrical conductors 22 is successively repeated.

According to this variation, by using the adhesive 18 including a UV curable resin, the time required for curing the adhesive 18 can be reduced, thereby enhancing the productivity of sheet 1 with IC tags.

By using the fixing apparatus 80a and fixing method described above, readily and securely, multiple IC chips 20 can be fixed onto the electrical conductors 22 as well as the electrodes 20b of multiple IC chips 20 can be electrically connected, i.e., in electrical connection, with the electrical conductors 22. By applying ultrasonic vibration to each IC chip 20, oxide films on the electrical conductors 22 can be broken as well as the electrodes 20b of each IC chip 20 and electrical conductors 22 can be ultrasonically joined together. Therefore, the electrical resistance between the electrodes 20b of each IC chip and the electrical conductors 22 can be reduced, as well as, variation of the electrical resistance can be decreased. Thus, the performance of the finally obtained IC tags 10 can be enhanced as well as variation of quality of the IC tags 10 can be reduced.

The pressing force provided by the pressing unit 83 is determined by the control unit 85 corresponding to the number of IC chips 20 being pressed by the pressing unit 83, such that strength of the pressing force to be applied to each IC chip will be adequate for the type of IC chip 20 or characteristics of the adhesive 18. If some IC chips 20 would lack on the electrical conductors 22, the pressing force to be applied to each IC chip would be unduly strong, and as such damaging (or breaking) IC chips. Or, sometimes, due to unduly weak pressing force, the fixing of IC chips 20 could not be stabilized, or otherwise the electrical continuity between IC chips 20 and the electrical conductors 22 could not be established. However, in accordance with this embodiment, such inconveniences can be avoided by the control or adjustment described above. Accordingly, a plurality of IC chips 20 can be fixed and electrically connected to the electrical conductors 22 accurately and securely, at a time, without damaging the IC chips 20, thereby enhancing the production efficiency and the rate of good items of IC tags 10. This is significantly effective because all of the IC tags 10 can be obtained as acceptable ones even from both end portions of the sheet 1 with IC tags where the number of IC chips 20 to be provided into the fixing means (fixing apparatus 80a) is often fluctuated. Thus, this variation enables reduction of cost in a small lot production applicable for various types of IC tags 10 as greatly needed today.

In this variation, while an example in which multiple IC chips 20 are applied with ultrasonic vibration while being pressed against the electrical conductors has been described, the process is not limited to this aspect. For example, the lengths of the supporting unit 82 and pressing unit 83 along the feed direction of the electrical conductors 22 may be shortened so that the IC chips 20 can be pressed as well as ultrasonically vibrated, one at a time. Similarly, in the third step, while an example in which the adhesive provided between multiple IC chips 20 and the electrical conductors 22 is irradiated with UV light at the same time to simultaneously fix the multiple IC chips 20 onto the electrical conductors has been disclosed, the irradiation step is not limited to this aspect. That is to say, only one ring as the UV light projecting unit 108 may be employed in the upper UV irradiating unit 101, while only one UV light projecting unit 118 may be provided in the lower UV light irradiating unit 111, so that the IC chips 20 can be fixed, one at a time, onto the electrical conductors 22.

In this variation, while an example in which the UV light irradiating apparatus 100 is disposed adjacent the supporting unit 82 and the pressing unit 83 has been described, the arrangement is not limited to this aspect. For example, the UV light projecting units 108 of the upper UV light irradiating unit 101 may be built in the pressing unit 83, while the UV light projecting units 118 of the lower UV light irradiating unit 111 may be built in the supporting unit 82. In such a case, the electrical conductors 22 will not be needed to move upon transferring from the second step to the third step.

Figure 24:
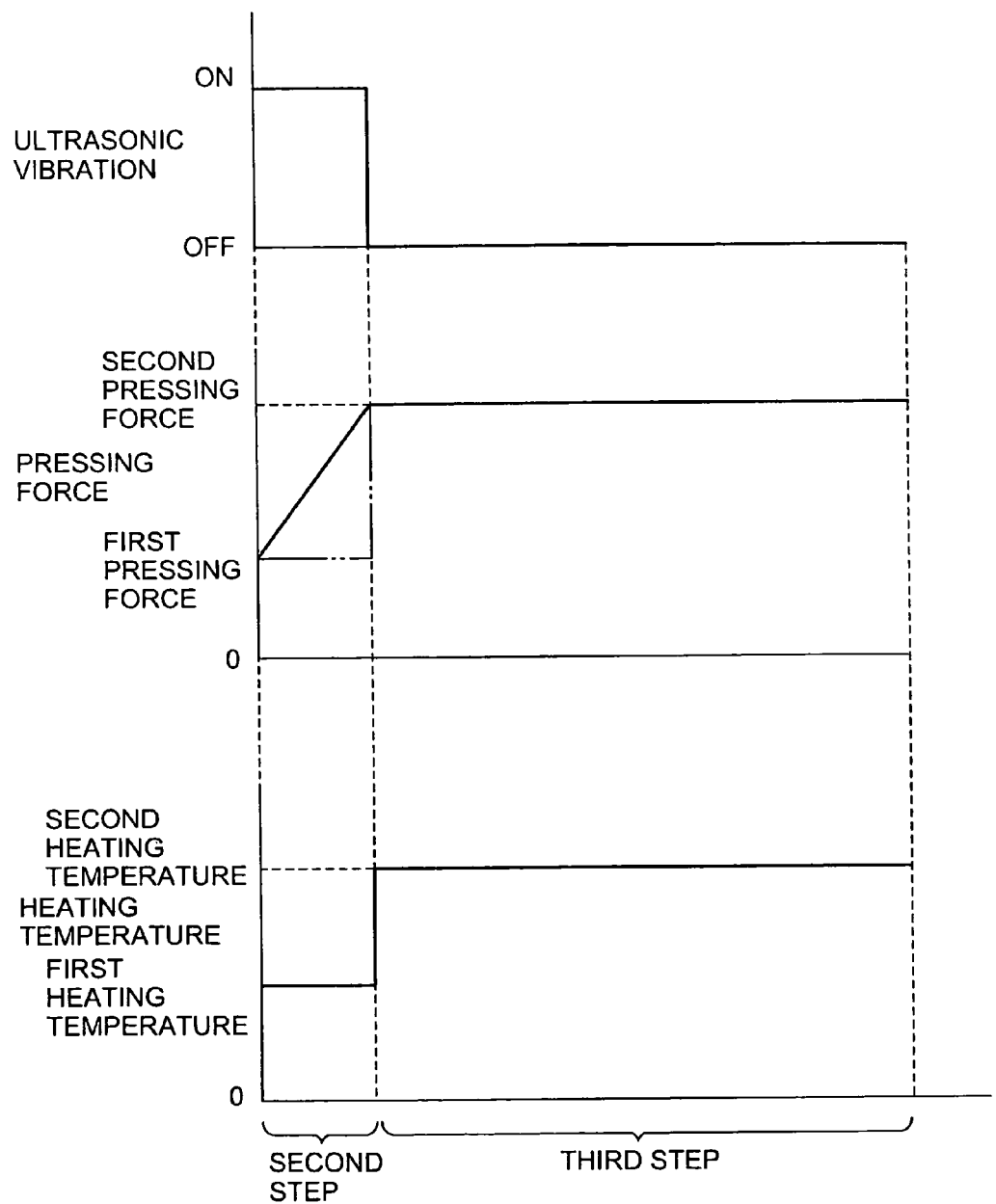
FIG. 24 is a graph showing a relationship between pressing force, state of ultrasonic vibration, and heating temperature, respectively, to be applied to an IC chip.

An alteration similar to the <Variation of the method of fixing and electrically connecting IC chips 20> as described with reference to FIGS. 23 and 24 is possible. That is to say, the pressing force in the second step may be constant. Similarly, the conditions of ultrasonic vibration in the second step may be suitably selected such that only the oxide films on the electrical conductors 22 can be removed without ultrasonically joining the electrodes 20b of IC chips 20 to the electrical conductors 22 being established. In such a case that the electrodes 20b of each IC chip 20 and the electrical conductors 22 are not ultrasonically joined together, as described above, it is preferred that the adhesive 18 is cured while each IC chip 20 is pressed against the electrical conductors 22, in order to securely and electrically join the electrodes 20b of each IC chip 20 to the electrical conductors 22. In addition, the fixing apparatus 80a may be driven to reciprocally move along the feed direction of the electrical conductors 22.

<Variation of the Step of Feeding and Arranging IC Chips 20>

In this embodiment, while an example has been disclosed, in which one means 4, 50 adapted to feed the IC chip is provided for one means 5 adapted to arrange the IC chip, the fed-one-at-a-time IC chip 20 is then adsorbed and received by the adsorbing pickup nozzle 31, thereafter the IC chip 20 is positioned while being adsorbed by the adsorbing pickup nozzle 31, and deficiencies in the appearance, such as breakage and clacks, and the adsorbed state including the front and back sides and orientation are inspected by the CCD camera 49, and finally only IC chips 20 judged to be acceptable or normal are arranged on the sheet 21a with electrical conductors, the procedure is not limited to this aspect.

Next, a variation of the step of arranging IC chips 20 will be described with reference to FIGS. 29 through 33. It is noted that like parts in the embodiments described above and their variations are denoted with like reference numerals, and their repetitive detailed description will be omitted here.

(First Variation)

In addition to or in place of the positioning of each IC chip 20 adsorbed by the adsorbing pickup nozzle 31 and the inspection due to the CCD camera 49, quality, especially the performance of action, of each IC chip 20 adsorbed by the adsorbing pickup nozzle 31 may be checked in order to arrange only IC chips 20 whose quality is judged to be normal.

Figure 29:
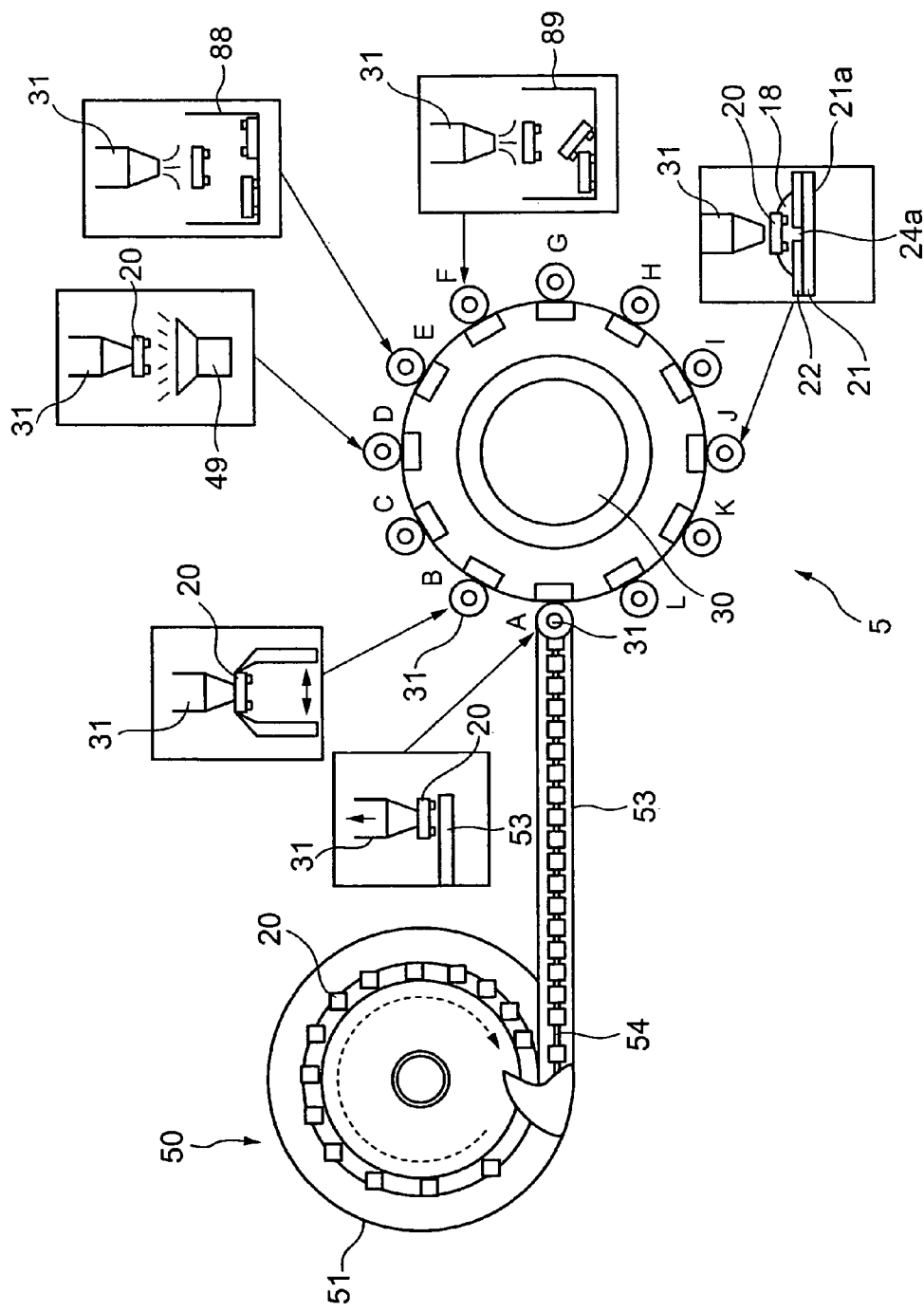
FIG. 29 is a top view showing a variation of the arranging step for IC chips.
Figure 30:
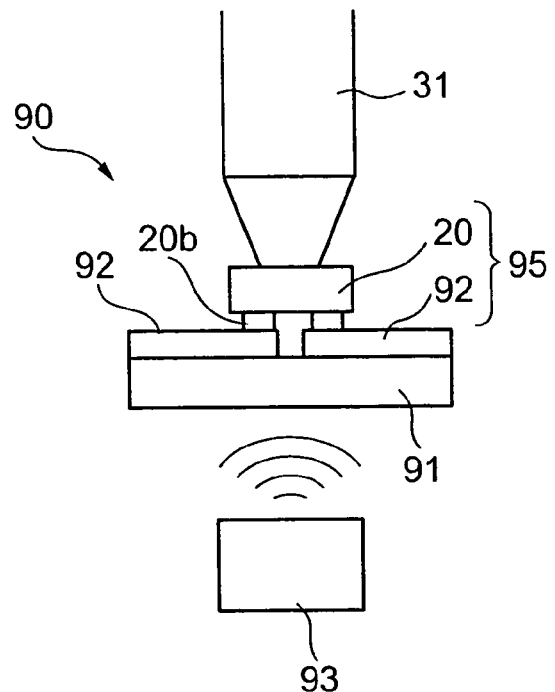
FIG. 30 is a schematic view illustrating a quality checking method for IC chips.
Figure 31:
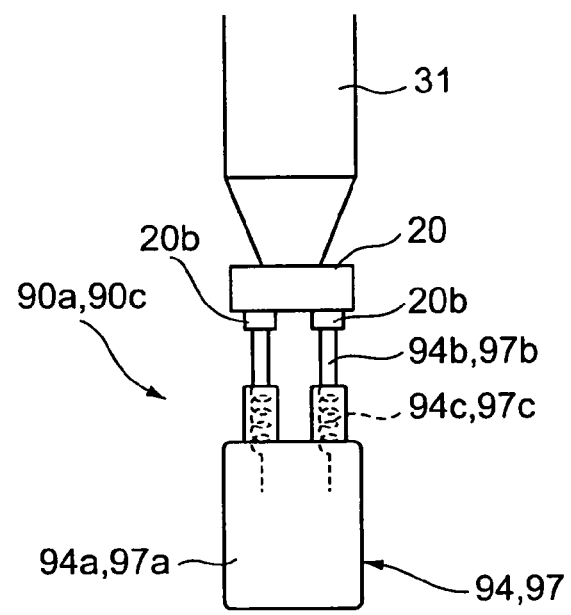
FIG. 31 is a schematic view illustrating another quality checking method for IC chips.
Figure 32:
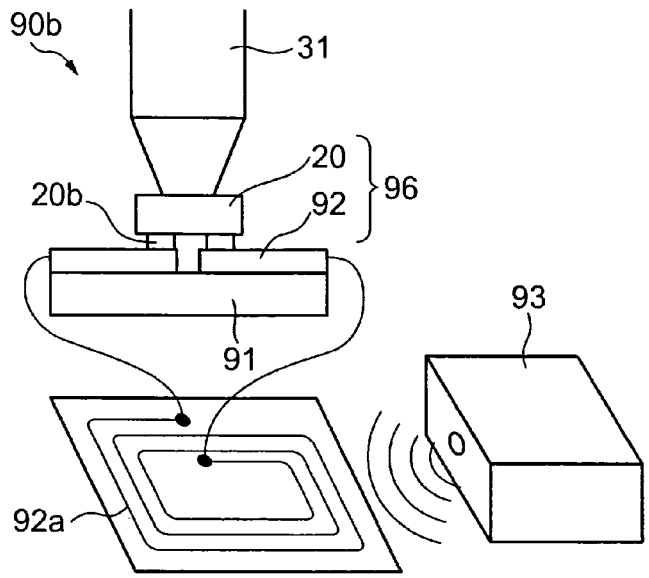
FIG. 32 is a schematic view illustrating another quality checking method for IC chips.

In this variation, IC chips 20 are fed one at a time by the parts feeder 50 described above. Then, the fed IC chips 20 are adsorbed and received successively by the adsorbing pickup nozzles 31 provided at an equal interval at the periphery of the index table 30. Thereafter, each IC ship 20 experiences the positioning, inspection of appearance and adsorbed state, and check of quality, and the so-checked IC chip 20 is then arranged on the sheet 21a with electrical conductors. FIG. 29 is a schematic view showing a construction of this variation, and FIGS. 30 through 32 are schematic views showing methods of checking quality of IC chips 20, respectively.

As shown in FIG. 29, in this variation, each adsorbing pickup nozzle 31 receives one IC chip 20 from the parts feeder 50 in a first station A of the index table 30. Thereafter, positioning of IC chips 20 is performed in a second station B, and quality of each IC chip 20 is checked in a third station C. Then, in a fourth station D, inspection of appearance and inspection of the adsorbed state of each IC chip 20 are performed, so that only IC chips 20 whose quality, appearance, and adsorbed state are all judged to be normal can be arranged on the sheet 21a with electrical conductors, in a tenth station J.

In a fifth station E, IC chips whose quality or appearance is judged not to be normal are collected in a deficient IC chip collecting box 88. These deficient IC chips are then discarded. Thereafter, in a sixth station F, IC chips 20 whose adsorbed state, i.e., their front and back sides or orientation is judged to be improper are collected in an adsorbed state deficient IC chip collecting box 89. The IC chips 20 collected in the adsorbed state deficient IC chip collecting box 89 are not normal only in the matter of front and back sides or orientation upon being adsorbed by each adsorbing pickup nozzle 31, but they are normal in the quality and appearance of each chip itself. Therefore, such IC chips 20 are fed again into the parts feeder 50.

In this variation, adding to the stations A, B, C, D, E, F, described above, the index table 30 has a seventh to ninth stations G, H, I, eleventh station K, and twelfth station L. Although these stations G, H, I, K, L are empty stations in this variation, other inspections on each IC chip 20 or some processes for each IC chip 20 may be performed in these stations. The number of these stations is not limited to twelve (12), but may be varied optionally.

Each adsorption pickup nozzle 31 is moved to each station A, B, C, D, E, F, J successively due to the rotation of the index table 30, and temporarily stopped at each station A, B, C, D, E, F, J, wherein inspections and processes are performed during the stop at each station A, B, C, D, E, F, J.

Next, a method of checking quality of IC chips 20 in the third station C will be described in greater detail.

As shown in FIG. 30, in the third station C, a quality checking unit 90 is provided. The quality checking unit 90 includes a pair of testing extension electrodes 92 which forms a testing IC tag 95 together with an IC chip 20 adsorbed by the adsorbing pickup nozzle 31, and a communication characteristic measuring instrument 93 for measuring communication characteristics of each IC chip 20 by a non-contact inspection with the testing IC tag 95. The testing extension electrodes 92 are supported by a base 91, and arranged below a stop position of the adsorbing pickup nozzle 31. The testing extension electrodes 92 function as an antenna for communication between the IC chip 20 and the communication characteristic measuring instrument 93. As the communication characteristic measuring instrument 93, a reader/writer adapted to perform transmission and reception of data to the testing IC tag 98 or an impedance analyzer which is able to analyze a state of communication radio waves upon communication with the testing IC tag 98 can be used.

Next, a method of checking quality of IC chips 20 by using the quality checking unit 90 will be described.

First, while an IC chip 20 is adsorbed by an adsorbing pickup nozzle 31 stopping at the third station, the electrodes 20b of the IC chip 20 is lowered until contacting with the extension electrodes 92, and stopped at the position. Thus, the IC chip 20 is electrically connected with the testing extension electrodes 92, emulating a circuit arrangement of the IC chip 20 on the testing extension electrodes 92, thereby to form the testing IC tag 95 comprising the IC chip 20 and the testing extension electrodes 92.

Since the IC chip 20 is positioned at the second station B on the upstream side of the third station C, the electrodes 20b of the IC chip 20 is not shifted from the testing extension electrodes 92 when the adsorbing pickup nozzle 31 is lowered.

In this state, communication is performed between the testing IC tag 95 and the communication characteristic measuring instrument 93. By checking the communication characteristics of the IC chip 20 using the communication characteristic measuring instrument 93 to perform a non-contact inspection together with the testing IC tag 95, quality of the IC chip 20 can be checked.

Specifically, in the case of using a reader/writer as the communication characteristic measuring instrument 93, it is possible to check whether non-contact transmission or reception of data can be performed or not. Also in this case, information can be written into an IC chip 20 by using the reader/writer, corresponding to the quality check of the IC chip 20. The information to be written can include, for example, results of the quality check, product information of IC chips 20 or final IC tags 10, or the like. As the product information, a lot number, date of manufacture, name of the product, name of the manufacturer, information on the person to whom the product is delivered or the like can be mentioned.

In the case of using an impedance/analyzer as the communication characteristic measuring instrument 93, sensitivity of each IC chip 20 to radio waves of various frequencies can be measured so as to confirm a shift in the resonance frequency.

In the case where an inspection on a communication distance between the testing IC tag 98 and the communication characteristic measuring instrument 93 is needed, the quality checking unit 90 may be configured to make the distance between the testing extension electrodes 92 and the communication characteristic measuring instrument 93 be changeable, so that the quality check can be performed while changing the distance.

In such a variation, arranging a deficient IC chip on the electrical conductors 22, and providing post-processes to a deficient IC chip (e.g., the process of fixing the IC chip to the electrical conductors 22 and lamination on the IC chip 20 with the protective film 23) can be prevented. As such, the production efficiency and the acceptable rate of the IC tag sheet 1 can be enhanced.

By performing the quality check for each IC chip 20 itself before arranging the IC chip 20, the number of items to be inspected can be reduced in the step of <Production and inspection of IC tags 10> according to the embodiment described above. It is contemplated that the inspection in the step of <Production and inspection of IC tags 10> may be limited to confirmation of whether the electrodes 20 of the IC chip 20 and the extension electrodes 9 are connected with each other and confirmation of whether the pair of extension electrodes 9 are in a non-contact state with each other. Otherwise, the quality check of IC tags 10 may be performed also in the step of <Production and inspection of IC tags 10> described above, thus eventually performing the quality check on each IC chip 20 itself twice, thereby precisely inspecting the quality of final IC tags 10 and securing the quality of the IC tags 10.

In this variation, while an example in which the quality check (or confirmation of communication characteristics) of IC chips 20 in a non-contact inspection by using the communication characteristic measuring instrument 93 has been disclosed, the check mode is not limited to this aspect. For example, the quality of each IC chip 20 may be confirmed while the IC chip 20 and the communication characteristic measuring instrument of the quality checking unit are electrically contacted with each other. According to such a quality checking unit 90a, since the communication characteristic measuring instrument 94 and the IC chip 20 are in connection with each other, the quality of each IC chip itself can be assessed securely.

In this case, as shown in FIG. 31, the quality checking unit 90a can be composed of the communication characteristic measuring instrument 94 which includes a connecting portion 94b adapted to be electrically connected with the IC chip 20, and a communication characteristic measuring instrument body 94a which is electrically connected with the connecting portion 94b and capable of measuring communication characteristics of each IC chip 20 while being connected with the IC chip 20 through the connecting portion 94b. As the communication characteristic measuring instrument body 94a, as is similar to the quality checking unit 90 described with reference to FIG. 30, a reader/writer or impedance analyzer can be used.

In the communication characteristic measuring instrument 94, it is preferred that the connecting portion 94b is slidably held by the communication characteristic measuring instrument body 94a, biased in the direction getting away from the communication characteristic measuring body 94a by a biasing member 94c, such as a metal spring or the like, and electrically connected with the communication characteristic measuring instrument body 94a through the biasing member 94c. In such a way, without precisely controlling the movable range of vertical movement of the adsorbing pickup nozzles 31, the electrodes 20b of each IC chip 20 and the connecting portion 94b of the communication characteristic measuring instrument 94 can be electrically and securely connected with each other, thereby securely confirming the communication characteristics of each IC chip 20 due to the communication characteristic measuring instrument body 94a of the communication characteristic measuring instrument 94.

Alternatively, the quality checking unit 90a for checking communication characteristics of each IC chip 20 while being in contact with the IC chip 20 may also be composed by electrically connecting the testing extension electrodes 92 and a communication characteristic measuring instrument 93 of the quality checking unit 90 shown in FIG. 30, by means of a connecting cable (not shown). That is to say, in place of using the connecting portion 94c, the extension electrodes 92 connected with the communication characteristic measuring instrument body 94a can be used as a mere connecting terminal.

As a further alteration, in the case of using the produced IC tag 10 as an interposer, it is preferred that the quality checking unit 90b is configured as shown in FIG. 32. That is to say, this quality checking unit 90b may include a pair of testing extension electrodes 92 which form a testing IC tag (testing interposer) 96 together with an IC chip 20 adsorbed by the adsorbing pickup nozzle 31, and a communication characteristic measuring instrument 93 which is disposed in the vicinity of the testing IC tag (testing interposer) 96 and which is adapted to measure communication characteristics of each IC chip 20 by a non-contact inspection with the testing IC tag 96. The testing extension electrodes 92 are supported by a base 91, arranged below a stop position of an adsorbing pickup nozzle 31, and connected electrically with an antenna circuit 92a.

In this case, quality of each IC chip 20 can be checked by forming the testing IC tag (testing interposer) 96 by connecting the IC chip 20 adsorbed by the adsorbing pickup nozzle 31 with the testing extension electrodes 92, and checking communication characteristics of the testing IC tag (testing interposer) 96 by a non-contact inspection using the communication characteristic measuring instrument 93.

In FIG. 32, while an example in which the antenna circuit 92a is composed of a loop antenna is shown, the construction is not limited to this aspect. For example, it may be composed of a dipole antenna.

In this variation, while an example in which communication characteristics are checked as the quality of each IC chip 20 by using the communication characteristic measuring instrument 93, 94, the quality confirmation is not limited to this aspect. For example, the electric characteristics of each IC chip may be checked for the same purpose. In this case, as shown in FIG. 31, a quality checking unit 90c may be composed of an electric characteristic measuring instrument 97 including a connecting portion 97b adapted to be connected with an IC chip 20, and an electric characteristic measuring instrument body 97a which is connected with the connecting portion 97b and capable of measuring electric characteristics of the IC chip 20 while being connected with the IC chip 20 through the connecting portion 97b. As the electric characteristics measuring instrument body 97, an impedance analyzer or resistance meter can be used in order to measure and confirm the resistance of each IC chip 20, electric capacity of a condenser in the IC chip 20, a state of its memory and so on.

In the quality checking unit 90c, for the same reason as the quality checking unit 90a described above with reference to FIG. 31, it is preferred that the connecting portion 97c is slidably held by the electric characteristic measuring instrument body 97a, biased in the direction getting away from the communication characteristic measuring body 97a by a biasing member 97c, such as a metal spring or the like, and electrically connected with the communication characteristic measuring instrument body 97a through the biasing member 97c. Also, similar to the quality checking unit 90a, in place of using the connecting portion 97c, the extension electrodes 92 connected with the communication characteristic measuring instrument body 97a may be used as a mere connecting terminal. Moreover, while the quality checking unit 90c may be used in place of the quality checking unit 90, 90a, 90b for checking the communication characteristics, it may be used, in addition to the quality checking unit 90, 90a, 90b for checking the communication characteristics, by utilizing the empty stations of the index table 30.

(Second Variation)

In this embodiment, while an example in which one means 4, 50 adapted to feed one IC chip at a time is provided for one means 5 adapted to arrange one IC chip at a time has been disclosed, the construction is not limited to this aspect. For example as shown in FIG. 33, a plurality of means 4, 50 adapted to feed one IC chips at a time may be provided for one means 5 adapted to arrange one IC chip at a time.

Figure 33:
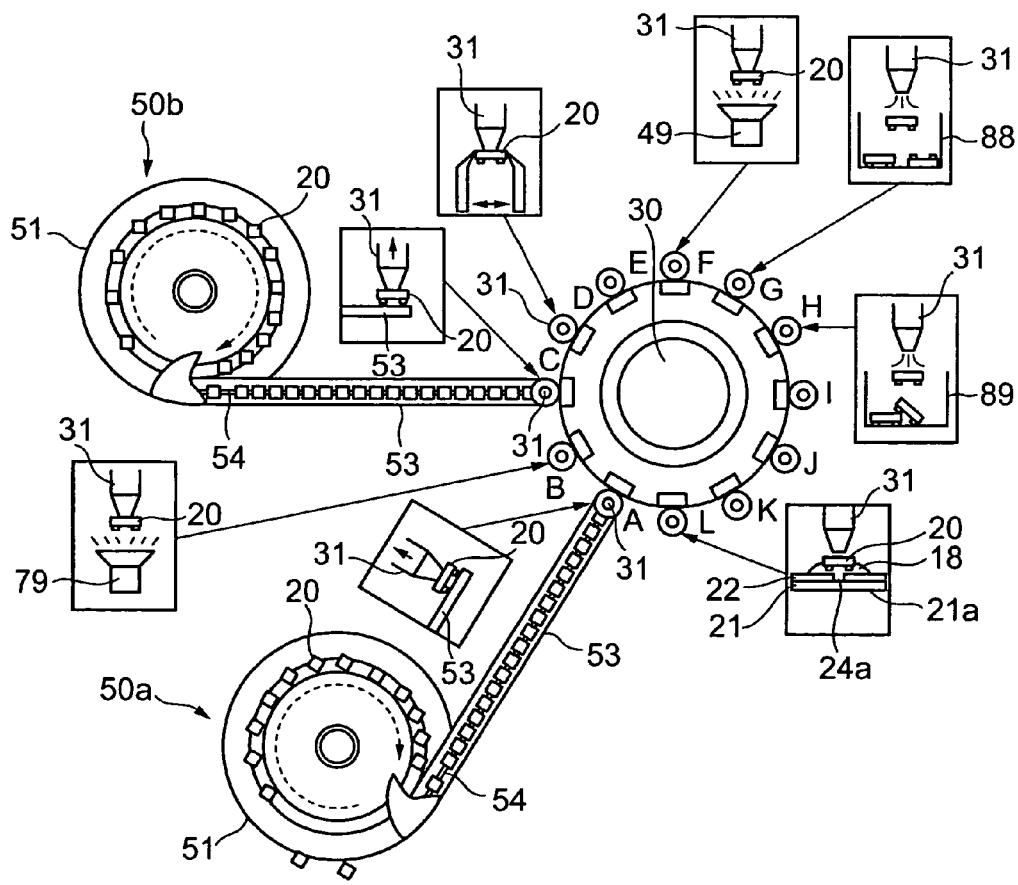
FIG. 33 is a top view showing a variation of the arranging step for IC chips.

In a variation shown in FIG. 33, two parts feeders 50a, 50b are provided at the periphery of one index table 30, and IC chips 20 are fed at two points on a transfer route of the adsorbing pickup nozzles 31. Each adsorbing pickup nozzle 31 is configured to receive one IC chip 20 at a time at either one of the two points. More specifically, as shown in FIG. 33, a first parts feeder 50a feeds IC chips 20 to a first station A of the index table 30, and a second parts feeder 50b feeds IC chips 20 to a third station C of the index table 30.

In this variation, at a second station B between the first station A and the third station C, a monitoring means 79 composed of a CCD camera or the like is provided. Utilizing this monitoring means 79, whether or not each pickup nozzle 31 has received an IC chip 20 fed from the first parts feeder 50a to the first station A can be confirmed at the second station B. From the result obtained by the monitoring means 79, if it is found that one adsorbing pickup nozzle 31 is not adsorbing nor holding an IC chip 20 when passing through the second station B, this adsorbing pickup nozzle 31 is lowered again at the third station C so as to receive an IC chip 20 from the second parts feeder 50b. That is to say, even though IC chips 20 are not fed from the first parts feeder 50a because of, for example, blocking, obstruction or the like, the adsorbing pickup nozzles 31 can receive IC chips 20 from the second parts feeder 50b, whereby IC chips 20 can be fed to the adsorbing pickup nozzles 31 more securely. Additionally, while each pickup nozzle 31 receives an IC chip 20 from the second parts feeder 50b, the inconvenience in the first parts feeder 50a, for example, a cause of blocking or obstruction can be eliminated. Accordingly, more efficient arrangement of IC chips 20 can be achieved without need of stopping the arranging work of IC chips during eliminating the inconvenience in the first parts feeder 50a.

Alternatively, the parts feeders 50 for respectively feeding different types of IC chips 20 may be arranged in large numbers at the periphery of the index table 30. That is to say, in the case shown in FIG. 33, different kinds of IC chips 20 may be fed by using the first parts feeder 50a and by the second parts feeder 50b, respectively. In such a case, during production of one type of sheet 1 with IC tags, IC chips 20 for use in production of another type of sheet 1 with IC tags can be prepared in a different parts feeder 50. Accordingly, in the case of producing many types of sheet 1 with IC tags using a single production line, more efficient production of sheet 1 with IC tags can be provided.

In the variation shown in FIG. 33, after IC chips 20 are received at the first station A or third station C, positioning of the IC chips 20 is performed at a fourth station D, quality of the IC chips is checked at a fifth station E, inspection on appearance and inspection on the adsorbed state of the IC chips 20 are performed at a sixth station F. As a result, only IC chips 20 whose quality, appearance, and adsorbed state are all judged to be normal can be arranged on the sheet 21a with electrical conductors, at a twelfth station L. During the above, in a seventh station G, IC chips whose quality or appearance is judged not to be normal are collected in a deficient IC chip collecting box 88, and then in an eighth station H, IC chips 20 whose adsorbed state, i.e., their front and back sides or orientation is judged to be improper are collected in an adsorbed state deficient IC chip collecting box 89.

In the first variation and (Second variation) of the above <Variation of the step of feeding and arranging IC chips 20>, while examples in which the parts feeder 50 is employed as means for feeding IC chips 20 have been disclosed (FIGS. 29 and 33), the feeding means is not limited to this aspect. For example, as the means for feeding IC chips, the means 4 including the wafer holding plate 13 and the UV light irradiating portion 14 (FIGS. 5 and 6) may be employed.

<Variation of the Method of Producing IC Tags>

In this embodiment, an example has been described, in which IC tags 10 are produced successively along the feed direction on a single non-conductive sheet 21 by cutting the electrical conductors 22 (FIGS. 3 and 7) between each adjacent pair of IC chips 20 by using a pair of non-conductive blades 46 extending in the width direction as means 46 for producing IC tags. In the (Fifth variation) of the above <Variation of preparation of the sheet 21a with electrical conductors>, an example has been disclosed, in which IC tags 10 are produced successively along the feed direction on a single non-conductive sheet 21 by successively each IC chips 20 across each of multiple pairs of electrical conductors 22 (FIG. 11) provided along the feed direction of the non-conductive sheet 21. However, without being limited to these aspects, IC tags 10 may be produced in succession along the feed direction on the single non-conductive sheet 21, by using another method.

Hereinafter, a variation of the method of producing IC tags 10 on the single non-conductive sheet 21 will be described with reference to FIGS. 34 through 41. It is noted that, in FIGS. 34 through 41, like parts in the embodiments described above and their variations are designated with like reference numerals, and their repetitive detailed description will be omitted here.

(First Variation)

Figure 34:
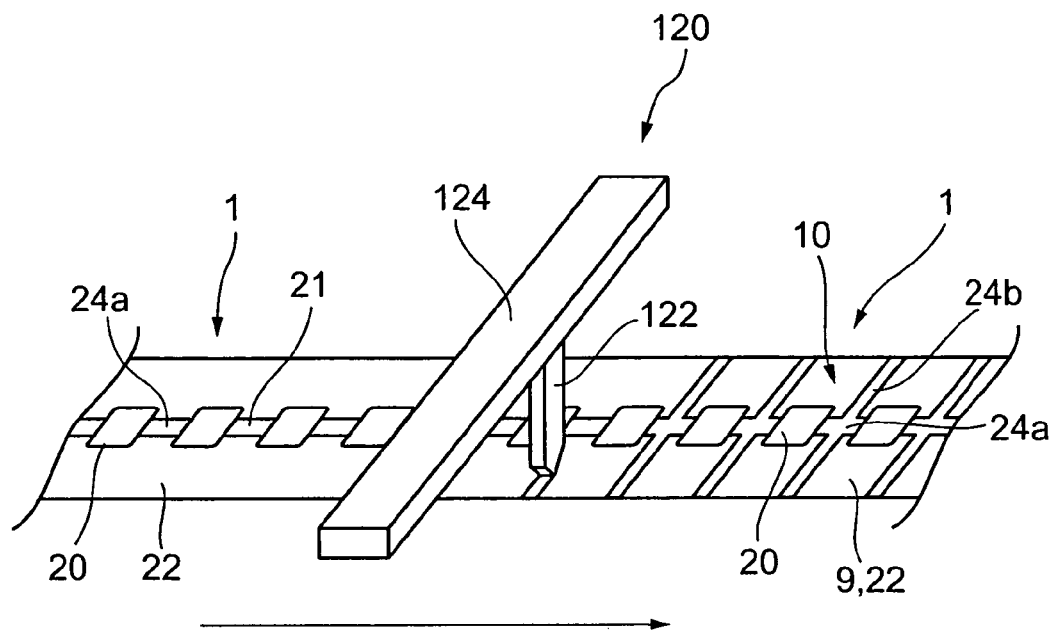
FIG. 34 is a perspective view illustrating a variation of the producing step for IC tags.

FIG. 34 is a perspective view showing a variation of the method of producing IC tags 10 by cutting the electrical conductors 22 of the sheet 1 with IC tags for each IC chip 20. It is noted that, in FIG. 34, the left side is the upstream side, and as such the sheet 1 with IC tags is fed from left to right in the drawing.

In this variation, means 120 for producing IC tags includes a movable blade 122 adapted to move along the width direction perpendicular to the longitudinal direction (feed direction) of the sheet 1 with IC tags, and a supporting rail 124 for supporting the movable blade 122. The movable blade 122 is supported by the supporting rail 124 such that it can be optionally moved also in the vertical direction.

In the case of using such means 120 for producing IC tags, when the sheet 1 with IC tags is fed, and a point to be cut of the sheet 1 with IC tags is moved to a position just under the movable blade 122, that is to say, substantially the center of contiguously arranged two IC chips 20 reaches just under the movable blade 122, the movement in the feed direction of the sheet 1 with IC tags is stopped. Thereafter, the movable blade 122 is lowered, cuts into the sheet 1 with IC tags, and moves along the width direction, thus cutting the electrical conductors 22. Similar to the case of the non-conductive blade 46 described above, the movable blade 122 at this time does not cut the full thickness of the sheet 1 with IC tags. That is to say, while the movable blade 122 reaches the non-conductive sheet 21, it does not extend through the sheet 21. Accordingly, the movable blade 122 divides only the electrical conductors 22, but the non-conductive sheet 21 is not divided. In this way, IC tags 10 are formed while being supported on the single non-conductive sheet 21 extending in a band-like (elongated) fashion. Each formed IC tag comprises a pair of extension electrodes 9 formed, in succession, of a pair of electrical conductors 22, and an IC chip 20 connected to the extension electrodes 9. As shown in FIG. 34, the sheet 1 with IC tags, having experienced such processes, eventually includes the non-conductive sheet 21, multiple pairs of electrical conductors 22 provided on the non-conductive sheet 21 and arranged in the longitudinal direction of the non-conductive sheet 1, and IC chips 20 arranged on each pair of electrical conductors 22. Between each adjacent pair of IC chips 20, a cut (notch, opening) 24*b* is formed extending over the full width of each pair of electrical conductors 22 and getting into the non-conductive sheet 21 from the surface of the electrical conductors 22.

Figure 35:
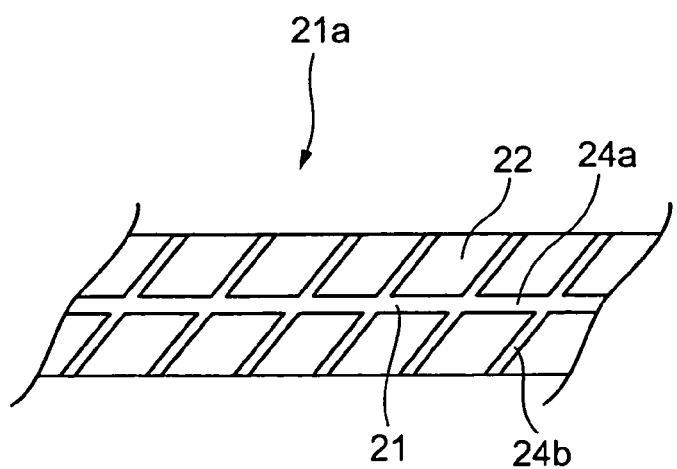
FIG. 35 is a perspective view illustrating a variation of the sheet with electrical conductors.

Alternatively, as shown in FIG. 35, the notches 24*b* are formed in large numbers, along the width direction, at a predetermined interval along the feed direction, by cutting the electrical conductors 22 of the sheet 21*a* with electrical conductors, which includes the non-conductive sheet 21 extending in a band-like fashion and the pair of electrical conductors 22 provided on the non-conductive sheet 21, extending in the longitudinal direction of the non-conductive sheet 21 and spaced apart from each other, by using the movable blade 122 and the supporting rail 124 (collectively referred to as the means 120 for producing IC tags) described above. As a result, the sheet 21*a* with electrical conductors, as shown in FIG. 35, can be produced, wherein the sheet 21*a* with electrical conductors includes the non-conductive sheet 21 extending in a band-like fashion, and multiple pairs of electrical conductors 22 provided on the non-conductive sheet 21 and arranged along the longitudinal direction of the non-conductive sheet 21, and wherein each of the cuts 24*b*, getting into the non-conductive sheet 21 from the surface of the conductive electrodes 22, is formed between each adjacent pair of the electrode conductors 22. Thereafter, by arranging and fixing an IC chip 20 onto each pair of electrical conductors 22 of the produced sheet 21*a* with electrical conductors, IC tags 10 can be produced successively on the non-conductive sheet 21.

In this variation, the cutting tool 66 previously described with reference to FIGS. 17 and 18 in the (Second variation) of the above <Variation of preparation of the sheet 21*a* with electrical conductors>, or the roller 68 having the circumferential blade 68*a* previously described with reference to FIGS. 19 and 20 in the (Third variation) of the above <Variation of preparation of the sheet 21*a* with electrical conductors> may be used as the movable blade 122. It is also possible to use the pair of blades 62 previously described with reference to FIGS. 14 through 16 in the (First variation) of the above <Variation of preparation of the sheet 21*a* with electrical conductors> as the movable blade 122. In this case, by further providing a scraper (for example, the scraper 64 previously described with reference to FIGS. 14 through 16 in the (First variation) of the above <Variation of preparation of the sheet 21*a* with electrical conductors>), which is supported by the supporting rail 124 and configured to operate correspondingly to the movement of the movable blade 122 from behind it, an alternate means for producing IC tags may be constructed with the movable blade 122 and the scraper.

(Second Variation)

Figure 36:
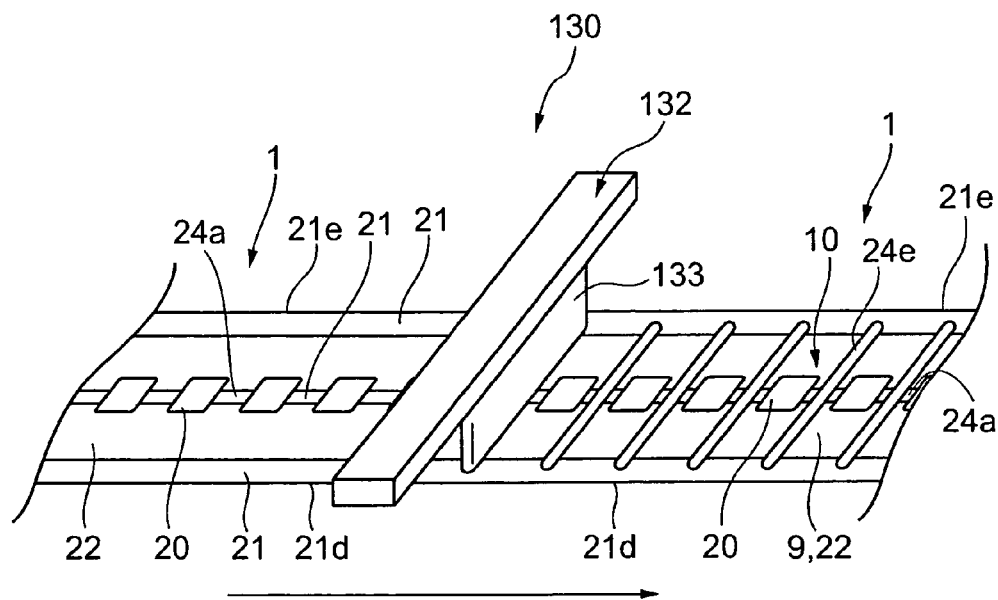
FIG. 36 is a perspective view illustrating a variation of the producing step for IC tags.

FIG. 36 is a perspective view showing a variation of the method of producing IC tags 10 by cutting the electrical conductors 22 of sheet 1 with IC tags for each IC chip 20. In FIG. 36, the left side designates the upstream side, and hence the sheet 1 with IC tags is fed from left to right in the drawing.

As shown in FIG. 36, in this variation, the sheet 1 with IC tags, coming into means 130 for producing IC tags, includes the non-conductive sheet 21, the pair of electrical conductors 22 provided on the non-conductive sheet 21 so as to be respectively spaced away from both ends 21*d*, 21*e* in the width direction perpendicular to the longitudinal direction of the non-conductive sheet 21, and multiple IC chips 20 on the pair of electrical conductors 22. The pair of electrical conductors 22 extend in the longitudinal direction of the non-conductive sheet 21 and are spaced apart from each other. The means 130 for producing IC tags is located above the sheet 1 with IC tags and arranged along the width direction perpendicular to the longitudinal direction of the sheet 1 with IC tags (non-conductive sheet 21). The means 130 includes a punching device 132 having a punching blade 133 which is narrower than the distance between both ends 21*d*, 21*e* of the non-conductive sheet 21 and wider than the full width of the pair of electrical conductors 22 of sheet 1 with IC tags. The punching blade 133 is selectively movable in the vertical direction.

In the case of using the means 130 for producing IC tags, when the sheet 1 with IC tags is fed, and a point to be cut of the sheet 1 with IC tags is moved to a position just under the punching blade 133, that is to say, substantially the center of contiguously arranged two IC chips 20 reaches just under the punching blade 133, the movement in the feed direction of the sheet 1 with IC tags is stopped. Thereafter, the punching blade 133 is lowered, punches out the electrical conductors 22 as well as the non-conductive sheet 21 so as to cut the electrical conductors 22. Thus, as shown in FIG. 36, a through hole 24*e* extending through both the non-conductive sheet 21 and the electrical conductors 22 can be formed, between each adjacent pair of IC chips 20, wherein each through hole 24*e* extends along the width direction of the non-conductive sheet 21, over arrange narrower than a range defined between both ends 21*d*, 21*e* in the width direction of the non-conductive sheet 21, and over at least the full width (across the full width) of the pair of electrical conductors 22. In other words, each through hole 24*e*, formed between each adjacent IC chips 20, extends along the width direction of the non-conductive sheet 21, such that each through hole 24*e* extends from a point situated between one end 21*d* (the lower end in FIG. 36) in the width direction of the non-conductive sheet 21 and the electrical conductor 22 located on the one end side, to a point situated between the other end 21*e* (the upper end in FIG. 36) in the width direction of the non-conductive sheet 21 and the electrical conductor 22 located on the other end side, and extends through both the non-conductive sheet 21 and the electrical conductors.

In this way, IC tags 10, each comprising the pair of extension electrodes 9 formed of the pair of electrical conductors 22 and an IC chip 20 connected with the extension electrodes 9, are formed, in succession, while being supported on the single non-conductive sheet 21 extending in a band-like (elongated) fashion. As shown in FIG. 36, the sheet 1 with IC tags, having experienced such processes, includes the non-conductive sheet 21 extending in a band-like fashion, multiple pairs of electrical conductors 22 provided on the non-conductive sheet 21 so as to be spaced away from both ends 21d, 21e in the width direction and arranged along the longitudinal direction of the non-conductive sheet 21, and IC chips 20 arranged on each pair of electrical conductors 22, wherein a through hole 24e is formed between each adjacent pair of IC chips 20, such that each through hole 24e extends along the width direction of the non-conductive sheet 21, over a range narrower than a range defined between both ends 21d, 21e in the width direction of the non-conductive sheet 21 and over at least the full width (across the full width) of the pair of electrical conductors 22, and each through hole 24e extends through both the non-conductive sheet 21 and the electrical conductors 22. In other words, each through holes 24e, formed between each adjacent IC chips 20, extends along the width direction of the non-conductive sheet 21, such that each through holes 24e extends from a point situated between one end 21d (the lower end in FIG. 36) in the width direction of the non-conductive sheet 21 and the electrical conductor 22 located on the one end side, to a point situated between the other end 21e (the upper end in FIG. 36) in the width direction of the non-conductive sheet 21 and the electrical conductor 22 located on the other end side, and extends through both the non-conductive sheet 21 and the electrical conductors.

According to this variation, the electrical conductors 22 can be divided readily and securely along the feed direction, as well as, IC tags 10 can be produced securely and successively, along the feed direction, on the single non-conductive sheet 21.

Figure 37:
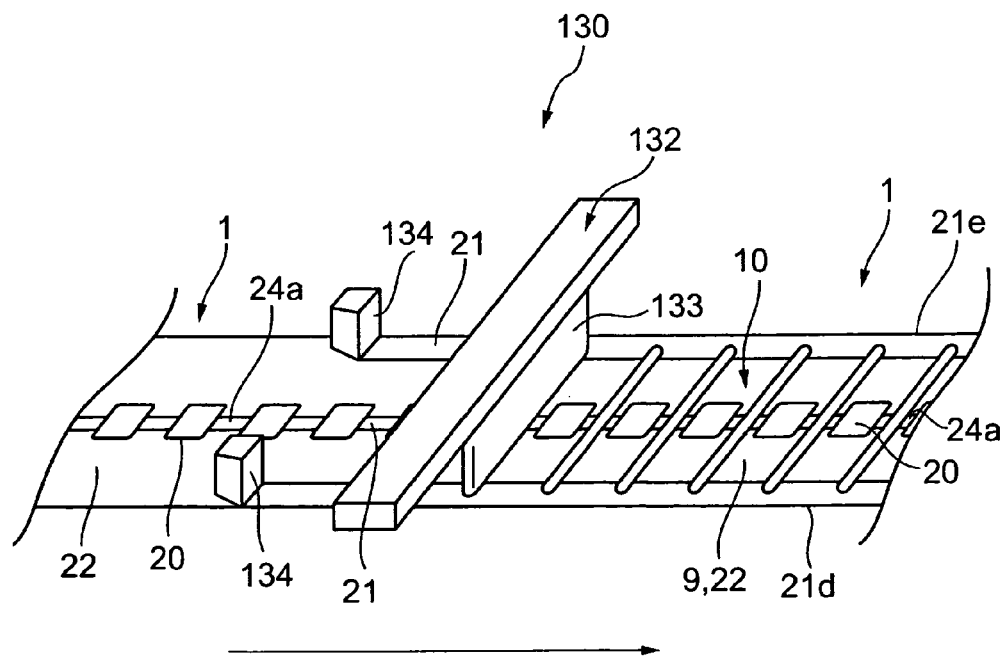
FIG. 37 is a perspective view illustrating a variation of the producing step for IC tags.

In this variation, while an example in which the pair of electrical conductors 22 of the sheet 1 with IC tags to be fed are respectively spaced away from both ends 21d, 21e in the width direction of the non-conductive sheet 21 has been disclosed, this example is not limited to this aspect. For example, as shown in FIG. 37, the sheet 1 with IC tags in which the electrical conductors 22 are also formed on both ends 21d, 21e in the width direction of the non-conductive sheet 21 may be fed toward the means 130 for producing IC tags, wherein a removing means 134 for removing the electrical conductors 22 located on and near both ends 21d, 21e in the width direction of the non-conductive sheet 21 is provided on the upstream side of the means 130 for producing IC tags, or otherwise the removing means 134 is incorporated in the means 130 for producing IC tags. In this case, as with the slit 24a provided in the sheet 21a with electrical conductors, the electrical conductors 22 located on and near both ends 21d, 21e in the width direction of the non-conductive sheet 21 can be removed. As the removing means 134, the cutter 42 previously described with reference to FIGS. 3 and 4 in the present embodiment, or the slit forming means 60a, including the blade 62, scraper 64 and remnant collecting portion (not shown), previously described with reference to FIGS. 14 through 16 in the (First variation) of the above <Variation of preparation of the sheet 21a with electrical conductors>, or the slit forming apparatus 60b, including the cutting tool 66, tool supporting portion (not shown) and remnant collecting portion (not shown), previously described with reference to FIGS. 17 and 18 in the (Second variation) of the above <Variation of preparation of the sheet 21a with electrical conductors>, or the slit forming apparatus 60c, including the roller 68 having the circumferential blade 68a and the supporting body 69, previously described with reference to FIGS. 19 and 20 in the (Third variation) of the above <Variation of preparation of the sheet 21a with electrical conductors>, or the like may be used.

Figure 38:
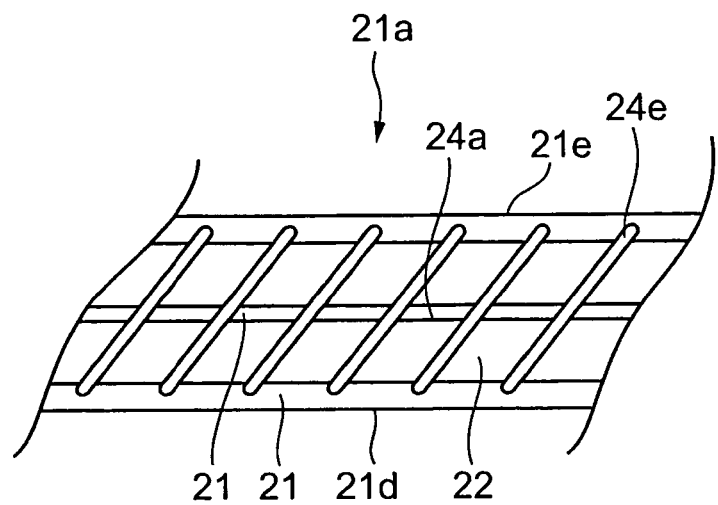
FIG. 38 is a perspective view illustrating a variation of the sheet with electrical conductors.

Alternatively, the sheet 21a with electrical conductors, as shown in FIG. 38, may be produced, by preparing the non-conductive sheet 21 which extends in a band-like fashion and on which the pair of electrical conductors 22 extending in the longitudinal direction of the non-conductive sheet 21 and spaced apart from each other are provided so as to be respectively spaced away from both ends 21d, 21e in the width direction perpendicular to the longitudinal direction of the non-conductive sheet 21, and forming through holes 24e in large numbers, along the width direction, at a predetermined interval along the longitudinal direction, by using the punching member 132 (the means 130 for producing IC tags). That is to say, as shown in FIG. 38, the produced sheet 21a with electrical conductors may include the non-conductive sheet 21 extending in a band-like fashion, and multiple pairs of electrical conductors 22 provided on the non-conductive sheet 21 so as to be respectively spaced away from both ends 21d, 21e in the width direction of the non-conductive sheet 21, and arranged along the width direction of the non-conductive sheet 21. In addition, in the sheet 21a with electrical conductors, each through hole 24e may be formed between each adjacent pair of electrical conductors 22, such that each through hole 24e extends along the width direction of the non-conductive sheet 21, over a range narrower than a range defined between both ends 21d, 21e in the width direction of the of the non-conductive sheet 21 and over at least the full width of each pair of electrical conductors 22, and extends through both the non-conductive sheet 21 and the electrical conductors. In other words, each through hole 24e may extend along the width direction of the non-conductive sheet 21, such that each through hole 24e extends from a point situated between one end 21d (the lower end in FIG. 36) in the width direction of the non-conductive sheet 21 and the electrical conductor 22 located on the one end side, to a point situated between the other end 21e (the upper end in FIG. 36) in the width direction of the non-conductive sheet 21 and the electrical conductor 22 located on the other end side, and extends through both the non-conductive sheet 21 and the electrical conductors 22. In this way, IC tags 10 may be formed successively on the non-conductive sheet 21 by arranging and fixing each IC chip 20 on the pair of electrical conductors 22 of such a sheet 21a with electrical conductors. Again, in the case of producing such a sheet 21a with electrical conductors, the through holes 24e may be formed by first preparing the non-conductive sheet 21 on which the electrical conductors are arranged also on and near both ends 21d, 21e in the width direction of the non-conductive sheet 21, then removing such electrical conductors 22 on and near both ends 21d, 21e in the width direction of the non-conductive sheet 21 by using the removing means 134 described above, and thereafter forming the through holes 24e by using the punching member 132.

Figure 39:
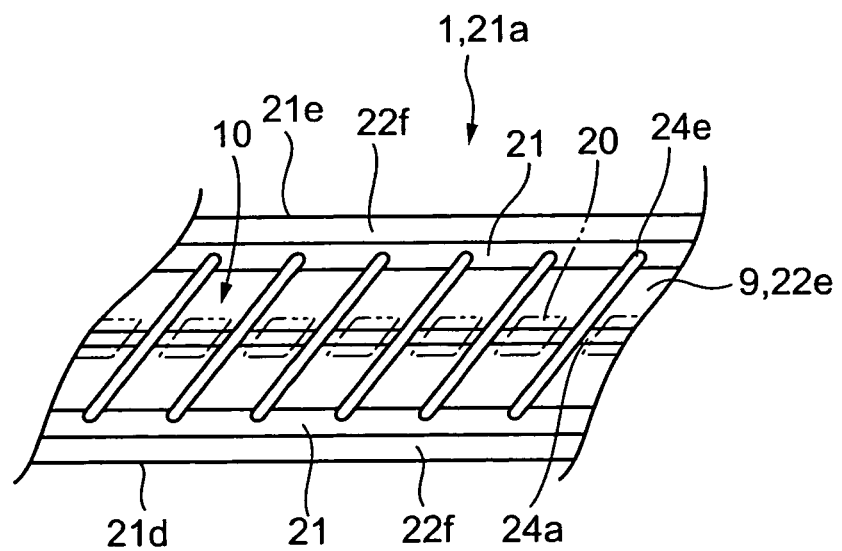
FIG. 39 is a perspective view illustrating a variation of the sheet with IC tags and the sheet with electrical conductors.

In this variation, while an example in which the removing means 134 removes electrical conductors 22 on and near both ends 21d, 21e in the width direction of the non-conductive sheet 21 has been disclosed, the removing means is not limited to this aspect. For example, the electrical conductors 22 may be removed at inner points in the width direction than both ends 21d, 21e of the non-conductive sheet 21. In such a case, the electrical conductors 22 are provided at intermediate portions respectively spaced away from both ends 21d, 21e in the width direction of the non-conductive sheet 21, such that the electrical conductors 22 may comprise a pair of intermediate electrical conductors 22e extending in the longitudinal direction of the non-conductive sheet 21, and a pair of side electrical conductors 22f, 22f located laterally outside the pair of intermediate electrical conductors 22e and on and near of both ends 21d, 21e in the width direction of the non-conductive sheet 21. Then, by forming through holes 24e, by using the punching member 132, such that each through hole 24e extends over at least the full width of the pair of intermediate electrical conductors 22e along the width direction, the intermediate electrical conductors 22e can be cut along the width direction. By using such a method, as shown in FIG. 39, the sheet 1 with IC tags, having experienced such processes, may include the non-conductive sheet 21 extending in a band-like fashion, multiple pairs of intermediate electrical conductors 22e provided on the non-conductive sheet 21 so as to be spaced away from both ends 21d, 21e in the width direction of the non-conductive sheet 21 and arranged along the longitudinal direction of the non-conductive sheet 21, IC chips 20 arranged on each pair of intermediate electrical conductors 22, and the pair of side electrical conductors 22f, 22f located laterally outside the intermediate electrical conductors 22e and disposed on both ends 21d, 21e in the width direction of the non-conductive sheet 21, wherein a through hole 24e is formed between each adjacent pair of IC chips 20, such that the through hole 24e extends along the width direction of the non-conductive sheet 21, over a range narrower than a range defined between both ends 21d, 21e in the width direction of the non-conductive sheet 21, and over at least the full width (across the full width) of each pair of intermediate electrical conductors 22e, and extends through both the non-conductive sheet 21 and the intermediate electrical conductors 22e. In other words, the sheet 21a with electrical conductors can be produced, wherein each through hole 24e extends along the width direction of the non-conductive sheet 21, such that each through hole 24e extends from a point situated between one end 21d (the lower end in FIG. 39) in the width direction of the non-conductive sheet 21 and the intermediate electrical conductor 22e located on the one end side, to a point situated between the other end 21e (the upper end in FIG. 39) in the width direction of the non-conductive sheet 21 and the intermediate electrical conductor 22e located on the other end side, and extends through both the non-conductive sheet 21 and the intermediate electrical conductors 22e.

Alternatively, as shown in FIG. 39, by forming the through holes 24e before arranging IC chips 20 on the electrical conductors 22, the sheet 21a with electrical conductors includes the non-conductive sheet 21 extending in a band-like fashion, multiple pairs of intermediate electrical conductors 22e provided on the non-conductive sheet 21 so as to be respectively spaced away from both ends 21d, 21e in the width direction of the non-conductive sheet 21 and arranged along the longitudinal direction of the non-conductive sheet 21, and a pair of side electrical conductors 22f, 22f located laterally outside the intermediate electrical conductors 22e and disposed on both ends 21d, 21e in the width direction of the non-conductive sheet 21, wherein each through hole 24e is formed between each adjacent pair of intermediate electrical conductors 22e, such that each through hole 24e extends along the width direction of the non-conductive sheet 21, over a range narrower than a range defined between both ends 21d, 21e in the width direction of the non-conductive sheet 21, and over at least the full width (across the full width) of each pair of intermediate electrical conductors 22e, and extends through both the non-conductive sheet 21 and the intermediate electrical conductors 22e. In other words, the sheet 21a with electrical conductors can be produced, wherein each through holes 24e extends along the width direction of the non-conductive sheet 21, such that each through holes 24e extends from a point situated between one end 21d (the lower end in FIG. 39) in the width direction of the non-conductive sheet 21 and the intermediate electrical conductor 22e located on the one end side to a point situated between the other end 21e (the upper end in FIG. 39) in the width direction of the non-conductive sheet 21 and the intermediate electrical conductor 22e located on the other end side, and extends through both the non-conductive sheet 21 and the intermediate electrical conductors 22e. Thereafter, IC tags 10 each comprising the pair of extension electrodes 9 formed of the pair of intermediate electrical conductors 22e and an IC chip 20 connected with the extension electrodes 9 can be formed successively while being supported on the single non-conductive sheet 21 extending in a band-like (elongated) fashion by arranging and fixing the IC chip 20 on each pair of intermediate electrical conductors 22e of the sheet 21a with electrical conductors.

In this variation, while an example in which the electrical conductors 22 located on and near both ends 21d, 21e in the width direction of the non-conductive sheet 21 is removed by using the removing means 134, before forming the through holes 24, upon production of the sheet 1 with IC tags and the sheet 21a with electrical conductors has been disclosed, the procedure to remove the electrical conductors 22 is not limited to this aspect. For example, the electrical conductors 22 located on and near both ends 21d, 21e in the width direction of the non-conductive sheet 21 may be removed by using the removing means 134, after producing the through holes 24e, so as to produce the sheet 1 with IC tags and the sheet 21a with electrical conductors as shown in FIGS. 36 through 39.

(Third Variation)

A cut (notch, opening) 24b may be formed between each adjacent pair of IC chips 20, by cutting the sheet 1 with IC tags, described in the above (Second variation), including the non-conductive sheet 21, the pair of electrical conductors 22 respectively provided on the non-conductive sheet 21 so as to be spaced away from both ends 21d, 21e in the width direction perpendicular to the longitudinal direction of the non-conductive sheet 21, extending in the longitudinal direction of the non-conductive sheet 21 and spaced apart from each other, and multiple IC chips 20 each being arranged on the pair of electrical conductors 22, by using the means 46, 130 described in this embodiment or the above (First variation), for producing IC tags, such that each of the cuts 24b extends in the width direction of the non-conductive sheet 21 over a range narrower than a range defined between both ends 21d, 21e in the width direction of the non-conductive sheet 21 and over at least the full width (across the full width) of the pair of electrical conductors 22, and enter up to the non-conductive sheet 21 from the surfaces of the electrical conductors 22. In other words, a cut 24b may be formed between each adjacent pair of IC chips 20, such that the cut extends along the width direction of the non-conductive sheet 21, extends from a point situated between one end 21d in the width direction of the non-conductive sheet 21 and the electrical conductor 22 located on the one end side, to a point situated between the other end 21e in the width direction of the non-conductive sheet 21 and the electrical conductor 22 located on the other end side, and gets into the material from the surfaces of the electrical conductors 22 the non-conductive sheet 21.

Figure 40:
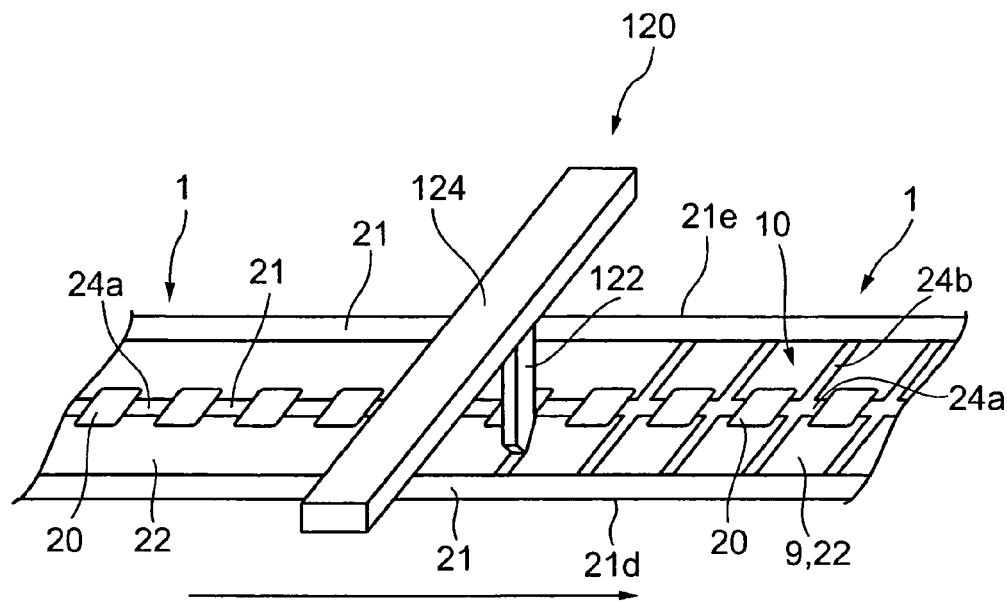
FIG. 40 is a perspective view illustrating a variation of the producing step for IC tags.

Thereafter, IC tags 10 each comprising the pair of extension electrodes 9 formed of the pair of electrical conductors 22 and an IC chip 20 connected with the extension electrodes 9 can be formed successively while being supported on the single non-conductive sheet 21 extending in a band-like (elongated) fashion. As shown in FIG. 40, the sheet 1 with IC tags, having experienced such processes, includes the non-conductive sheet 21 extending in a band-like fashion, multiple pairs of electrical conductors 22 respectively provided on the non-conductive sheet 21 so as to be spaced away from both ends in the width direction of the non-conductive sheet 21 and extending along the longitudinal direction of the non-conductive sheet 21, and IC chips 20 each being arranged on each pair of electrical conductors 22, wherein a cut 24b is formed between each adjacent pair of IC chips 20, such that each cut 24b extends in the width direction of the non-conductive sheet 21 over a range narrower than a range defined between both ends 21d, 21e in the width direction of the non-conductive sheet 21 and over at least the full width (across the full width) of the pair of electrical conductors 22, and enter up to the non-conductive sheet 21 from the surfaces of the electrical conductors 22. In other words, a cut 24b is formed between each adjacent pair of IC chips 20, such that each cut extends along the width direction of the non-conductive sheet 21, extends from a point situated between one end 21d (the lower end shown in FIG. 40) in the width direction of the non-conductive sheet 21 and the electrical conductor 22 located on the one end side to a point situated between the other end 21e (the upper end shown in FIG. 40) in the width direction of the non-conductive sheet 21 and the electrical conductor 22 located on the other end side, and gets into the material from the surfaces of the electrical conductors 22 the non-conductive sheet 21.

According to this variation, since the non-conductive sheet 21 will not be divided at the both ends 21d, 21e in the width direction of the sheet 21 even though each notch would extend through a part or the full thickness of the non-conductive sheet 21, IC tags 10 can be readily and securely formed in succession along the feed direction on the single non-conductive sheet 21.

Figure 41:
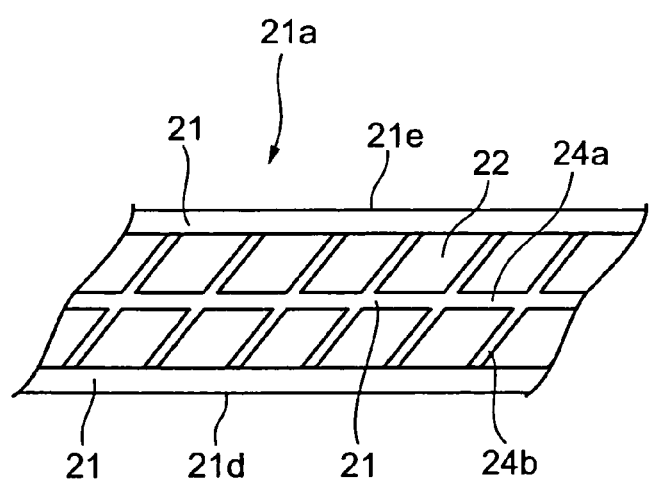
FIG. 41 is a perspective view illustrating a variation of the sheet with electrical conductors.

As with the above (Second variation), by preparing the non-conductive sheet 21 extending in a band-like fashion wherein the pair of electrical conductors 22 extending along the longitudinal direction of the non-conductive sheet 21 and spaced apart from each other are provided so as to be respectively spaced away from both ends 21d, 21e in the width direction perpendicular to the longitudinal direction of the non-conductive sheet 21, and by using the means 46, 120 described above for producing IC tags, so as to form the cuts 24b along the width direction, in large numbers, at a predetermined interval along the longitudinal direction, the sheet 21a with electrical conductors can be prepared, which includes, as shown in FIG. 41, the non-conductive sheet 21 extending in a band-like fashion, and multiple pairs of electrical conductors 22 provided on the non-conductive sheet 21 so as to be respectively spaced away from both ends 21d, 21e in the width direction of the non-conductive sheet 21 and arranged along the longitudinal direction of the non-conductive sheet 21. In the sheet 21a with electrical conductors, the cut 24b is formed between each adjacent pair of electrical conductors 22, such that each cut 24b extends in the width direction of the non-conductive sheet 21 over a range narrower than a range defined between both ends 21d, 21e in the width direction of the non-conductive sheet 21 and over at least the full width of each pair of electrical conductors 22, and enters up to the non-conductive sheet 21 from the surfaces of the electrical conductors 22. Alternatively, in the sheet 21a with electrical conductors, each cut 24b is formed such that cut extends along the width direction of the non-conductive sheet 21, extends from a point situated between one end 21d (the lower end shown in FIG. 41) in the width direction of the non-conductive sheet 21 and the electrical conductor 22 located on the one end side, to a point situated between the other end 21e (the upper end shown in FIG. 41) in the width direction of the non-conductive sheet 21 and the electrical conductor 22 located on the other end side, and gets into the material from the surfaces of the electrical conductors 22 the non-conductive sheet 21. Thereafter, IC tags 10 may be formed successively on the non-conductive sheet 21, by arranging and fixing IC chips 20 on each pair of electrical conductors 22 on such a sheet 21a with electrical conductors.

(Combinations of the Variations)

As stated above, while one or a plurality of variations has been described with respect to several steps of the embodiment, combinations of these variations for different steps may, also and of course, be employed.

The invention claimed is:

1. A sheet with IC tags, comprising:
a non-conductive sheet extending in an elongated fashion;
multiple pairs of electrical conductors provided on the non-conductive sheet so as to be respectively spaced away from both ends in a width direction perpendicular to a longitudinal direction of the non-conductive sheet, and arranged along the longitudinal direction of the non-conductive sheet; and
IC chips each arranged on each pair of electrical conductors;
wherein through holes are formed in the non-conductive sheet such that each of the through holes extends, between each adjacent pair of IC chips, over a range narrower than a range defined between both ends in the width direction of the non-conductive sheet and extends along the width direction over at least the full width of each pair of electrical conductors.

2. An IC tag, comprising:
a non-conductive sheet;
a pair of extension electrodes provided on the non-conductive sheet, the extension electrodes being spaced apart from each other across a slit; and
an IC chip has a pair of electrodes electrically connected with the extension electrodes;
wherein the slit includes a pair of notches positioned between the pair of electrodes and entering up to the non-conductive sheet, and a rectangular portion provided between the notches and having a generally rectangular cross section.

* * * * *

UNITED STATES PATENT AND TRADEMARK OFFICE
CERTIFICATE OF CORRECTION

| | | |
|---|---|---|
| PATENT NO. | : 8,456,307 B2 | Page 1 of 1 |
| APPLICATION NO. | : 11/587240 | |
| DATED | : June 4, 2013 | |
| INVENTOR(S) | : Hiroshi Suguro et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1972 days.

Signed and Sealed this
First Day of September, 2015

Michelle K. Lee
*Director of the United States Patent and Trademark Office*

UNITED STATES PATENT AND TRADEMARK OFFICE
CERTIFICATE OF CORRECTION

PATENT NO. : 8,456,307 B2
APPLICATION NO. : 11/587240
DATED : June 4, 2013
INVENTOR(S) : Suguro et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1972 days.

Signed and Sealed this
Eighth Day of September, 2015

Michelle K. Lee
*Director of the United States Patent and Trademark Office*